(12) United States Patent
Ishibashi et al.

(10) Patent No.: US 8,101,523 B2
(45) Date of Patent: Jan. 24, 2012

(54) METHOD OF PROCESSING OF NITRIDE SEMICONDUCTOR WAFER, NITRIDE SEMICONDUCTOR WAFER, METHOD OF PRODUCING NITRIDE SEMICONDUCTOR DEVICE AND NITRIDE SEMICONDUCTOR DEVICE

(75) Inventors: Keiji Ishibashi, Hyogo (JP); Hidenori Mikami, Hyogo (JP); Naoki Matsumoto, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 11 days.

(21) Appl. No.: 12/940,733

(22) Filed: Nov. 5, 2010

(65) Prior Publication Data

US 2011/0049679 A1 Mar. 3, 2011

Related U.S. Application Data

(63) Continuation of application No. 12/812,697, filed as application No. PCT/JP2009/053112 on Feb. 16, 2009, now Pat. No. 7,872,331.

(30) Foreign Application Priority Data

Feb. 27, 2008 (JP) ................................ 2008-045425
Feb. 9, 2009 (JP) ................................ 2009-026834

(51) Int. Cl.
  *H01L 21/302* (2006.01)
(52) U.S. Cl. ........ 438/690; 438/691; 438/928; 438/959; 438/977; 257/E21.603
(58) Field of Classification Search .................. 438/690, 438/619, 928, 959, 977; 257/E21.603
See application file for complete search history.

(56) References Cited

U.S. PATENT DOCUMENTS

| 4,004,949 | A | 1/1977 | Lesk |
| 7,195,545 | B2* | 3/2007 | Nakayama et al. ............. 451/44 |
| 7,256,148 | B2 | 8/2007 | Kastenmeier et al. |
| 7,460,211 | B2 | 12/2008 | Whitefield et al. |
| 7,485,928 | B2 | 2/2009 | Falster et al. |
| 7,579,044 | B2 | 8/2009 | Brand et al. |
| 7,704,126 | B2 | 4/2010 | Mattes et al. |
| 2002/0160610 | A1 | 10/2002 | Arai et al. |
| 2004/0035448 | A1 | 2/2004 | Aegerter et al. |
| 2004/0041143 | A1 | 3/2004 | Kim et al. |
| 2004/0195658 | A1* | 10/2004 | Nakayama et al. ........... 257/618 |
| 2004/0214432 | A1 | 10/2004 | Masumoto |
| 2009/0218659 | A1 | 9/2009 | Nakayama et al. |

FOREIGN PATENT DOCUMENTS

| DE | 4033683 A1 | 6/1991 |
| JP | 63-144966 | 6/1988 |
| JP | 9-168947 | 6/1997 |
| JP | 63-150158 | 6/1998 |

(Continued)

*Primary Examiner* — Zandra Smith
*Assistant Examiner* — Christy Novacek
(74) *Attorney, Agent, or Firm* — Drinker Biddle & Reath LLP

(57) ABSTRACT

A nitride semiconductor wafer is planar-processed by grinding a bottom surface of the wafer, etching the bottom surface by, e.g., KOH for removing a bottom process-induced degradation layer, chamfering by a rubber whetstone bonded with 100 wt %-60 wt % #3000-#600 diamond granules and 0 wt %-40 wt % oxide granules, grinding and polishing a top surface of the wafer, etching the top surface for eliminating a top process-induced degradation layer and maintaining a 0.5 μm-10 μm thick edge process-induced degradation layer.

5 Claims, 24 Drawing Sheets

FOREIGN PATENT DOCUMENTS

| | | |
|---|---|---|
| JP | 2000-265160 | 9/2000 |
| JP | 2001-138244 | 5/2001 |
| JP | 2002-264021 | 9/2002 |
| JP | 2002-355763 | 12/2002 |
| JP | 2003-510418 | 3/2003 |
| JP | 2004-158537 | 6/2004 |
| JP | 2004-209580 | 7/2004 |
| JP | 2004-358643 | 12/2004 |
| JP | 2005-136167 | 5/2005 |
| JP | 2005-136311 | 5/2005 |
| JP | 2005-199407 | 7/2005 |
| JP | 2005-302804 | 10/2005 |
| JP | 2006-43884 | 2/2006 |
| JP | 2006-203058 | 8/2006 |
| JP | 2006-326795 | 12/2006 |
| JP | 2007-7844 | 1/2007 |
| JP | 2007-42748 | 2/2007 |
| JP | 2007103682 A | 4/2007 |
| JP | 2007-517675 | 7/2007 |
| JP | 2007-223004 | 9/2007 |
| JP | 2007-254258 | 10/2007 |
| JP | 2007-305644 | 11/2007 |
| JP | 2008-28259 | 2/2008 |
| WO | 01/23323 | 4/2001 |
| WO | 2005-011007 | 2/2005 |
| WO | 2007-018074 | 2/2007 |

\* cited by examiner

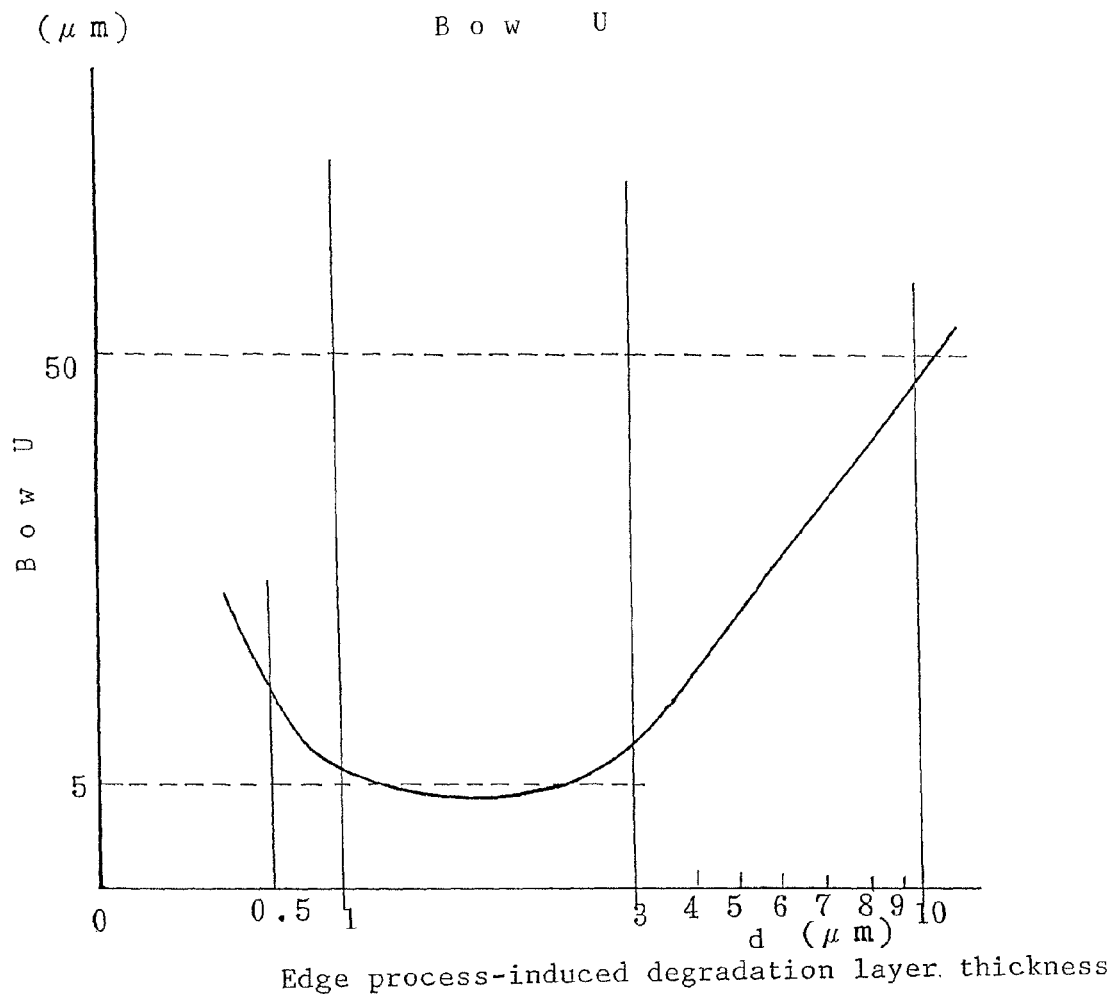

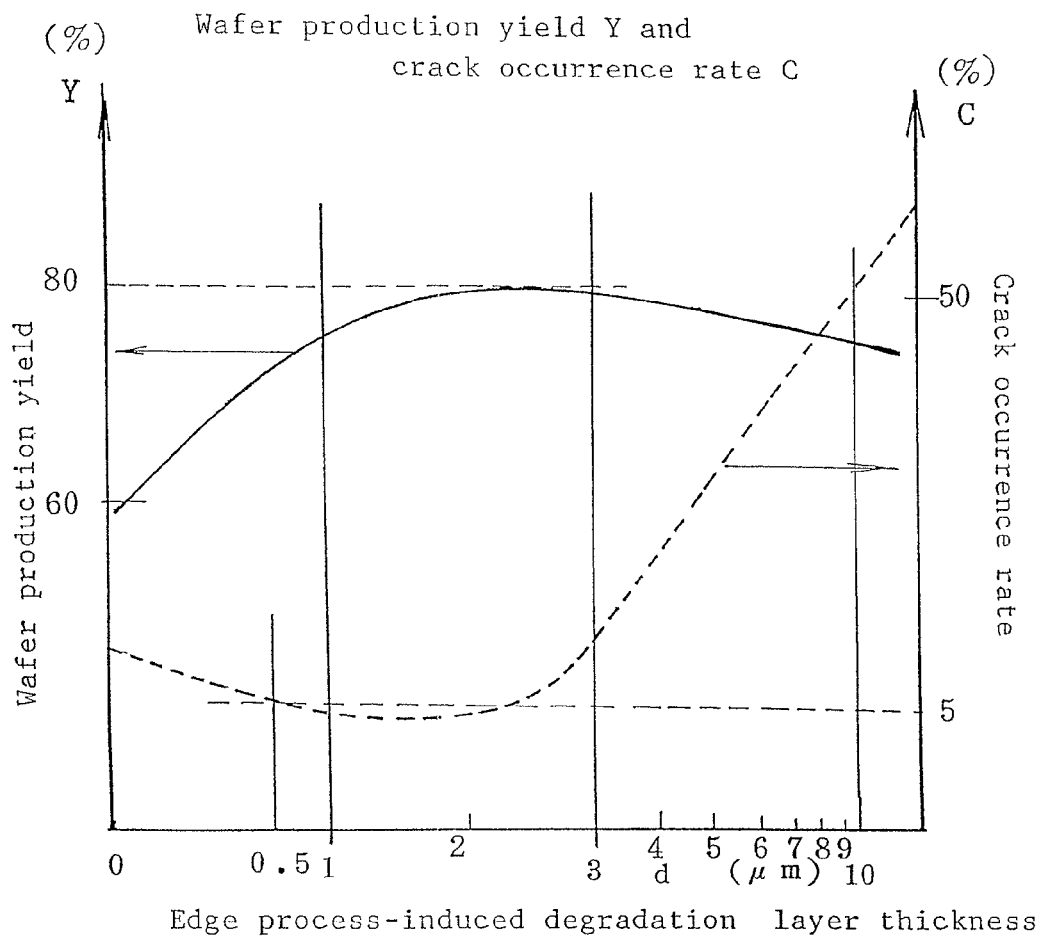

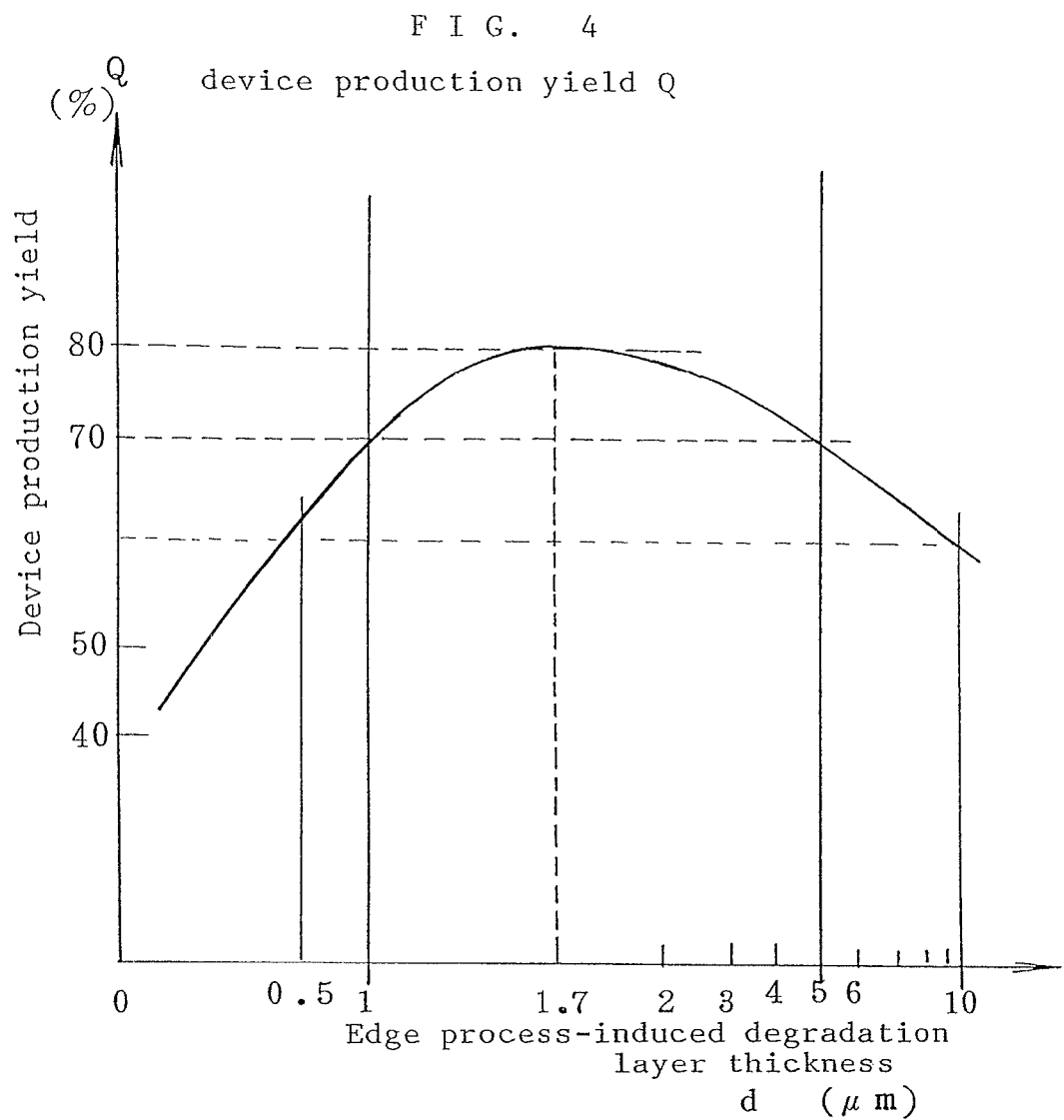

FIG. 5   d; 0.5μm ~ 10μm preferably 1μm ~ 3μm
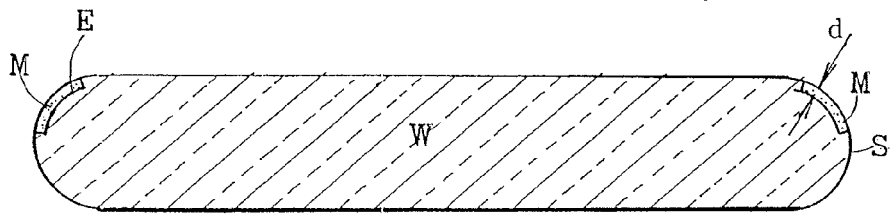
FIG. 6   d; 0.5μm ~ 10μm preferably 1μm ~ 3μm
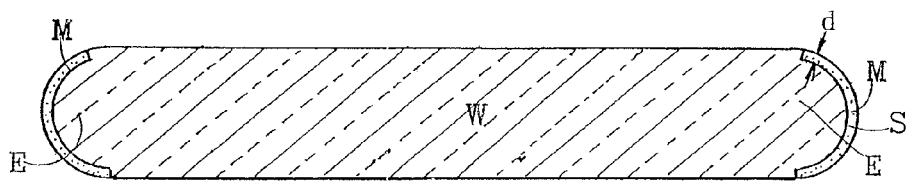
FIG. 7   d; 0.5μm ~ 10μm preferably 1μm ~ 3μm
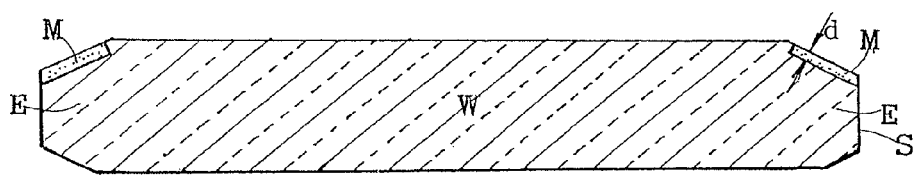
FIG. 8   d; 0.5μm ~ 10μm preferably 1μm ~ 3μm
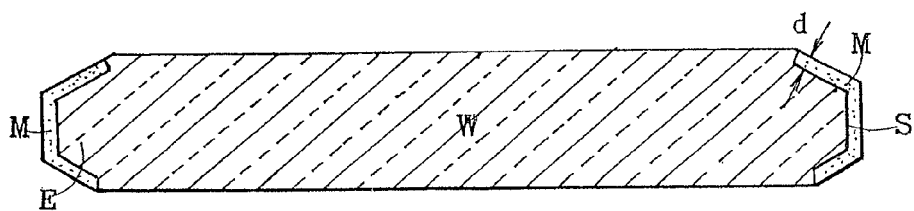

Japanese patent laying open No.2004-319951

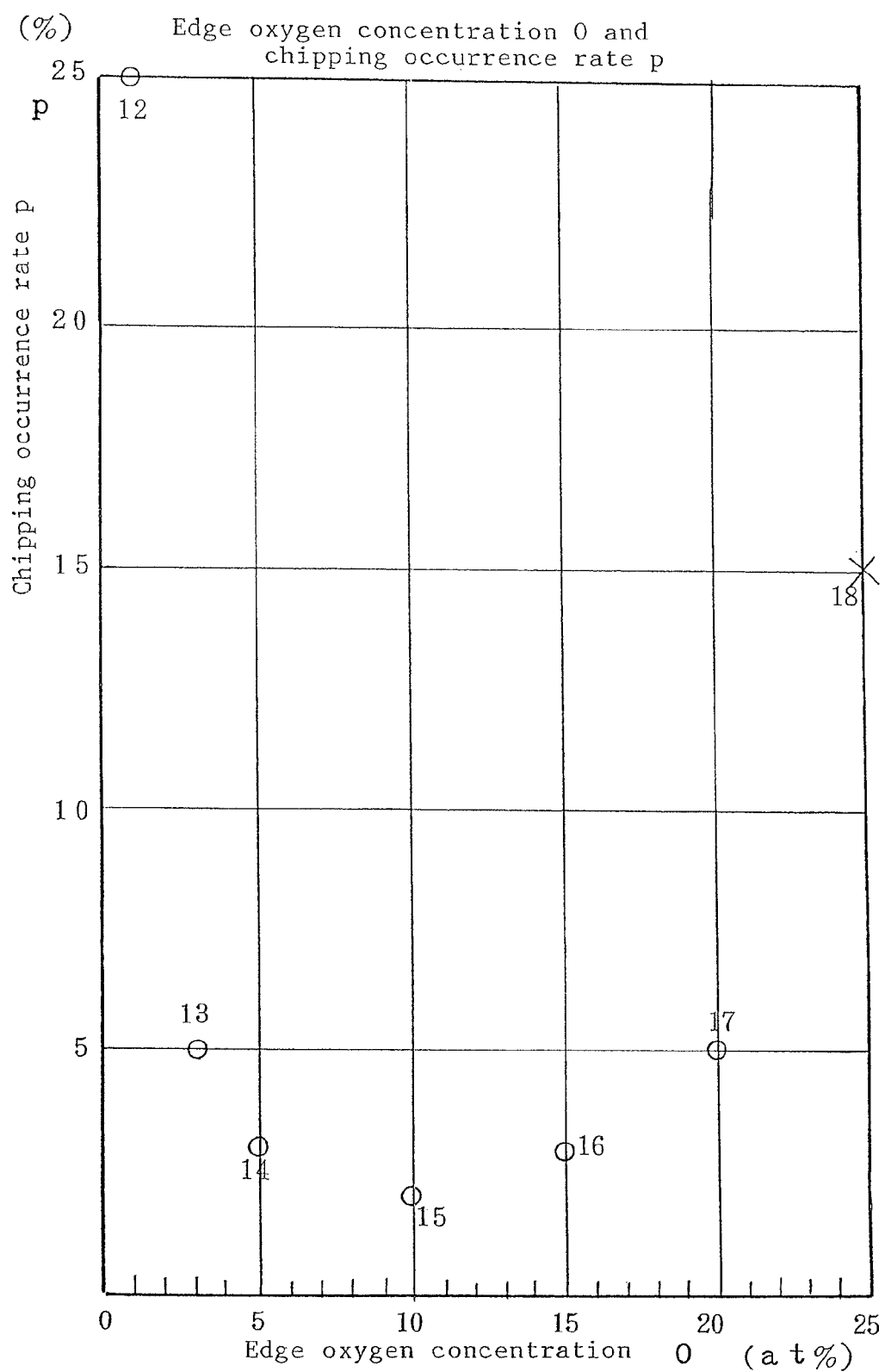

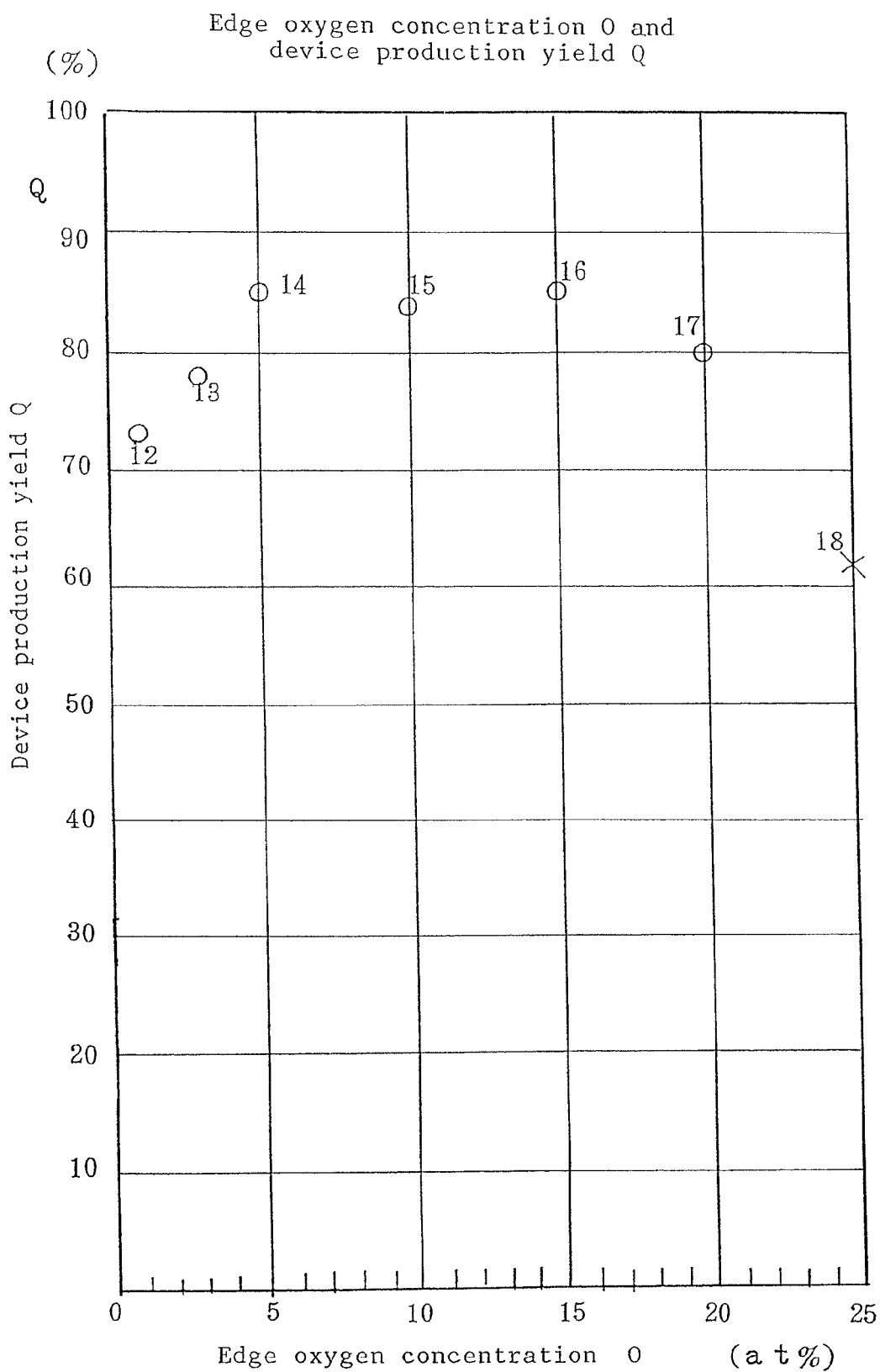

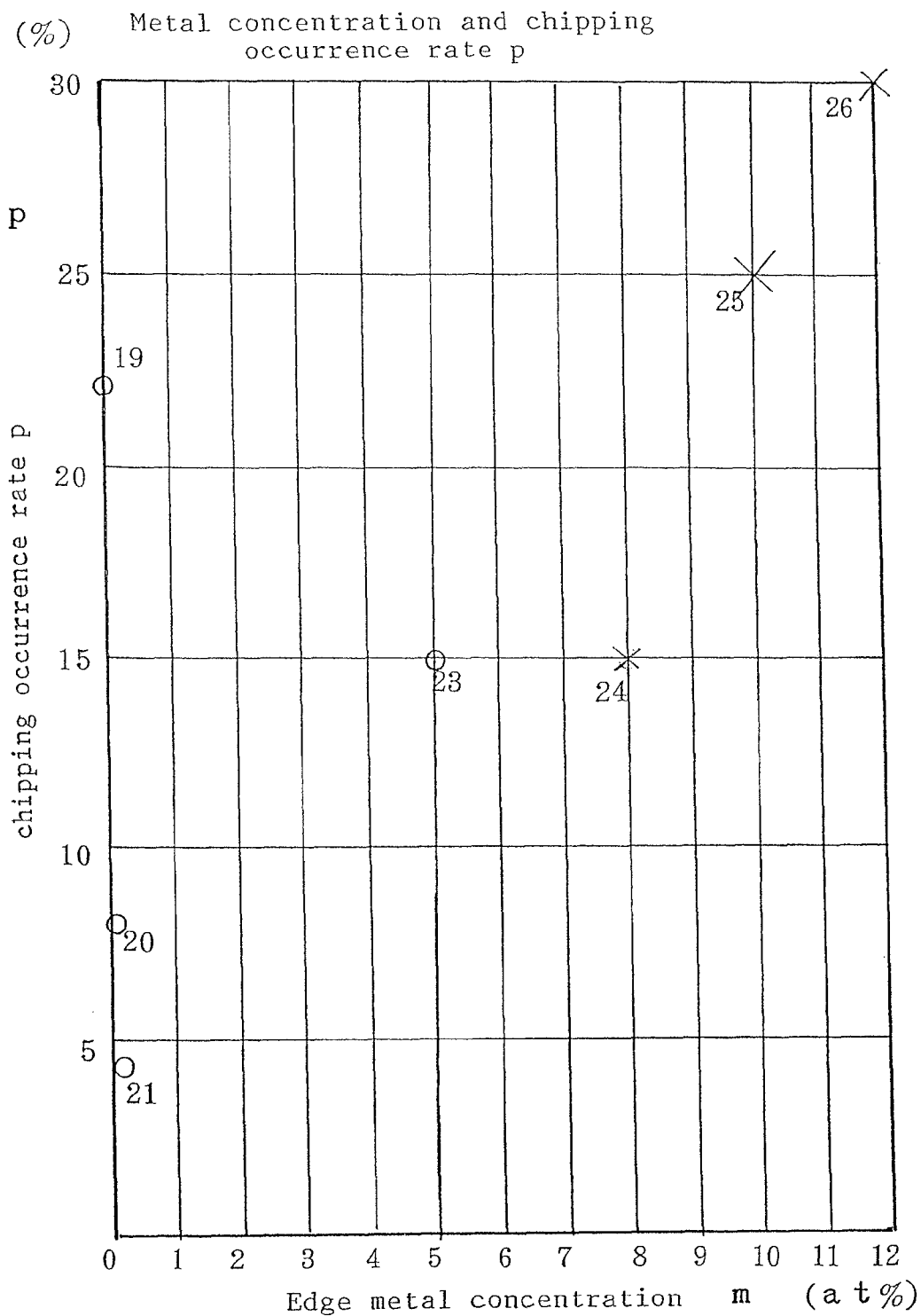

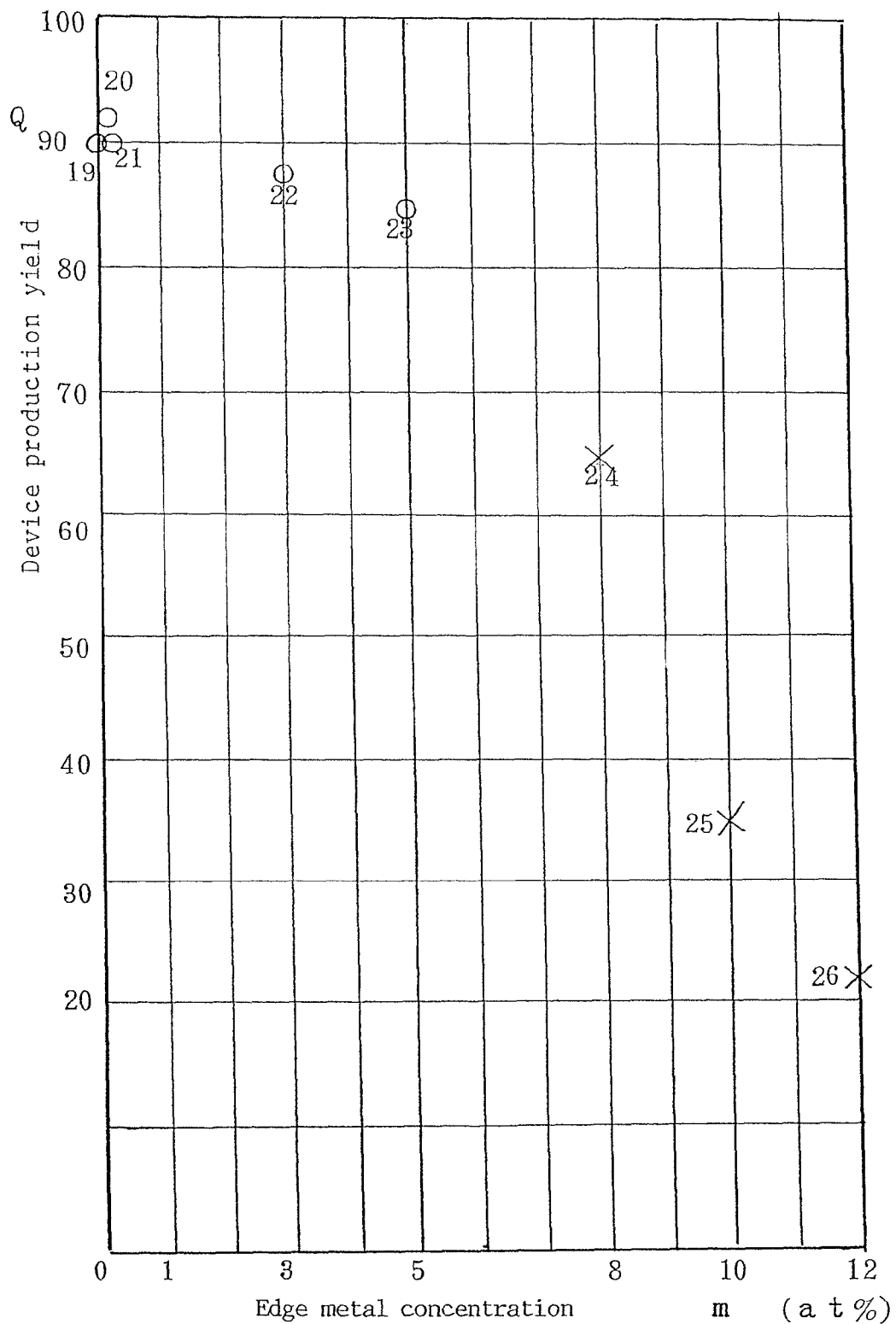

METHOD OF PROCESSING OF NITRIDE SEMICONDUCTOR WAFER, NITRIDE SEMICONDUCTOR WAFER, METHOD OF PRODUCING NITRIDE SEMICONDUCTOR DEVICE AND NITRIDE SEMICONDUCTOR DEVICE

This is a continuation application of application Ser. No. 12/812,697, having a §371 date of Jul. 13, 2010, now U.S. Pat. No. 7,872,331, which is a national stage filing based on PCT International Application No. PCT/JP2009/053112, filed on Feb. 16, 2009. The copending application Ser. No. 12/812, 697 is incorporated by reference herein in its entirety.

FIELD OF THE INVENTION

This invention relates to a chamfering method of nitride semiconductor wafers, and a nitride semiconductor wafer. Group 3 nitride semiconductors, e.g., gallium nitride (GaN), aluminum nitride (AlN) and so on, have wide bandgaps and promising applications to light emitting devices and electronic devices. Neither large GaN nor AlN single crystal exist in nature. Vapor phase growth methods can produce nitride semiconductor single crystals by supplying material gases on an undersubstrate made of a foreign material and synthesizing nitride semiconductor crystal films on the undersubstrate in vapor phase. A sodium flux method can produce nitride semiconductor single crystals by solving nitrogen gas into metal sodium including gallium, making nitrogen gas react with gallium and synthesizing GaN crystal in liquid phase. An ammonothermal method can produce nitride semiconductor single crystals by making $NH_3$ react with Ga under the supercritical state and synthesizing GaN crystal in liquid phase.

Since no freestanding large GaN or AlN wafer had been produced at an early stage, light emitting devices were produced by epitaxially growing GaN, InGaN, AlGaN and other group 3 nitride films on sapphire wafers as undersubstrates. Then vapor phase growth methods or liquid phase growth methods enable us to make wide freestanding GaN substrate crystals. At present, freestanding GaN wafers, AlN wafers, AlGaN wafers or InGaN wafers with diameters of 1 inch (about 25 mm) or 2 inch (about 50 mm) can be produced.

As-grown crystals which are made by the vapor growth phase methods or the liquid phase growth methods have rough surfaces and large fluctuation of thicknesses. Grinding and polishing of surfaces of as-cut wafers make mirror wafers. Semiconductor wafers serve a variety of semiconductor devices as substrates on which the semiconductor devices are fabricated. Thus the surfaces of semiconductor wafers should be flat, crack-free and bow-free.

If peripheral edges of wafers were zigzag, the wafers would be liable to crack, split or break. Thus peripheral sharp edges of wafers should be eliminated. The process of eliminating sharp edges is called "beveling" or "chamfering". Chamfering of nitride semiconductors, e.g., GaN, which are rigid and fragile, requires deliberate contrivance.

BACKGROUND OF THE INVENTION

Prevalent silicon (Si) wafers or gallium arsenide (GaAs) wafers come on the market mainly as circular wafers for the convenience of handling. Gallium nitride wafers or other nitride wafers will be also produced mainly as circular wafers. Top surfaces of semiconductor wafers shall be polished to obtain mirror wafers. In accordance with purposes, sometimes both top and bottom surfaces will be mirror-polished or sometimes only top surfaces will be mirror-polished.

In addition to the surface grinding and polishing, edges of wafers will be ground or polished. As-cut wafers have harp edges which would cause crack, break and fracture of wafers. Fine fractions would damage or contaminate top surfaces. For preventing wafers from cracking or breaking, edges of wafers are ground or ground/polished. In addition to edges, circumferences (circular outer sides) are sometimes ground/polished. The processing of grinding of edges (including peripheries and circumferences) is called "chamfering" or "bevelling". "Chamfering" and "bevelling" are synonyms.

Silicon wafers are also chamfered. Nitride wafers, e.g., Si wafers, GaN wafers are different from prevalent silicon wafers in rigidity, fragility, solidity and chemical properties. GaN and other nitride crystals are more rigid, more fragile than Si. It is impossible to chemically etch III group planes of nitride, e.g., Ga-plane of GaN crystals.

Si-chamfering technology cannot directly be applied to GaN-chamfering or other nitride chamfering. Chamfering technology being mature for silicon wafers is useless for GaN wafers and other nitride wafers.

Different kinds of semiconductor wafers require different chamfering techniques. Different optimum chamfering methods suitable for different kinds of semiconductor wafers should be sought out by trial and error.

Patent document (1) Japanese Patent Laying Open No. 2002-356398, "Gallium nitride wafer", alleged to make first freestanding GaN substrates, which had not existed, by an ELO (Epitaxial Lateral Overgrowth) method, chamfer the GaN substrates and form orientation flats (OF) to the GaN wafers. The ELO method of Patent document (1) employed (111) GaAs wafer undersubstrates. The ELO deposited an $SiO_2$ mask with honeycomb distributing microwindows on the GaAs wafer, grew a GaN thin film in horizontal directions on the mask by an HVPE (Hydride Vapor Phase Epitaxy), decreased dislocations, jointed GaN films on the mask and grew GaN along the c-axis.

The HVPE produced more than 100 µm thick GaN crystals, eliminated the GaAs undersubstrate and obtained a freestanding GaN substrate. An obtained GaN substrate had nearly a square-shape. A circular wafer was obtained by grinding the square-shaped as-grown GaN wafer into a circle. For discriminating orientations and obverse/reverse surfaces, the wafer was provided with an OF (orientation flat) and an IF (identification flat) to a (1-100) plane side or a (2-1-10) plane side.

Patent document (1) Japanese Patent Laying Open No. 2002-356398, "Gallium nitride wafer", disclosed methods of chamfering a GaN wafer into a slant edge at an oblique angle of 5 degrees to 30 degrees or into a round edge of a radius of 0.1 mm to 0.5 mm. The former case rotates a circular, conical shaped whetstone, brings the whetstone into outer contact with an edge of a GaN wafer, and grinds the sharp edge into a slant of an angle of 5 degrees to 30 degrees. The conical whetstone is a resin-bonding whetstone fixing stationary whetgranules by a resin to the surface of the base.

The latter case rotates a spool-shaped whetstone with an inner half circular section of a radius of 0.1 mm to 0.5 mm, brings an edge of a GaN wafer into outer contact with the whetstone and grinds the edge into a circular section.

It turned out, however, that chamfering by the resin-bonding whetstone was liable to induce break or crack in GaN wafers. "Resin-bonding" means that a resin bonds stationary whetgranules to the surface of a base.

(2) Japanese Patent Laying Open No. 2005-136167 (Filing No. 2003-370430), "Method of producing a nitride semiconductor wafer and Nitride semiconductor wafer", pointed out a problem that GaN wafers which were produced by growing a thick GaN crystal on a foreign material undersubstrate, removing the undersubstrate and obtaining a freestanding GaN crystal were suffering from large bow caused by big differences of thermal expansion and lattice constant between the undersubstrate material and GaN. The document (2) explained that the bow height difference between the center and circumference reached to ±40 μm to +100 μm.

Polishing a wafer makes a process-induced degradation layer on the surface of the wafer. The Patent document (2) told that the process-induced degradation layer introduced by polishing has a function of expanding the polished surface. The Patent Document (2) said that the bow of nitride wafers could be reduced by the function. The document (2) said that thinning the process-induced degradation layer by etching decreases the expansion force. Further the document (2) declared that combining both polishing and etching on top and bottom surfaces would decrease the bow of nitride wafers.

When a bottom surface (nitride plane; N-plane) is concavely deformed, bottom surface polishing expands the bottom surface by inducing a process-induced degradation layer on the bottom. The bottom surface is distorted convexly. The direction of bow is reversed. The reverse bow should be suppressed. Thus the process-induced degradation layer is thinned by etching. Bottom expansion stress is reduced with thinning of the bottom process-induced degradation layer. The bow decreases.

The document (2) said that the top surface (Ga-plane) was rigid and difficult to polish. Etching of the top surface was also difficult. The document (2) taught that dry etching by chloride plasma was applicable to the top surface (Ga-plane). Grinding and polishing of a GaN wafer caused a 10 μm thick process-induced degradation layer on a top surface and a 50 μm thick process-induced degradation layer on a bottom surface.

The document (2) asserted that the bow could be alleviated by adjusting the thickness of the bottom process-induced degradation layer within a pertinent range by polishing and etching.

Embodiment 1 of the document (2) made a 5 μm top-concave GaN wafer enjoying less bow by producing a 50 μm top-concave GaN as-cut wafer, grinding the top surface for reversing the bow to 30 μm top-convex, dry-etching the top for decreasing the bow to 20 μm top-concave, grinding the bottom and etching the bottom. The document (2) declared that a pertinent series of grinding and etching could finally reduce the bow of GaN wafers within a range of +30 μm to −20 μm in a scale of reducing to 2 inch (50 mm) of diameter.

Plus sign denoted top-convex bow Minus sign denoted top-concave bow. The document (2) asserted that the bow of GaN wafers could be suppressed within the scope from 30 μm top-convex to 20 μm top-concave.

(3) Japanese Patent Laying Open No. 2004-319951 (Filing No. 2003-275935), "Edge-polished nitride semiconductor wafer, edge-polished GaN free standing substrate wafer and method of processing an edge-polished nitride semiconductor wafer", pointed out that chamfering of a GaN wafer by a resin-bonding diamond whetstone being in outer contact with an edge of the GaN wafer induced cracks or breaks of wafers, since GaN is fragile and hard. The document (3) denied resin-bond whetstone chamfering.

The document (3) proposed a whettape chamfering method by preparing a whettape with a tape having stationary whetgranules, bringing an edge in a circular direction in inner-contact with the whettape, rotating the wafer and bevelling the edge by the whettape. The whettape rolls off one spool onto another, in order to expose a new part of the whettape surface. When the stationary granules were worn out, the contacting part is renewed by feeding the edge with a fresh part of the whettape for maintaining the same condition of whetting. Since the edge was in inner contact with the whettape, the contact pressure was small and no shock acted on the edge. The document (3) alleged that the whettape could enhance the yield far higher than the outer-contacting resin-bonding whetstone.

FIG. 11 is a perspective view of the whettape chamfering first proposed by the document (3) (Japanese Patent Laying Open No. 2004-319951). FIG. 12 is an enlarged sectional view of a contacting whettape and an edge of a wafer.

A wafer W is fixed to a rotary disc (not shown in the figure) by vacuum chucking. An edge E of the wafer W is in inner contact with the whettape T. A central angle of the contacting part is 40 degrees to 90 degrees. The document (3) asserted that soft contact of the edge with the elastic whettape could prevent the edge from cracking and breaking.

Document (1)=Japanese Patent Laying Open No. 2002-356398, "Gallium Nitride wafer" (Filing No. 2001-166904).

Document (2)=Japanese Patent Laying Open No. 2005-136167, "Method of producing Nitride semiconductor wafers and Nitride semiconductor wafer. (Filing No. 2003-370430).

Document (3)=Japanese Patent Laying Open No. 2004-319951, "Edge polished Nitride semiconductor wafer and method of processing an edge polished GaN freestanding wafer and a method of chamfering a nitride semiconductor wafer" (Filing No. 2003-275935).

Recent development has enabled the vapor phase growth method and liquid phase growth method to produce nitride semiconductor freestanding crystals. It is, however, still difficult for the liquid phase method to make a large nitride crystal. Large freestanding nitride semiconductor as-cut wafers can be produced by growing a thick GaN crystal on a wide undersubstrate, cutting the GaN crystal by a wiresaw and separating the GaN crystal from the undersubstrate. A series of bottom grinding, chamfering and top grinding/polishing convert the as-cut nitride wafers into nitride semiconductor mirror wafers.

Grinding induces a thick (10 μm-50 μm) process-induced degradation layer on the part in contact with a whetstone. Bottom (surface) grinding causes a process-induced degradation layer on the bottom surface. Chamfering (edge grinding) produces a process-induced degradation layer on the edge. Top (surface) grinding induces another process-induced degradation layer on the top surface. The process-induced degradation layer is a surface layer having disorder of the lattice structure. Plenty of dislocations are included in the process-induced degradation layer. The process-induced degradation layer does not mean the inclusion of impurities. It is undesirable for mirror wafers to remain the process-induced degradation layer on the top or bottom surfaces. The top and bottom process-induced degradation layers should be removed by etching. Instead of the top/bottom surfaces, the present invention observes circumference edge grinding (chamfering, bevelling) closely. Chamfering of the prevalent semiconductor wafers, e.g., silicon wafers and GaAs wafers employs resin-bonding or metal-bonding whetstones which bond diamond granules with a resin or a metal to the base. The prevailing resin-bonding whetstones and the metal-bonding whetstones are acute, hard and sturdy. Chamfering time is short. However, diversion of the prevalent resin- or metal-bonding whetstones to GaN chamfering invites breaks and cracks on the GaN wafers at high rates, generates thick process-induced degradation layers and induces large bow. GaN is easily damaged by shock because of high rigidity, low toughness and high fragility. The high crack occurrence rate originates from the fact that the resin- or metal-bonding whetstones have granules rigidly fixed to the bases and the bonding materials cannot absorb the shocks acting on fragile wafer edges by the granules. Frequent cracks and breaks occur on GaN wafers by chamfering with metal- or resin-bonding whetstones. Even in the case of free from break or crack, 20 μm-50 μm thick process-induced degradation layers M and large bow are induced by the metal- or resin-bonding whetstone chamfering. Sometimes the bow curvature radius is less than 1 m. The prevalent resin- or metal-bonding whetstones are inapplicable to chamfering of the highly rigid and highly fragile GaN wafers.

A first purpose of the present invention is to provide a method of chamfering a nitride wafer without breaking and cracking. A second purpose of the present invention is to provide a method of chamfering a nitride wafer without inducing bow. A third purpose of the present invention is to provide a method of chamfering a nitride wafer with a controlled thickness of an edge process-induced degradation layer. A fourth purpose is to provide a method of chamfering a nitride wafer with a high wafer processing yield. A fifth purpose is to provide a method of chamfering a nitride wafer with a high device production yields. A sixth purpose is to provide a nitride wafer with a high device production yield. Outer portions of top and bottom surfaces are called "peripheries" in the present description. The circular side which is perpendicular to the top/bottom is called a "circumference". A crossing circle between the top/bottom and the circumference is called a "ridge". A set of a periphery, a ridge and a circumference is called an "edge".

DISCLOSURE OF THE INVENTION

A nitride semiconductor wafer of the present invention is made by grinding and etching a bottom surface of an as-grown nitride substrate, chamfering the wafer by a whetstone bonded with diamond granules or diamond/oxide granules by a soft bonding material, making an edge process-induced degradation layer of a 0.5 μm-10 μm thickness, more favorably, a 1 μm-3 μm thickness, grinding, polishing and etching a top surface. The soft bonding material means rubbers or bubbled resins. Sizes of diamond granules are #3000 to #600. Mixing of oxide granules into diamond granules enables the whetstone to chamfer wafers by mechanical action of diamond and chemical action of oxides. Cooperation of the diamond mechanical action and the oxide chemical action is called "mechanochemical effect". Pertinent oxide granules to the chamfering whetstones are $Fe_2O_3$, CuO, $MnO_2$, $Cr_2O_3$, ZnO and so on. The whetstones are endowed with elasticity. Sometimes it will take much time for elastic whetstones to chamfer nitride wafers in the present invention.

The present invention chamfers nitride wafers by a soft-material bonded whetstone with a base bonded with fine diamond granules and oxide granules. Chamfering by the soft whetstone alleviates shocks acting on edges of wafers, prevents the wafer from breaking and cracking, decreases the thickness of an edge process-induced degradation layer, suppresses bow. The present invention employs rubber-bonding or bubbled resin-bonding whetstones for chamfering in order to reduce mechanical shock to the edge. Chamfering causes an edge process-induced degradation layer. The thickness d of the edge process-induced degradation layer M is a measure of the shocks acting on edges of wafers during chamfering. Grosser diamond granules and harder bonding materials induce larger shocks on edges. In this case, postchamfered observation of edges shows a thick edge process-induced degradation layer. Finer diamond granules and softer bonding materials cause smaller shocks of edges. In the latter case, postchamfered observation of edges reveals a thin edge process-induced degradation layer.

Chamfering wafers by hard whetstones with a base bonded with gross diamond (low mesh numbers #) by metals or hard resins invites a large edge process-induced degradation layer with a thickness d of 20 μm-50 μm. In this case, excess strong shocks induce breaks and cracks of wafers. The present invention succeeds in suppressing occurrences of breaks and cracks by gently chamfering wafers with elastic, soft whetstones and keeping a thickness d of the edge process-induced degradation layer in the range of 0.5 μm-10 μm. The present invention employs rubbers or bubbled resins as bonding materials, chooses fine diamond granules (high mesh numbers #) and adds oxide granules to the diamond granules for making soft whetstones. The use of the soft whetstones enables the present invention to chamfer GaN wafers without causing cracks, breaks and bow. Chamfering GaN wafers with a whetstone having a pertinent elasticity gives a 0.5 μm-10 μm thick edge process-induced degradation layer. The edge process-induced degradation layer in the range of d=0.5 μm-10 μm thicknesses suppresses bow and increases a device yield.

FIG. 1 demonstrates the whole of planar-processing steps starting from an as-grown freestanding GaN wafer. An as-grown GaN wafer is processed as shown in FIG. 1. Bottom surface (N-plane) grinding (A) is done for adjusting the thickness to a predetermined value. The bottom grinding (A) induces a thick process-induced degradation layer M on the bottom surface. The process-induced degradation layer is a layer having a deformed lattice structure. There are plenty of dislocations in the process-induced degradation layer. The CL (cathode luminescense) can discern the process-induced degradation layer from other regions. The CL observation can measure the thickness d of the process-induced degradation layer. The process-induced degradation layer is not a layer including impurities. Since the process-induced degradation layer includes deformation of lattice structure, it is undesirable to remain the process-induced degradation layer on the bottom surface. The bottom process-induced degradation layer should be removed. The GaN wafer is wet-etched (B) by hot KOH, NaOH or $H_3PO_4$ solution. Wet etching (B) by hot KOH, NaOH or $H_3PO_4$ solution eliminates the process-induced degradation layer from the bottom. The bottom grinding can be replaced by bottom-polishing.

The edge of the wafer is ground (chamfer; C) by an elastic whetstone having a base bonded by a rubber or a bubbled resin with fine diamond granules or diamond/oxide mixed granules. The edge grinding is called "chamfering". Chamfering prevents the wafer from cracking or breaking.

The present invention recommends rubber whetstones for chamfering GaN wafers. The rubber whetstone is a whetstone having a base bonded by rubber with stationary whetgranules. The whetgranules are hard granules, e.g., diamond granules. Since the bonding material is rubber, the whetstone should be precisely called "rubber-bonding whetstone" or "rubber-bond whetstone". But in this description the whetstone is sometimes called "rubber whetstone" for short. This name does not mean that granules are rubber. The present invention first advocates the use of rubber whetstones for chamfering GaN wafers.

After chamfering (C), the top surface of the wafer is ground (D) and polished (E). Top grinding (D) causes a 10 μm-50 μm thick process-induced degradation layer M on the top surface. Top polishing (E) induces another 0.1 μm-20 μm thick process-induced degradation layer M on the top. Wafers for epitaxial growth require smooth tops without process-induced degradation layers. For the purpose of making a smooth surface on the top, the top of the postgrinding wafer is polished. Grinding (D) and polishing (E) produce the top process-induced degradation layers. The top is dry-etched in vapor phase (F) till the top process-induced degradation layer M is fully eliminated. The wafer processing includes the bottom grinding (A), bottom etching (B), chamfering (C), top grinding (D)/polishing (E) and top vapor-phase-etching (F). The contrivance of the present invention resides neither in the bottom grinding (A) nor top grinding (D)/polishing (E). The purpose of the present invention is an improvement of chamfering (C).

The gist of the present invention is nitride wafer chamfering of grinding an edge of a nitride wafer by a soft, rubber or bubbled resin whetstone bonded with fine diamond granules or diamond/oxide granules and keeping an edge process-induced degradation layer of 0.5 μm-10 μm thicknesses, more favorably, of 1 μm-3 μm thicknesses. The resultant 0.5 μm-10 μm thick edge process-induced degradation layers at the edge can prevent the wafer from cracking and can suppress bow. In the following steps, the resultant 0.5 μm-10 μm edge process-induced degradation layers can prohibit the wafer from chipping and can raise device production yield.

The following is further details of a series of steps of the wafer processings of the present invention. Grinding invites a process-induced degradation layer M with a perturbed lattice structure on a ground surface of a wafer. Larger stationary granules of the whetstone and a heavier load on the surface invite a thicker process-induced degradation layer M. On the contrary, finer stationary granules and a lighter load on the surface cause a thinner process-induced degradation layer M.

As shown in FIG. 1, the wafer planar-processing includes a series of the steps of bottom grinding (A), bottom etching (B), chamfer (C), top grinding (D), top polishing (E) and top etching (P). The bottom grinding (A) causes a thick bottom process-induced degradation layer M having a thickness of 10 μm-50 μm, which depends upon conditions of grinding. It is undesirable to leave a thick process-induced degradation layer M on the bottom. The bottom process-induced degradation layer is removed by wet-etching the wafer in a hot KOH, NaOH or $H_3PO_4$ solution.

An N-plane (nitrogen) differs from a Ga-plane (gallium) in a C-plane GaN wafer. A bottom surface (Nitrogen-plane; N-plane; (000-1)) is chemically weaker than a top surface (Gallium-plane; Ga-plane; (0001)). One of KOH, NaOH and $H_3PO_4$ solutions can etch the bottom surface of the GaN wafer. It is available to use some other acids or alkalis capable of etching the bottom surface. The top surface (Ga-plane) is chemically far stronger than the bottom surface (N-plane). None of KOH, NaOH and $H_3PO_4$ solutions can etch the top surface of the GaN wafer. Top and bottom surfaces require different etching methods for removing process-induced degradation layers.

Then an edge of the GaN wafer is ground (chamfer C). The GaN wafer is chamfered by rotating an elastic, rubber or bubbled-resin bonding whetstone bonded with whetgranules, bringing the rotating whetstone in contact with the edge of the wafer, rotating the wafer and grinding the whole of the edge. The stationary granules of the whetstone are fine diamond granules or diamond/oxide mixture granules. Mesh numbers (#) of the diamond granules bonded to the whetstone by rubber or bubbled resin are #600 (20 μm diameter) to #3000 (4 μm diameter). The mesh number # is a measure signifying an average diameter of whetgranules. A larger mesh number # signifies smaller granules. A smaller mesh number # indicates grosser granules. Chamfering produces a blunt edge and causes a process-induced degradation layer on the edge. The present invention controls a thickness d of the edge process-induced degradation layer within the range of 0.5 μm-10 μm, more favorably within the range of 1 μm-3 μm. Chamfering by a hard whetstone with larger granules (smaller #) induces a thick edge process-induced degradation layer of 20 μm-50 μm and large bow and sometimes invites cracks or breaks. Chamfering by a whetstone with fine diamond granules can decrease the thickness d of the edge process-induced degradation layer. However decrement of sizes of granules is still insufficient. The present invention proposes an addition of oxide granules to the whetstone, which is effective in alleviating the strong mechanical action of diamond granules. Pertinent oxides are $Fe_2O_3$, $Cr_2O_3$, $MnO_2$, $CuO$, $ZnO$, $Fe_3O_4$ and so on which are chemically unstable oxides. The present invention has discovered first that some kinds of metal oxide granules have a chemical faculty of facilitating grinding of nitride wafers. The present invention names the chemical faculty "mechanochemical" effect. Grinding by a whetstone with diamond/oxide granules is named "mechanochemical grinding". Edge grinding by a diamond/oxide whetstone is called "mechanochemical chamfering".

The mechanochemical grinding softens the surfaces of nitride wafers and decreases the grinding load by oxidization reaction by oxide granules. The mechanochemical chamfering can suppress occurrence of process-induced degradation layers and cracks during chamfer.

All oxides are not applicable to the present invention. Stable oxides are inappropriate. $SiO_2$ and $Al_2O_3$ are unsuitable, because $SiO_2$ and $Al_2O_3$ are stable oxides and lack the mechanochemical effect. Addition of stable oxide granules cannot decrease the thickness d of the edge process-induced degradation layer below 10 μm. The bonding material which fixes whetgranules on a base is soft rubber or bubbled resin endowed with elasticity. A complementary assembly of a high mesh number of diamond granules, an addition of oxide granules and an elastic bonding material enables chamfering to lower the edge process-induced degradation layer thickness d to 10 μm or less (d≦10 μm). The present invention proposes the use of rubber whetstones or bubbled resin bonding whetstones for the nitride wafer chamfer for the first time. The present invention proposes the use of the whetstones of diamond/oxide mixing granules for the nitride wafer chamfer for the first time.

After chamfering, the top surface is ground. A process-induced degradation layer occurs on the top surface. Since devices will be fabricated on the top surface, the top is a mirror-flat surface. Then the top surface is polished. Polishing of the top contains gross polishing by gross free granules and fine polishing by fine free granules. For example, 30 μm-3 μm diameter free granules can be used for the gross polishing. 3 nm-0.1 nm diameter free granules can be applied to the fine polishing. Polishing produces a new process-induced degradation layer on the top. Top grinding and top polishing are planar-processings which are usually done in series for raising productivity and enhancing quality. Sometimes one of grinding and polishing can be omitted for reducing cost. Top grinding is done by whetstones with stationary granules of e.g., #3000 to #8000. Top polishing is done by free granules of 30 μm-15 μm diameters. It is possible to replace the top polishing by grinding using a whetstone with a high mesh number # or to replace the top grinding by policing using rough granules. In this case, the top grinding uses a whetstone with a mesh number of #3000 to #8000 and the top polishing uses whetstone granules within the range of 30 nm-15 nm.

At the step, there are process-induced degradation layers on the top and the bevelled edge. Vapor phase etching on the top surface eliminates only the top surface process-induced degradation layer. Chemical-mechanical polishing (CMP) can remove the top surface process-induced degradation layer in stead of the vapor phase etching. A process-induced degradation layer of a thickness between 0.5 μm and 10 μm, preferably between 1 μm and 3 μm remains on the bevelled edge. Unlike flat top surface or flat bottom surface, it is difficult for etching to adjust the thickness of the process-induced degradation layer on the bevelled edge. There is another series of wafer processing. The series includes the steps of slicing of a nitride crystal ingot into as-cut wafers, bottom surface etching (B), chamfering (C), top surface polishing (E) and vapor phase etching (F). The alternative processing can dispense with the bottom surface grinding (A) and top surface grinding (D), since the slicing can adjust the thicknesses of the as-cut wafers. The alternative processing requires the bottom surface etching (B) and top surface etching (F), since the slicing induces process-induced degradation layers on both top and bottom surfaces. For example, the alternative processing has a series of slicing bottom surface etching (B)→vapor phase etching (F)→chamfering (C)→top surface polishing (E)→vapor phase etching (F). A single vapor phase etching can replace the double vapor phase etching steps. CMP can substitute for the second vapor phase etching. In an alternate case of making a tall GaN ingot and slicing the ingot into as-cut wafers, the side of the ingot can be ground first and the ingot is sliced into wafers next. This case can dispense with the first bottom grinding (A) for adjusting wafer thicknesses.

This invention chamfers nitride wafers by a soft rubber-bonding or bubbled resin bonding whetstone embedded with fine diamond whetgranules or oxide granules in addition to diamond whetgranules. The use of the soft whetstone can suppress breaks or cracks of wafers. The 0.5 μm-10 μm thick, preferably 1 μm-3 μm thick process-induced degradation layers remaining on the bevelled edge enables us to obtain small bow nitride wafers or bow-free nitride wafers. Crack occurrence rate is low and wafer processing yield is high on the nitride wafers of the present invention. Further this invention can enhance the device production yield of fabricated on the nitride wafers.

The thickness d of the edge process-induced degradation layer is a measure of judging the strength of mechanical shock acting on wafers at chamfering afterward. The edge process-induced degradation layer having a thickness from 0.5 μm to 10 μm signifies a soft contact and a weak shock to the wafer edge by the whetstone.

BRIEF DESCRIPTION OF THE DRAWINGS

FIG. 2 is a graph showing a relation between the thickness d of peripheral process-induced degradation layers and the bow U of the GaN wafers. The abscissa is the logarithmically represented thickness d (μm) of the peripheral process-induced degradation layers. The ordinate is the bow U (μm).

FIG. 3 is a graph showing a relation between the measured thickness d of peripheral process-induced degradation layers and the wafer production yield Y (solid line) and the crack occurrence rate C (broken line). The abscissa is the logarithmically represented thickness d (μm) of peripheral process-induced degradation layers. The righthand ordinate means the crack occurrence rate C (%). The lefthand ordinate is the substrate production yield Y (%).

FIG. 4 is a graph showing a relation between the thickness d of peripheral process-induced degradation layers and the on-wafer device yield Q. The abscissa is logarithmically-represented thickness d (μm) of peripheral process-induced degradation layers. The ordinate indicates the on-wafer device yield Q (%).

FIG. 5 is a sectional view of a present invention GaN wafer having a peripheral process-induced degradation layer of a thickness between 0.5 μm and 10 μm, preferably between 1 μm and 3 μm on an upper round edge (including a circumference).

FIG. 6 is a sectional view of another present invention GaN wafer having a peripheral process-induced degradation layer of a thickness between 0.5 μm and 10 μm, preferably between 1 μm and 3 μm on a round edge (including a circumference).

FIG. 7 is a sectional view of another present invention GaN wafer having a peripheral process-induced degradation layer of a thickness between 0.5 μm and 10 μm, preferably between 1 μm and 3 μm on an upper bevelled edge.

FIG. 8 is a sectional view of another present invention GaN wafer having a peripheral process-induced degradation layer of a thickness between 0.5 μm and 10 μm, preferably between 1 μm and 3 μm on edges and a circumference.

FIG. 28 is a graph showing a relation between the edge oxygen concentration O (at %) and the chipping occurrence rate p (%) of Samples 12 to 18.

FIG. 29 is a graph showing a relation between the edge oxygen concentration O (at %) and the device production yield Q (%) of Samples 12 to 18.

FIG. 30 is a graph showing a relation between the edge metal concentration m (at %) and the chipping occurrence rate p (%) of Samples 19 to 26.

FIG. 31 is a graph showing a relation between the edge metal concentration m (at %) and the device production yield Q (%) of Samples 19 to 26.

BEST FEATURES FOR BRINGING THE INVENTION INTO PRACTICE

Figure 1:
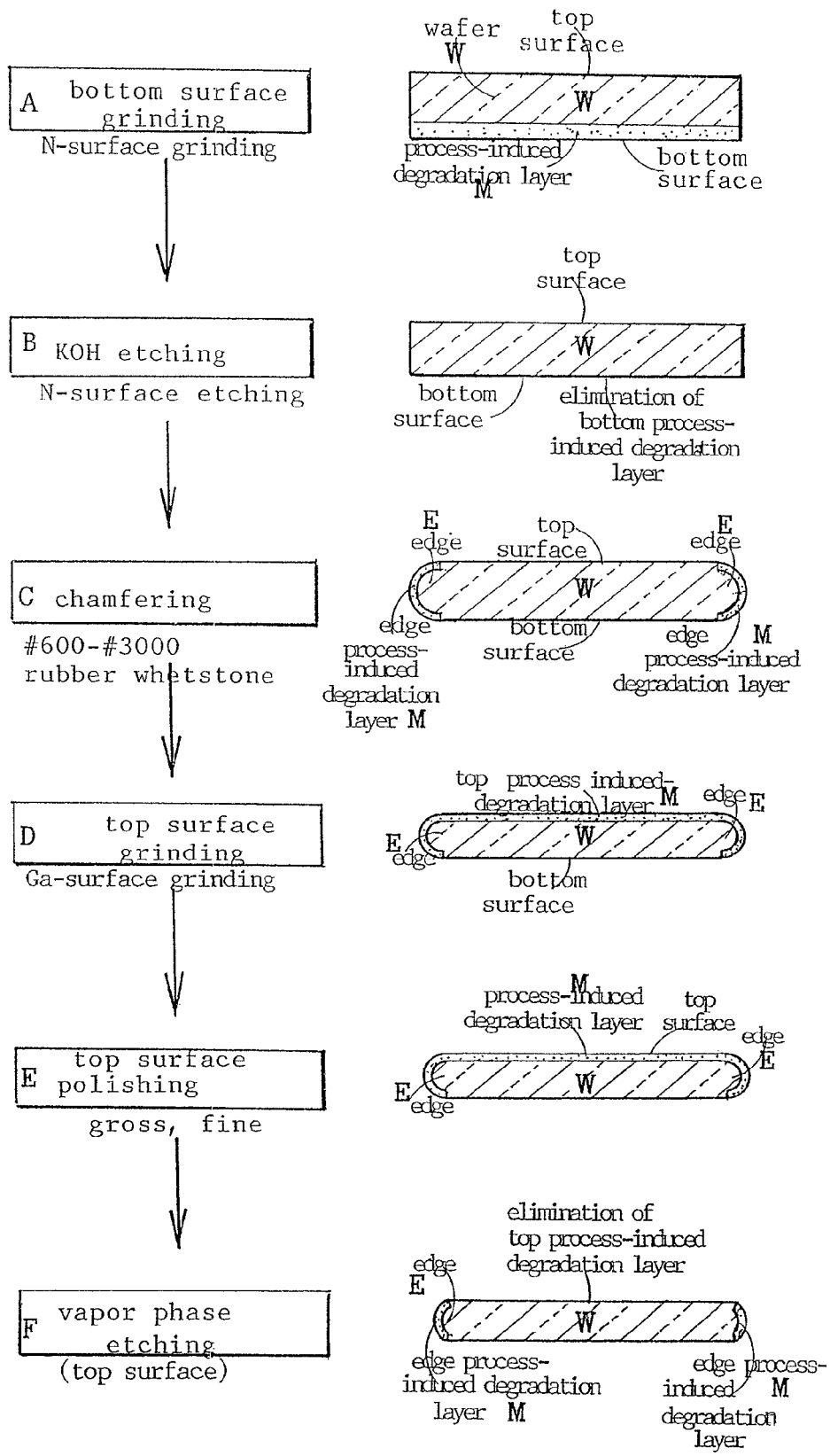
FIG. 1 is a process diagram showing the steps of making mirror wafers from an as-grown circular nitride crystal grown on an undersubstrate in vapor phase and separated from the undersubstrate.

Nitride semiconductor wafers are composed of group III nitride, e.g., GaN, AlN, InN, AlGaN, InGaN and so on. An HVPE method, a flux method and an ammonothermal method can produce GaN crystals. An HVPE method, a sublimation method and a flux method can grow AlN crystals. An InN crystal can be grown by an HYPE method. Slicing a grown nitride crystal by a wiresaw or a bladesaw produces as-cut wafers. Planar-processing includes grinding and polishing. Etching includes dry-etching and wet-etching.

The present invention can chamfer wide, thick GaN wafers, e.g., of a 5 inch (12.7 cm) diameter and a 850 μm thickness by rubber-bonding whetstones and porous resin-bonding whetstones. Non-porous resin bonding whetstones, metal bonding whetstones and electrodeposition whetstones, which are too hard, are impertinent to chamfer nitride semiconductor wafers. A pertinent material of the bonding rubber is chloroprene rubber (CR). CR is excellent in elasticity, in-process elastic deformation and removability. A suitable range of rubber hardness is low hardness of 40 to 60 for suppressing cracks and damage from occurring in chamfering.

The whetstone is a porous resin-bonding whetstone with a porosity of 20% to 50%. Porous bonding-resin is made by mixing calcium carbonate ($CaCO_3$) or other carbonate with a material resin having whetgranules and sintering the mixture. Calcium carbonate emits gas bubbles in the resin during the sintering. Gas bubbles gives the resin porosity. Polyvinyl alcohol (PVA) or phenol resin is a suitable resin for bonding whetgranules on a whetstone disc.

Whetgranules to be bonded on the whetstone disc are diamond (C) granules. Alumina ($Al_2O_3$) granules, silicon carbide (SiC) granules or boron nitride (BN) granules can replace the diamond whetgranules. Diamond, alumina, silicon carbide and boron nitride granules have a similar mechanical whetting function. Thus diamond whetstones will be explained as a typical example chamfering whetstone hereafter. Sizes of whetgranules are represented by mesh (#). The present invention uses #220 to #6000 diamond granules as stationary whetgranules bonded on bases of chamfering whetstones. The mesh (#) is a measure indicating sizes of granules. Higher number of mesh (#) signifies smaller granules. Lower number of mesh (#) means bigger granules.

A larger-granule bonded whetstone can chamfer an edge of a wafer in a shorter time. But the use of the larger-granule bonded whetstone induces more cracks and breaks and larger bow. Use of a smaller-granule bonded whetstone wastes much time. Sometimes the smaller-granule whetstone invites more bow and a higher crack occurrence rate. The rate of the stationary granules in the bonding material should be 3 vol % to 20 vol %. The symbol "vol %" means volume %.

An allowable range of the edge process-induced degradation layer thickness d of a nitride wafer is 0.5 μm to 10 μm. Less than 0.5 μm or more than 10 μm of the edge process-induced degradation layer thickness d causes large bow and high rates of crack occurrence. 1 μm-3 μm of thickness is more favorable for the edge process-induced degradation layer. Wafer bow is sensitive to the edge process-induced degradation layer, inner stress and the top/bottom process-induced degradation layers. The bow depends also upon the diameter and thickness of a wafer. CL (cathode luminescense) and TEM (transmission electron microscope) of cleavage planes can observe and estimate the process-induced degradation layer.

A preferable range of roughness of the chamfered edge is Ra0.07 μm to Ra3 μm in arithmetic average roughness Ra. Ra is one of representations of roughness. Ra is obtained by calculating an average height, summing absolute values of the differences between the heights of measuring spots and the average height and averaging the difference absolute values. Rms, which is another roughness representation, is obtained by summing squares of the differences between the heights of measuring points and the average height, averaging the sum and taking a root of the average. A same surface gives different values to Ra and Rms for roughness. Irregularity of surfaces varies relations between Ra and Rms. Ra is neither equal nor proportional to Rms. Don't confuse Ra with Rms. Edge roughness smaller than Ra0.07 μm or larger than Ra3 μm, which is unfavorable, increases the impurity concentration on the chamfered edges. The impurities on the edges originate from the bonding material of the whetstone and the wax supporting the wafer to the holder. A more favorable range of edge roughness is Ra0.15 μm-Ra1 μm. Edge roughness is observed and measured in 30 μm square (30 μm×30 μm) fields by a laser microscope with laser diodes of a wavelength of 658 nm Whetstones of excess high mesh numbers of diamond granules can safely chamfer gallium nitride wafers. Diamond whetstones consisting only of low mesh numbers of diamond granules fail to chamfer. Too strong mechanical action of the low mesh diamond whetstones induces ruggedness of edges of gallium nitride wafers. Use of a complex granule whetstone including a mixture of diamond whetgranules and oxide whetgranules is effective in lowering the roughness of chamfered edges. Unstable oxides should be chosen as oxide whetgranules for inviting chemical reactions. The chemical reactions help chamfering. The addition of the chemical reactions of oxide granules enables the whetstone to reduce the necessary amount of diamond granules, the mechanical action due to diamond granules and physical shocks. Favorable oxide granules are $Fe_2O_3$, $Fe_3O_4$, $Cr_2O_3$, CuO, $CO_3O_4$, $MnO_2$ and ZnO granules. The oxide granules have a chemical function and a mechanical function. The functions are here named "mechanochemical" effect. Mechanochemical effect is a new effect. The mechanochemical effect of the oxide whetgranules assists diamond granules in eliminating superficial parts and succeeds in chamfering with a load (shock) far lighter than the case of chamfering by diamond granules alone. The mechanochemical effect enables chamfering to produce smooth and scar-free edges. Stable oxides, e.g., silica ($SiO_2$) and alumina ($Al_2O_3$), which have no mechanochemical effect, are inappropriate. (0001) planes (Ga-plane; top surface) of nitride wafers are highly stable and chemically resistant. The mechanochemical effect would fail to grind the (0001) plane. The object of chamfering is less stable, chemically-weak planes inclining to the stable (0001) plane. Thus the whetstones including oxide granules succeed in mechanochemical grinding of edges (chamfering) of nitride wafers with high efficiency.

Grinding apparatus ambience and oxide granules discharge oxygen atoms. A part of the discharged oxygen atoms invades the chamfered edges of wafers. 3 at % to 20 at % are favorable oxygen concentrations in the chamfered edges. Less than 3 at % of edge oxygen concentration induces chipping of wafers. More than 20 at % of edge oxygen concentration causes increment of the rate of rejected devices fabricated on a peripheral part of the processed wafer. The edge oxygen concentration can be controlled by the mixing ratio of oxide whetgranules bonded to the base of the whetstone. Further the edge oxygen concentration can be adjusted by regulating the oxidization effect of the washing liquid after chamfering. More favorable range of the edge oxygen concentration is 5 at %-15 at %. Atomic components in the edges of nitride wafers can be measured by AES (Auger Electron Spectroscopy).

Figure 25:
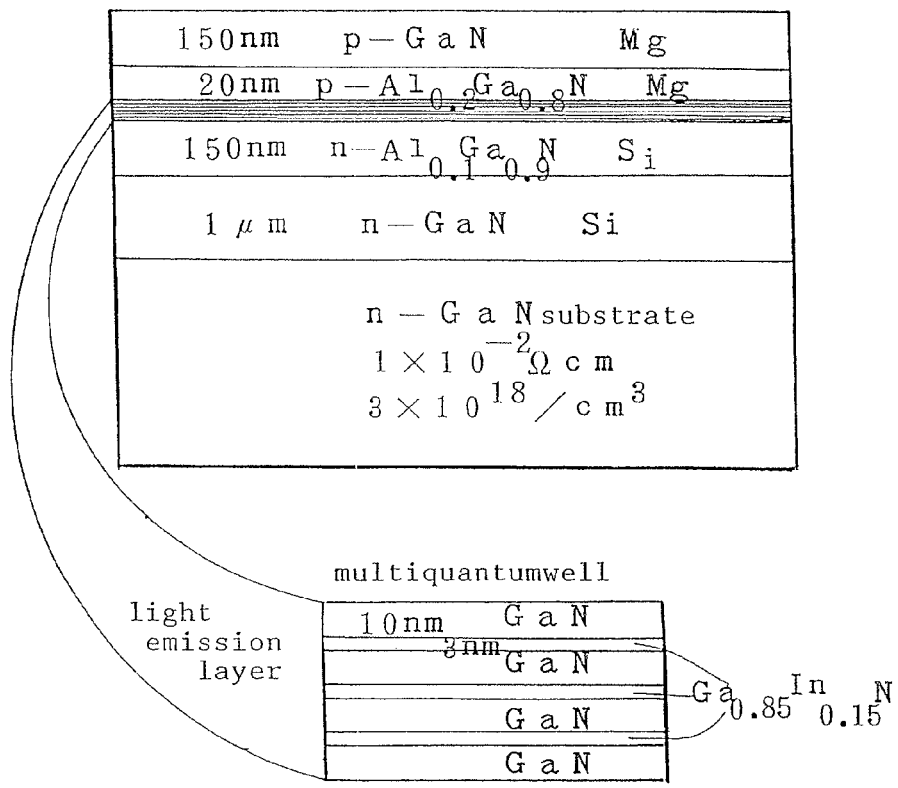
FIG. 25 is a sectional view of an epitaxial wafer having a gallium nitride substrate prepared by the present invention, an n-GaN film, an n-AlGaN film, a light emission layer, a p-AlGaN film and a p-GaN film epitaxially grown the gallium nitride substrate for fabricating light emitting devices.

A variety of semiconductor devices can be fabricated on the hitherto mentioned nitride wafers as a substrate. For example, light emitting diodes are made by a series of the following steps. An epitaxial wafer is produced by growing a 1 μm thick n-GaN layer, a 150 nm thick n-$Al_{0.1}Ga_{0.9}N$ layer, a light emission layer, a 20 nm thick p-$Al_{0.2}Ga_{0.8}N$ layer and a 150 nm thick p-GaN layer in order epitaxially on the n-type GaN wafer made by the present invention. The light emission layer is composed of a multiquantum well structure having four 10 nm thick GaN shield films and three 3 nm thick $Ga_{0.85}In_{0.15}N$ well films alternately piled (FIG. 25).

Figure 26:
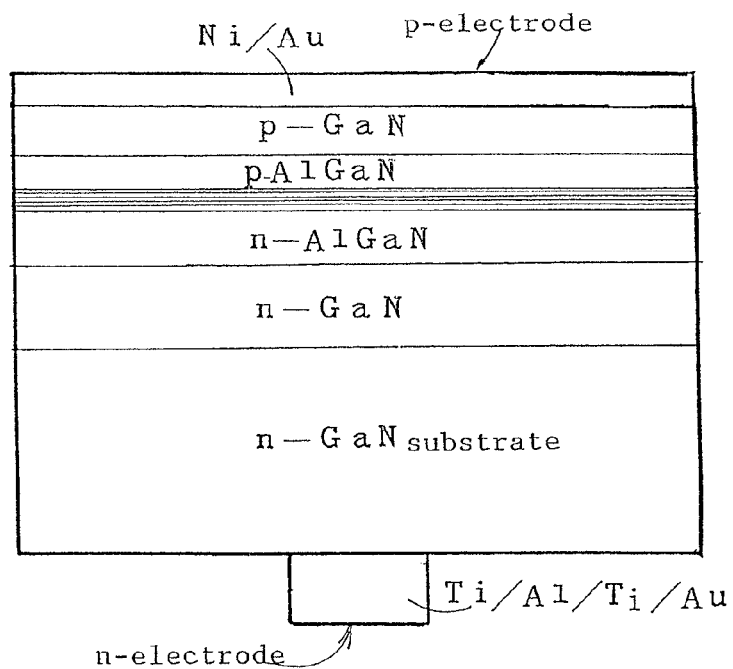
FIG. 26 is a sectional view of a unit of a device having a gallium nitride substrate prepared by the present invention, an n-GaN film, an n-AlGaN film, a light emission layer, a p-AlGaN film and a p-GaN film epitaxially grown on the gallium nitride substrate, a p-electrode and an n-electrode.
Figure 27:
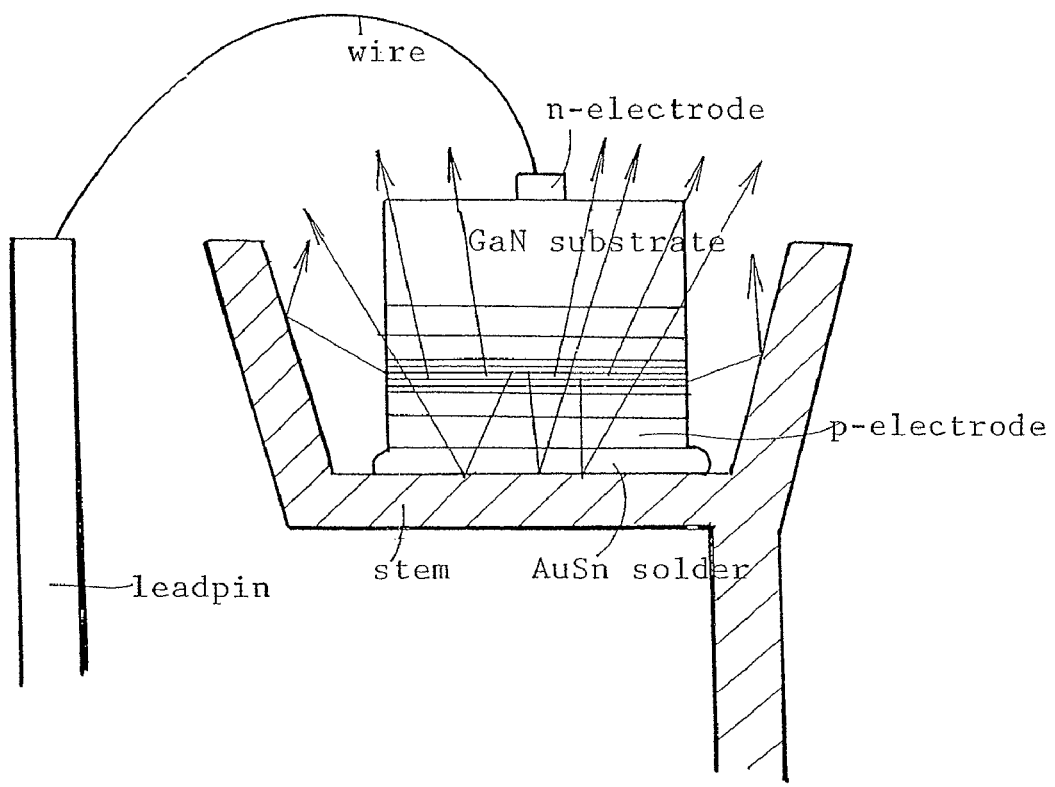
FIG. 27 is a sectional view of a light emitting device which is made by fixing the device chip in an epi-down posture (p-region down and n-region up) on a stem of a package with AuSn solder and connecting the n-electrode with a leadpin by a wire.

An n-electrode is formed on the bottom (N-plane; (000-1) plane) n-GaN substrate. A p-electrode is formed on the top p-GaN layer. Plenty of devices are fabricated on the n-GaN wafer. For example, the wafer is cut into LED (light emitting diode) chips of 2 mm squares. Device chips are mounted upon stems of packages. In the case of epi-up mounting, wherein the bottom of the substrate is fitted on the stem, the n-electrode should be wide and the p-electrode should be narrow. Light emitted from the emission layer goes out via the p-region. In the other case of epi-down mounting, wherein the top of the p-layer is fitted on the stem, the n-electrode should be narrow and the p-electrode should be wide (FIG. 26). Light emitted from the emission layer goes out via the n-region. FIG. 27 demonstrates an epi-down mounted LED which can emit light through the n-GaN substrate, since the GaN substrate is transparent. The epi-down mounting device excels in thermal diffusion, because the emission layer is close to the stem metal which carries heat away downward quickly. The GaN substrate is endowed with high conductivity. Heat diffusion is helped by the high thermal conductivity of the GaN substrate. The thermal conductivity of GaN is far higher than sapphire. On-GaN devices are suitable for producing high power devices.

Embodiment 1

[1. Production of GaN Wafer of a Variety of Thicknesses of Edge Process-Induced Degradation Layer]

A plurality of circular 2 inch (about 50 mm) diameter GaN as-cut wafers are produced by a vapor phase growth method. The GaN wafers are n-type wafers doped with silicon (Si) or oxygen (O). The GaN wafers are processed to mirror wafers by a series of planar-processings shown in FIG. 1.

A: Bottom surface grinding
B: KOH bottom surface etching
C: Chamfering by rubber-bonding whetstones of mesh numbers of #600 to #3000
D: Top surface grinding
E: Top surface polishing (gross and minute)
F: Vapor phase etching of top surface A: The bottom surface grinding is a planar process of reducing thicknesses of wafers W to a predetermined range of thickness. Grinding of a bottom surface (N-plane) decreases the thickness of the wafer. The grinding causes a process-induced degradation layer M with lattice disorder on the bottom surface. Neither human eyesight nor scanning electron microscope (SEM) can discern the process-induced degradation layer M. Cathode luminescence (CL), fluorescence microscope or transmission electron microscope (TEM) can discriminate the process-induced degradation layer M from the background. The process-induced degradation layer M is a superficial region which is not illuminant when a GaN wafer is examined by cathode luminescence (CL) or a fluorescence microscope. Alternatively the process-induced degradation layer M is a superficial region which is darker than neighboring deeper region in a light vision of a transparent electron microscope (TEM). The thickness d of the process-induced degradation layer M can be measured by the CL, fluorescence microscope or TEM. For example, a definite region of a GaN wafer is observed by the SEM and CL at the same time. There is a CL-non-illuminant region near the surface which has been planar processed. The depth of the CL-non-illuminant region is the thickness of the process-induced degradation layer. The SEM can exactly measure the depth of the CL-non-illuminant region. The planar processing causes a thick process-induced degradation layer M of a thickness of d=10 μm-50 μm to the bottom surface.

B: It is undesirable to remain the process-induced degradation layer M. The bottom surface process-induced degradation layer M should be eliminated. Step B is to remove the process-induced degradation layer M induced on the bottom surface. Step B etches the wafer in a 25% KOH solution at 90°

C. for 10 minutes to 120 minutes. Etching depth is controlled within the range of 1 µm to 50 µm by changing the etching time.

C: Chamfering is a step of bevelling the circumference edge into a slop or a round. Chamfering by a resin-bonding whetstone induces a break or a crack originating from the periphery. Use of the whettape as proposed by Japanese Patent Laying Open No. 2004-319951 will waste too much time. This invention employs a rubber-bonding whetstone for chamfering in order to protect the circumference from breaking or cracking.

A rubber-bonding whetstone fixes stationary whetgranules with a rubber onto a base disc. The whetstone chamfers the sharp edge of a wafer into an oblique or round edge by coming into contact with the edge and rotating around a center.

Figure 9:
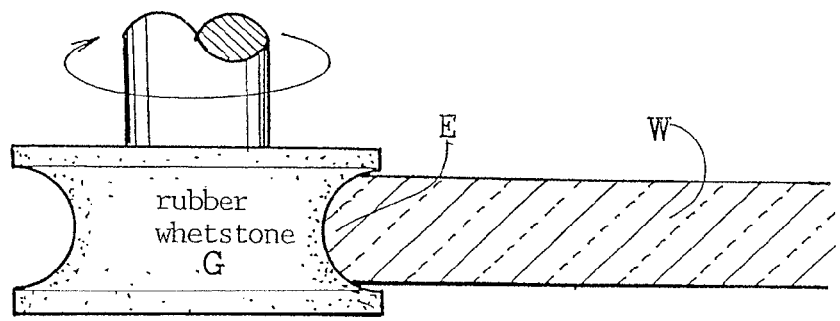
FIG. 9 is a sectional view showing a chamfering process of shaping a sharp edge (including a circumference) of a wafer into a round edge by a rubber-bonding whetstone.

FIG. 9 demonstrates a chamfering process in which a round pulley-shaped rubber-bonding whetstone is chamfering the edge E (including a circumference) of a wafer W into a round section.

Figure 10:
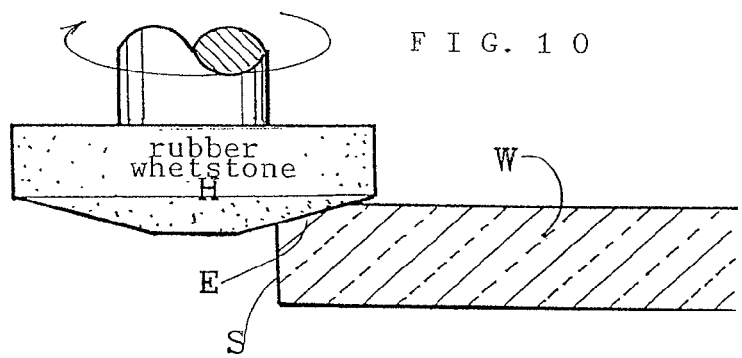
FIG. 10 is a sectional view showing a chamfering process which shapes an edge (including a circumference) of a wafer into a slanting edge by a rubber-bonding whetstone.

FIG. 10 shows another chamfering process in which a cone-shaped rubber-bonding whetstone H having a slanting cone-surface is bevelling the edge E of a wafer into a slanting edge. In this case, both upper edge and lower edge shall be bevelled. Slanting bevelled edges are formed. A middle part of the circumference is not ground in the case. A variety of shapes other than pulley-shape and cone-shape are available for the whetstone. For example, a moving small whetstone can chamfer a wafer by moving around the wafer.

Preferably wafers are chamfered by 600 mesh rubber-bonding whetstone at a first step. Then 2000 mesh rubber-bonding whetstone shall be used at a second step. Chamfering by the 600 mesh whetstone gives roughness about Ra0.3 µm to the edge E. Chamfering by the fine 200 mesh whetstone improve the edge roughness to about Ra0.07 µm. The edge becomes smooth. Chamfering causes a process-induced degradation layer M on the edge E.

D: Top surface grinding D reduces a wafer with a thickness of about 600 µm-554 µm to 500 µm-520 µm. The grinding amount (thickness loss) can be controlled by grinding time. For instance, it takes about 60 minutes to grind a top surface of a 580 µm thick wafer into a 510 µm thick. A process-induced degradation layer M is induced on the top surface of the wafer W by the top surface grinding.

E: Top surface polishing comprises gross polishing and minute polishing of a top surface. Two steps of polishing (gross and minute) gives the top surface flatness. There are two process-induced degradation layers M on both the top surface and the edge. The thicknesses d of the top surface and the edge process-induced degradation layers M vary according to the grinding or polishing amounts. 10 µm to 50 µm are in general the range of thicknesses of the process-induced degradation layers induced on the top and the edge.

F: The top surface process-induced degradation layer can be removed by mechanical-chemical polishing (MCP), electrolysis polishing, liquid phase etching or vapor phase etching. In the present case, the top process-induced degradation layer is eliminated by vapor phase etching with a heated gas including chlorine ($Cl_2$). The top surface (Ga-plane) is chemically and physically more refractory than the bottom surface (N-plane). Alkali etching is useless for corroding the top. The vapor phase etching is employed for removing the top surface process-induced degradation layer.

A variety of wafers having different thicknesses d of the edge process-induced degradation layers M are prepared by changing the conditions of grinding and etching. The edge process-induced degradation layer thicknesses of the GaN wafers are approximately d=0 µm to 20 µm.

[2. Relation Between the Edge Process-Induced Degradation Layer Thickness and the Bow of the Wafer]

There are some different expressions for the bow of wafers. One expression is a curvature radius R of a wafer central line. Another is a curvature rate 1/R. Another is a central height of a wafer. In the present invention, the bow is expressed by the central height U of a wafer which is placed with the periphery contacting to a flat plane.

Figure 13:
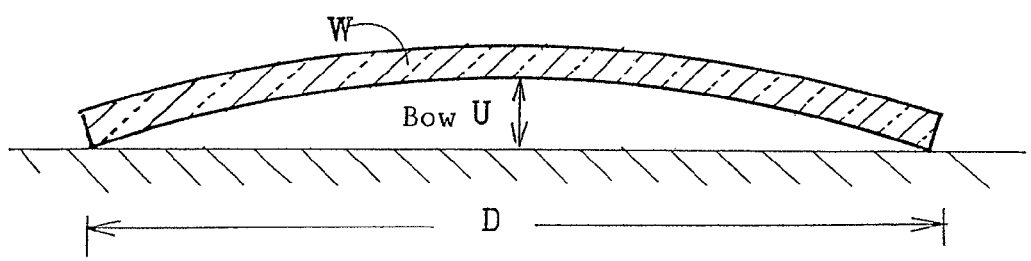
FIG. 13 is a sectional view of a bow wafer with the periphery laid on a horizontal plane for explaining the definition of the degree of bow by the height U of the center of the wafer W of a diameter D.
Figure 11:
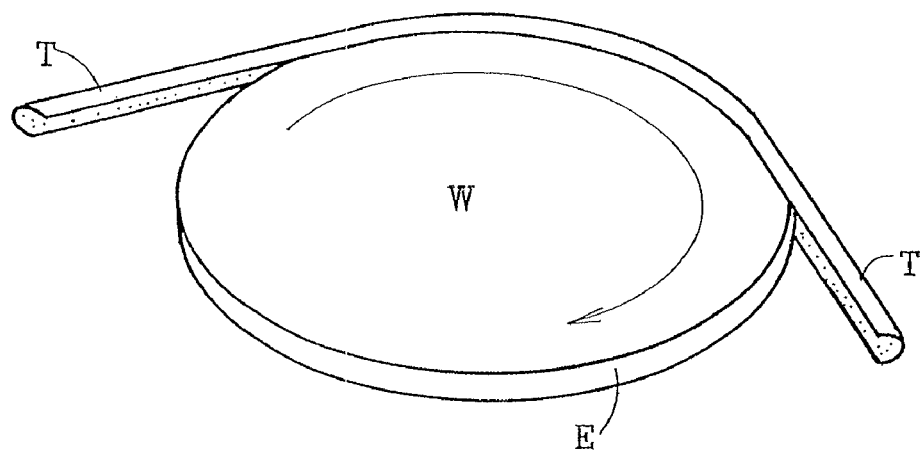
FIG. 11 is a perspective view of a chamfering apparatus, which was proposed by Japanese patent laying open No. 2004-319951 (Japanese Patent application No. 2003-275935), for chamfering an edge of a wafer by carrying a whettape in contact with a wide range of the edge of the wafer and rotating the wafer.
Figure 12:
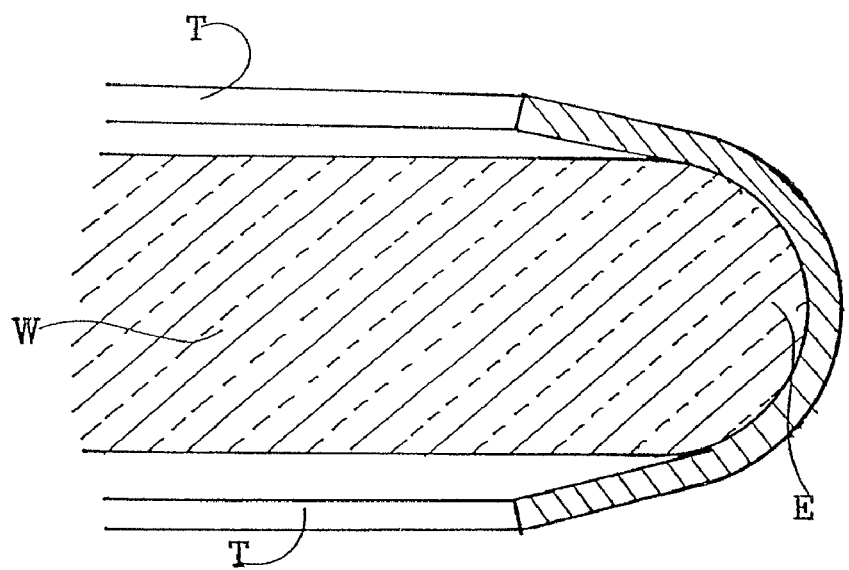
FIG. 12 is a sectional view of a contacting part of the chamfering apparatus, which was proposed by Japanese patent laying open No. 2004-319951 (Japanese Patent application No. 2003-275935), for chamfering an edge of a wafer by carrying a whettape in contact with a wide range of the edge of the wafer and rotating the wafer.

FIG. 13 demonstrates the definition of the bow U which is a height of the center from the flat plane. A relation $U=D^2/8R$ connects the curvature radius R with the central height U, where D is a diameter of the wafer and R is a curvature radius. The bows U of the sample wafers and edge process-induced degradation layer thicknesses d are measured.

The relation between the edge process-induced degradation layer thickness d and the wafer bow U is studied. FIG. 2 exhibits the result. The abscissa denotes logarithms of the edge process-induced degradation layer thickness d (µm). The ordinate denotes the bow U (µm).

Although there are other factors affecting bow, FIG. 2 indicates that the bow U of wafers can be expressed by a monovalue function of the edge process-induced degradation layer thickness d. The bow U monotonously increases between d=3 µm and d=20 µm, as shown in FIG. 2. d=10 µm gives about U=50 µm. Thicknesses d=0.5 µm-10 µm of edge process-induced degradation layers give wafers bow U less than or equal to 50 µm. A point within d=3 µm-1 µm gives wafers the minimum bow U. Decrease of the edge process-induced degradation layer thicknesses d under d=1 µm raises the bow U.

[3. Relation Between the Edge Process-Induced Degradation Layer Thickness d and the Crack Occurrence Rate C]

Crack occurrence rates C are measured for the sample wafers. FIG. 3 denotes the result of measuring the crack occurrence rates C. The abscissa of FIG. 3 denotes logarithm of the edge process-induced degradation layer thickness d (µm). The right ordinate denotes the crack occurrence rate C (%). A broken curve shows the crack occurrence rate. Various factors cause cracks. This result teaches that the crack occurrence rate C has a distinct relation to the edge process-induced degradation layer thickness d.

The crack occurrence rate C (%) increases monotonously with the edge process-induced degradation layer thickness d in the range of d=3 µm to d=10 µm. A decrease from d=1 µm to d=0 µm raises the crack occurrence rate C. d=0.5 µm-10 µm can suppress the crack occurrence rate less than or equal to 50%. A value of d below 3 µm minimizes the crack occurrence rate C.

[4. Relation Between the Edge Process-Induced Degradation Layer d and the Wafer Production Yield Y]

The wafer production yield Y (%) is examined. Although a variety of factors affect the wafer production yield, the wafer production yield Y has a clear relation to the edge process-induced degradation layer thickness d.

In FIG. 3, a solid curve denotes the wafer production yield (Y) as a function of the edge process-induced degradation layer thickness d. The wafer production yield Y is approximately 80% to 75% in the range of d=3 µm-10 µm. Y is about 72% to 80% in the range of d=0.5 µm-10 µm. Y is 76% at d=10 µm. Y for d=10 µm-20 µm is not depicted, since Y falls further.

At d=1 µm of the edge process-induced degradation layer thickness, the wafer production yield Y decreases to about 75%. At d=0 µm, Y falls to about 60%. 0.5 µm-10 µm edge process-induced degradation layer thicknesses maintain the wafer production yield Y at 72% to 80%.

[5. Relation Between the Edge Process-Induced Degradation Layer Thickness d and the In-Surface Device Production Yield Q]

Light emitting devices are produced on the GaN wafers processed by a variety of conditions. In-surface device production yields Q are examined. It turned out that the in-surface device production yield Q also has a strong relation to the edge process-induced degradation layer thickness d.

FIG. 4 exhibits the result of measurements. The edge process-induced degradation layer thickness d=1.7 µm gives the maximum of 80% to the in-surface device production yield Q. The thickness d exceeding 3 µm decreases the device production yield Q. On the contrary, the process-induced degradation layer thickness d approaching 0 µm lowers the device production yield Q via 50% below 40%. More than or equal to 60% of device production yield Q requires a 0.5 µm-10 µm thickness of the edge process-induced degradation layer. 1 µm-5 µm thicknesses d of the edge process-induced degradation layer can maintain the in-surface device production yield of more than or equal to 70%.

Since an edge process-induced degradation layer contains lattice disorder, one may assume that d=0 µm would be the best. The above results deny the assumption. Edge process-induced degradation layer thicknesses of d=0.5 µm-10 µm are favorable, in particular, d=1 µm-3 µm are preferable.

The optimum range of edge process-induced degradation layer thickness d is 1 µm to 3 µm in consideration of all the factors of the bow U, the wafer production yield Y, the crack occurrence rate C and the in-surface device production yield Q.

The above experiment mentions a series of bottom surface grinding, bottom surface etching, edge chamfering, top surface grinding, top surface polishing and top surface vapor phase etching of 2 inch (50 mm) diameter GaN wafers which have been obtained as a single as-cut wafer in a batch of growth. Similar results are obtained in another case of a plurality of GaN wafers made in a batch of growth by growing a tall GaN crystal and slicing the GaN into a plurality of as-cut wafers. The alternative case includes another series of bottom etching, edge chamfering, top surface polishing and top surface vapor phase etching.

The above are results of experiments for GaN wafers. Other nitride semiconductor wafers of AlN, AlGaN or InGaN wafers reveal similar results. Hereafter "surface" succeeding "top" or "bottom" is sometimes omitted for simplicity. "Bottom surface" or "top surface" will often be briefly written "bottom" and "top".

On the accumulation of results of experiments mentioned above, the present invention proposes a method of giving a 0.5 µm-10 µm thickness, preferably, 1 µm-3 µm thickness of a process-induced degradation layer to a circumference edge of a nitride wafer by chamfering the edge with a rubber-bonding or a bubble-resin-bonding whetstone in a series of processes of bottom grinding, edge chamfering, and top grind/polishing.

FIGS. 5 to 8 show sectional views of nitride semiconductor wafers W processed by the above mentioned methods.

FIG. 5 exhibits a nitride wafer W having a 0.5 µm-10 µm, preferably 1 µm-3 µm thick process-induced degradation layer M at an upper edge which was prepared by chamfering an edge by a pulley-shaped rubber-bonding whetstone (G), polishing the top and eliminating a top process-induced degradation layer.

FIG. 6 exhibits a nitride wafer W having a 0.5 µm-10 µm, preferably 1 µm-3 µm thick process-induced degradation layer M at a round edge (including a side) which was prepared by chamfering an edge by a pulley-shaped rubber-bonding whetstone (G), polishing the top and eliminating a top process-induced degradation layer.

FIG. 7 exhibits a nitride wafer W having a 0.5 µm-10 µm, preferably 1 µm-3 µm thick process-induced degradation layer M at a slant edge which was prepared by chimfering an edge by a cone-shaped rubber-bonding whetstone (G), polishing the top and eliminating a top process-induced degradation layer.

FIG. 8 exhibits a nitride wafer W having a 0.5 µm-10 µm, preferably 1 µm-3 µm thick process-induced degradation layer M at slant edges (including a side) which was prepared by chamfering edges and a side by a cone-shaped rubber-bonding whetstone (G), polishing the top and eliminating a top process-induced degradation layer.

Embodiment 2

Figure 14:
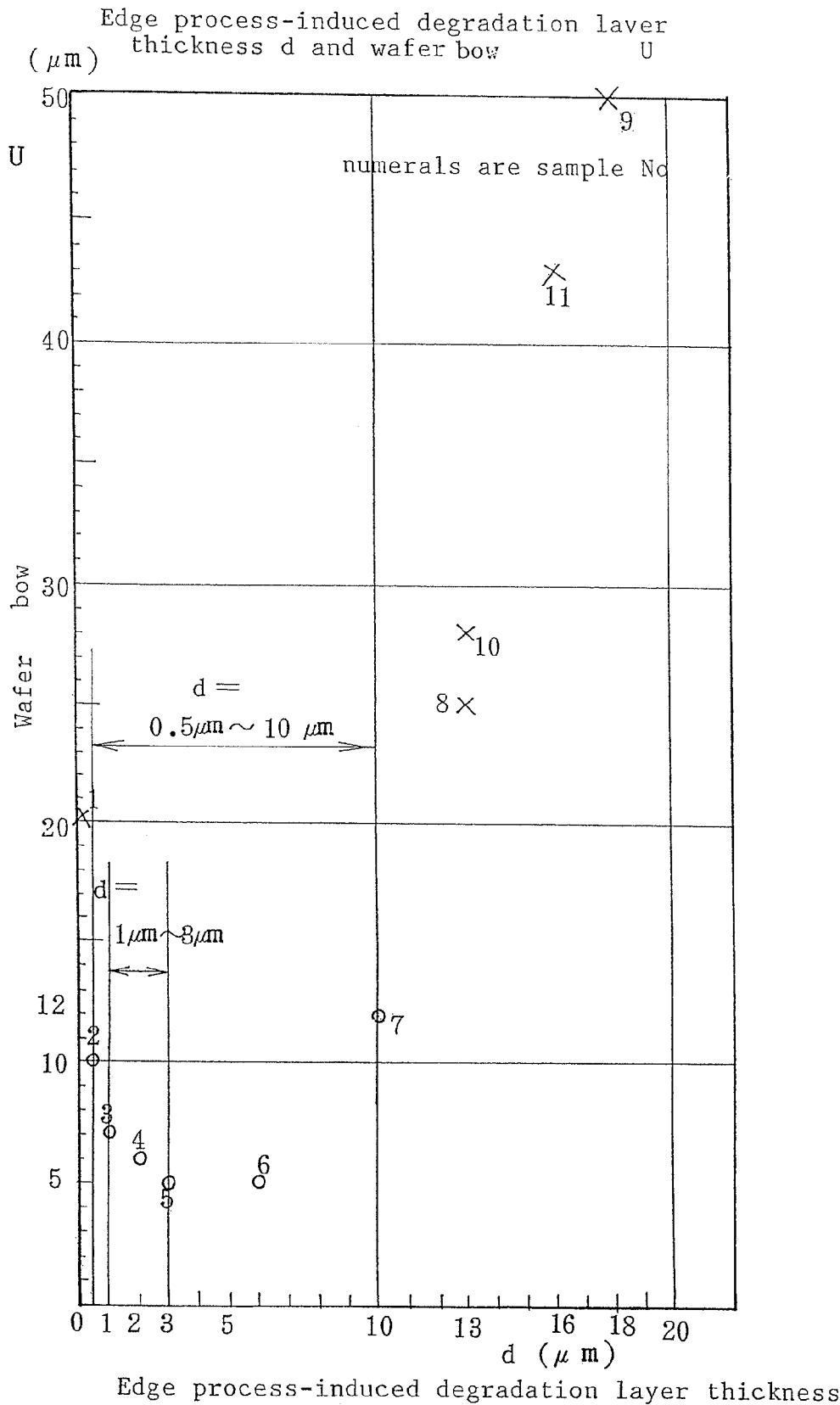
FIG. 14 is a graph showing a relation between the thickness d (μm) of the process-induced degradation layers and the wafer bow U (μm) of Samples 1 to 11. Numerals attached denote sample numbers. ○ denotes an allowable sample and x indicates a rejected sample (same hereinafter).
Figure 15:
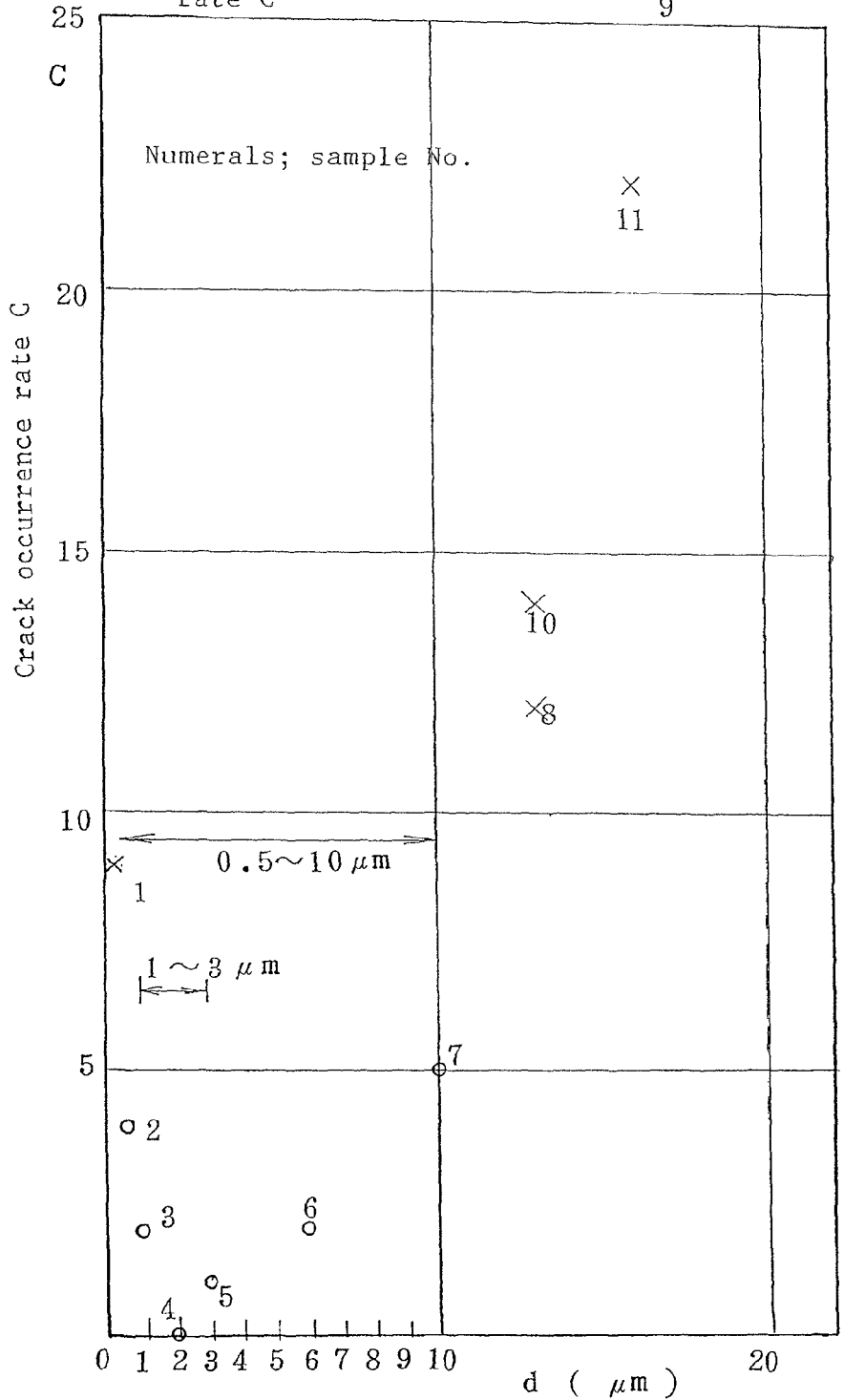
FIG. 15 is a graph showing a relation between the thickness d (μm) of the process-induced degradation layers and the crack occurrence rate C (%) of Samples 1 to 11. Numerals attached denote sample numbers.
Figure 16:
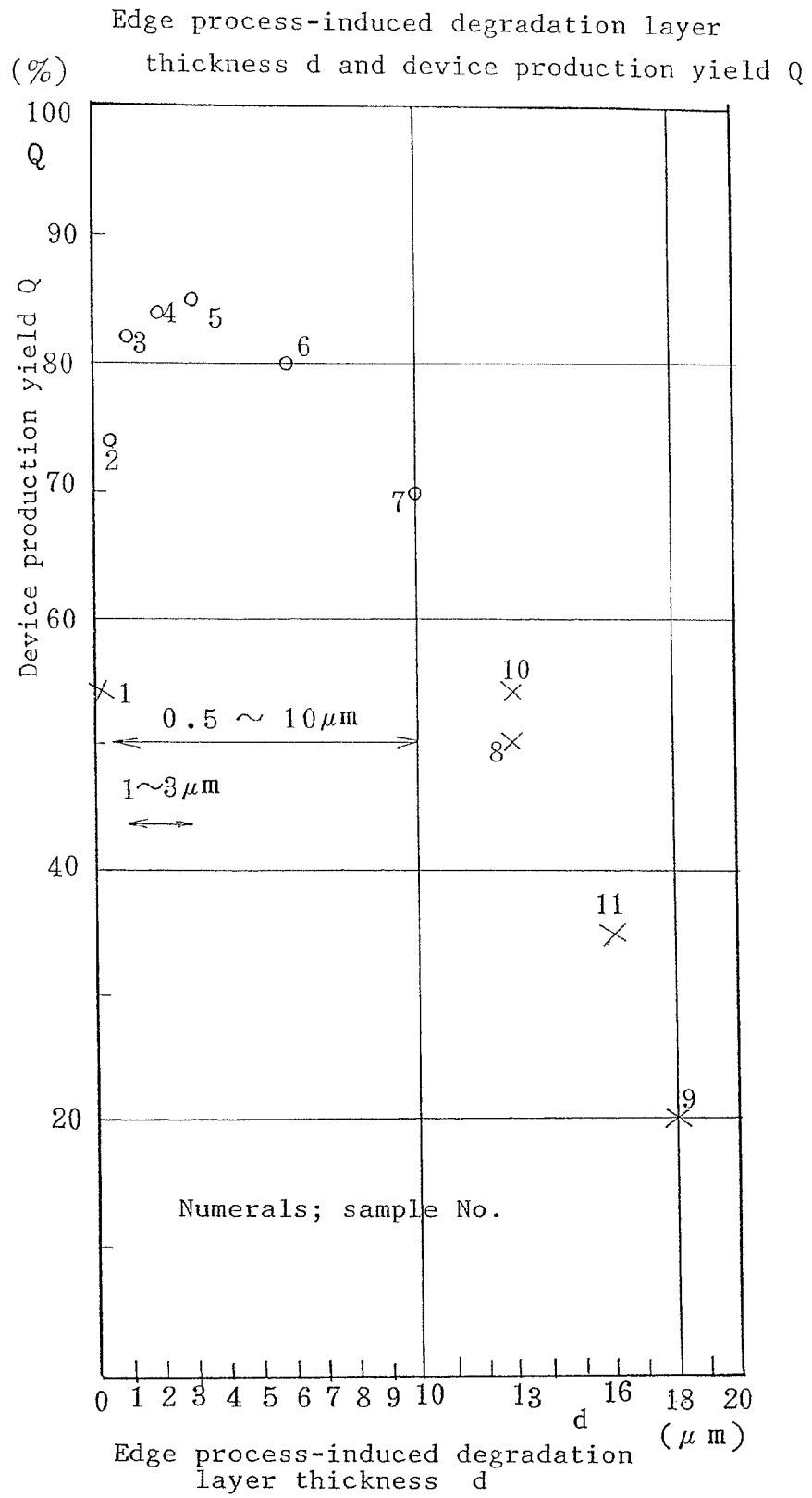
FIG. 16 is a graph showing a relation between the thickness d (μm) of the process-induced degradation layers and the device-production yield Q (%) of Samples 1 to 11. Numerals attached denote sample numbers.

Embodiment 2: Samples 1-11, Table 1; FIGS. 14, 15, 16

Embodiment 1 uses 2 inch (50 mm) diameter wafers. Increase of a diameter of a wafer raises the difficulty of chamfering. A larger diameter of wafers induces more cracks, greater bow and lower device production yield. The usefullness of the present invention will rise, if this invention is applicable to large diameter wafers.

Embodiments 2 to 4 describe 26 samples which give one step of chamfering to large and thick GaN wafers with a 5 inch (127 mm) diameter and an 850 m thickness for confirming the applicability of the present invention to wide wafers. There is no antecedent of a 5 inch diameter GaN wafer. The present invention proposes 5 inch wide GaN wafers for the first time. Sample numbers are indicated by affixed numerals in FIGS. 14 to 24. ○ means an allowable, passable sample. x means a rejected sample. The processes of gallium nitride wafers which are common to all Samples 1-26 are explained.

[Processes of Gallium Nitride Wafers]

FIG. 1 demonstrates a series of processes of bottom surface grinding (A), KOH etching (B) for bottom process-induced degradation layer removal (B), chamfering (C), top surface grinding (D), top surface polishing (E) and vapor phase etching for top surface process-induced degradation layer removal. Chamfering (C) characterizes the present invention. All the processes (A) to (F) are explained.

(1) Shaping and Processing of GaN Wafers

An oxygen doped GaN ingot of a 5 inch (127 mm) diameter is grown by the HVPE method. A wire-saw cuts the GaN ingot in a (0001) plane into a 850 µm thick GaN substrate wafer. The bottom surface of the GaN wafer is ground by a #600 diamond whetstone (process A). The bottom grinding induces a process-induced degeneration layer on the bottom surface of the wafer. The process-induced degeneration layer is eliminated from the bottom by a wet etching in a 15% KOH solution at 50° C. (process B). Instead of KOH, NaOH, $H_3PO_4$ or another acid or alkali solution is available for the bottom etching (B) as long as the etching speed is high enough. Dry etching is also useful to eliminate the process-induced degeneration layer from the bottom. After the etching, a variety of whetstones listed on Table 1 chamfer the GaN wafers (process C). Then top surfaces of the wafers are processed (processes D, E).

(2) Lapping and CMP (Chemical Mechanical Polishing) of a Top Surface of a GaN Wafer A bottom surface (N-plane; (000-1) plane) of an n-type GaN wafer (or another nitride wafer) is glued with wax to a ceramic holder. A turntable of a 600 mm diameter is mounted on a lapping apparatus. The holder is laid upon the turntable.

Slurry dispersed with free diamond granules is supplied via a slurry inlet onto the turntable. The turntable is revolved around a central axis. A weight is laid on the holder. The holder is rotated around a shaft. The top surface (Ga-plane; (0001) plane) is lapped by pushing the top surface to the turntable, rotating the holder and revolving the turntable.

A copper (Cu) turntable or a tin (Sn) turntable is employed for lapping top surfaces. Three different sizes of free diamond granules having a diameter of 9 μm, 3 μm and 2 μm respectively are prepared. The diameters of granules are decreased step by step according as the lapping proceeds. Polishing pressure is 100 g/cm$^2$ to 500 g/cm$^2$. Both the rotation of the holder (GaN wafer) and the revolution of the turntable are 30 turns/min to 60 turns/min. The lapping produces mirror flatness on the top surface.

Polishing follows lapping. A polishing pad is pasted on a turntable of a 600 mm diameter of a polishing apparatus. The holder with the lapped GaN wafer is laid on the polishing pad. A weight pushes the holder to the polishing pad. Slurry dispersed with free whetgranules is supplied via a slurry inlet to the polishing pad of the polishing apparatus. The turntable revolves around a center shaft. The holder rotates around a center. CMP (chemical mechanical polishing) of the top surface (Ga-plane; (0001) plane) of the GaN wafer is done by pushing the top surface to the pad, rotating the holder and revolving the turntable.

Slurry is prepared by dispersing 2 μm diameter alumina ($Al_2O_3$) granules at 5 wt % in water, adding $HNO_3$ and adjusting a pH within pH2-pH4. The polishing pads are polyurethane suede pads. The turntable is a stainless-steel turntable. Polishing pressure is 50 g/cm$^2$ to 600 g/cm$^2$. Rotation speeds of both the GaN wafer and the polishing pad are 30 turns/min to 70 turns/min.

(3) Dry-Etching and Washing of Top Surfaces of GaN Wafers

Following the CMP processing, the GaN wafers are dry-etched in an ICP-RIE apparatus. The etching gas is chlorine gas. The dry-etched GaN wafers are washed with a dilute KOH solution and IPA (isopropyl alcohol). The finished GaN wafers are tested. Testing items are edge process-induced degradation layer, top/edge/bottom roughnesses, bow, edge oxygen concentration, edge metal concentration and chipping occurrence. Top surface roughnesses are commonly Ra1.5 nm for all samples. Bottom surface roughnesses are commonly Ra5.6 μm for all samples. Edge roughnesses are varied for samples. Tables 1, 2 and 3 show the results of measurements of the parameters.

(4) Fabrication of LED Devices on the n-GaN Substrate

The prepared n-GaN wafers have $1\times10^{-2}$ Ωcm of resistivity and $3\times10^{18}/cm^3$ of carrier concentration. The n-GaN wafers are installed in an MOCVD apparatus. The MOCVD apparatus produces epitaxial GaN wafers by growing a 1 μm thick Si-doped n-GaN layer, a 150 nm thick Si-doped n-$Al_{0.1}Ga_{0.9}N$ layer, a light emission layer, a 20 nm thick Mg-doped p-$Al_{0.2}Ga_{0.8}N$ layer and a 150 nm thick Mg-doped p-GaN layer in turn on the top surface (Ga-surface: (0001) plane) of the n-GaN wafer. FIG. 25 shows a sectional view of the epitaxial wafer. The light emission layer is a multiquantum well consisting of four 10 nm thick GaN shield layers and three 3 nm thick $Ga_{0.85}In_{0.15}N$ well layers alternately piled.

Then the bottom surface ((000-1) plane, N-plane) is provided with a 100 μm diameter n-electrode by piling a 200 nm thick Ti layer, a 1000 nm thick Al layer, a 200 nm thick Ti layer and a 2000 nm thick Au layer on the bottom surface and annealing the wafer in nitrogen gas atmosphere. The top p-GaN layer is provided with a p-electrode by piling a 4 nm thick Ni layer and a 4 nm thick Au layer and annealing the wafer in inert gas atmosphere. FIG. 26 shows a section of unit device of the wafer. The wafer is divided into plenty of 2 mm square device chips. The p-electrode of a chip is epi-down bonded with AuSn solder on a stem of a package. The n-electrode is connected with a leadpin by a wire. FIG. 27 shows a semiconductor device having an LED structure made by the above processes.

The epi-down mounted LED has advantages over epi-up mounted LED. The epi-down structure enables the LED to emit light via the transparent GaN substrate. The epi-down structure excels in thermal diffusion, since heat can flow down from the light emission layer via the close stem to the package. GaN has excellent heat conductivity of 210 W/mK as five times as much as sapphire of 40 W/mK. The epi-down structure allows the GaN substrate to guide and diffuse heat upward. The epi-down LED can make the best use of the features of GaN wafers. Light power is measured by laying an LED at a center of an integral sphere and supplying the LED with a 4 A injection current. The injection of current makes the emission layer emit light. A part of light upward goes via the substrate out of the LED. Another part of the light is emitted downward, is reflected by the stem and is thrown upward out of the LED (FIG. 27). Another part of light which is reflected by sides of the package goes outward. The LED has a very large size of a 2 mm square. The epi-down mounting allows even downward emitted light to go out upward. The present invention can give large output power LEDs made on the GaN substrate.

The output of light emitting devices is measured by placing the LEDs at a central point in an integral sphere, injecting a current of 4 A to the LED for inducing the LED for emitting light, gathering light by the integral sphere, sensing the power gathered by a detector placed on another center. High light power is one of the most significant performances of LEDs. The LEDs emitting light power of 2 W or more are judged "allowable". The LEDs of light output of less than 2 W are judged "rejected". The critical output is 2 W. The above mentioned planar-processings, device fabrication, inspection are common to all Samples 1-26.

Samples 1-11 examine bow, crack occurrence and device production yield by changing diamond mesh numbers, bonding materials, kinds of oxides and rates of oxides of chamfering whetstones.

TABLE 1

|  |  |  | Sample 1 | Sample 2 | Sample 3 | Sample 4 | Sample 5 | Sample 6 | Sample 7 | Sample 8 | Sample 9 | Sample 10 | Sample 11 |
|---|---|---|---|---|---|---|---|---|---|---|---|---|---|
| Edge Processing | Bonding | Kinds | Rubber | Rubber | Rubber | Rubber | Rubber | Resin | Rubber | Resin | Metal | Metal | Electro-deposition |
|  |  | Materials | CR | CR | CR | CR | CR | PVA | CR | Phenol | Cu—Sn | Cu—Sn | Ni |
|  |  | Rubber Hardness | 40 | 40 | 40 | 45 | 50 | — | 60 | — | — | — | — |
|  |  | Porosity (vol %) | 0% | 0% | 0% | 0% | 0% | 40% | 0% | 0% | 0% | 0% | 0% |

TABLE 1-continued

|  |  | Sample 1 | Sample 2 | Sample 3 | Sample 4 | Sample 5 | Sample 6 | Sample 7 | Sample 8 | Sample 9 | Sample 10 | Sample 11 |
|---|---|---|---|---|---|---|---|---|---|---|---|---|
|  | Whetgranule Diamond (Mesh No.) | 6000 | 3000 | 3000 | 2000 | 1500 | 800 | 600 | 600 | 600 | 3000 | 3000 |
|  | Oxide | $Fe_2O_3$ | $Fe_2O_3$ | — | — | — | — | — | — | — | $Fe_2O_3$ | — |
|  | Oxide Amount (wt %) | 20 | 20 | — | — | — | — | — | — | — | 20 | — |
| Wafer Properties | Edge process-induced degradation layer thickness d (μm) | 0.3 | 0.5 | 1 | 2 | 3 | 6 | 10 | 13 | 18 | 13 | 16 |
|  | Edge roughness Ra (μm) | 0.03 | 0.07 | 0.15 | 0.5 | 1 | 3 | 5 | 7 | 8 | 1 | 2 |
|  | Bow U (μm) | 20 | 10 | 7 | 6 | 5 | 5 | 12 | 25 | 50 | 28 | 43 |
|  | Crack occurrence rate C (%) | 9 | 4 | 2 | 0 | 1 | 2 | 5 | 12 | 26 | 14 | 22 |
| Device | Device production yield Q (%) | 52 | 72 | 82 | 84 | 85 | 80 | 70 | 50 | 20 | 52 | 35 |

Table 1 Samples 1-11; mesh numbers, bonding materials, oxides, bow, edge roughness, crack occurrence, device production yields The first line of Table 1 denotes sample numbers. Sample numbers are 1-11. Wafer properties are values measured for each sample. Conditions of chamfering, wafer properties and device properties are shown for all samples.

The second to eighth denote the properties of chamfering whetstones. Chamfering is an edge grinding process by rotating a whetstone embedded with stationary whetgranules and bringing an edge of a wafer into contact with the rotating whetstone. "Bond" indicates the properties of the bonding materials which fix whetgranules to a base. Prevalent whetstones are resin-bonding whetstones which maintain stationary granules by a resin to the base, metal-bonding whetstones which fix granules by a metal to the base and electrodeposition whetstones which fix granules to the base by electrodeposition. The present invention denies these whetstones. The present invention does not use resin-bonding whetstones, metal-bonding whetstone and electrodeposition whetstones. Rigid fixation of granules to the base is a drawback of the prevailing resin-, metal-bonding or electrodeposition whetstones.

This invention chamfers edges of nitride wafers by rubber bonding whetstones or bubbled-resin bonding whetstones. For the purpose of comparison, nitride wafers are chamfered by resin bonding whetstones, metal bonding whetstones and electrodeposition whetstones. The column of materials denotes the bonding materials. "CR" means chloroprene rubber. The next column shows the hardness of the bonding rubbers. Bonding resins or bonding metals are harder than the bonding rubbers. Measurements of bonding metals or resins are different from the measurement of the bonding rubber. Resins are still poor in elasticity and inapplicable for nitride wafer chamfering. Bubbling brings resins to be useful for nitride wafer chamfering by enhancing elasticity. Bubbling of resin makes a mixture of resin and air bubbles. The "porosity" is the volume percent of air bubbles to the whole. The porosity is a measure of the elasticity of the bubbled resin.

Table 1 shows the kinds and weight percent of oxide whet granules. 100% minus oxide whet granule weight percent is the weight percent of diamond whet granules.

The lines of substrate characteristics denote four characteristics of the postchamfered wafers. The first one is the thicknesses (μm) of the process-induced degeneration layers at edges of the wafers. The cathode luminescence (CL) can discern the process-induced degeneration layers from the other parts. The CL measures the thicknesses of the process-induced degeneration layers remaining at the periphery of the wafers. The second line denotes the roughness Ra of the chamfered peripheries in μm unit. The third line shows the bow of the wafers. The bow is represented by the central height U of an wafer which is placed with the periphery in contact with a flat plane. Since the present invention treats with wide wafers, even a small bow curvature shows a big bow height U. The bow height U of a wafer of a diameter D is related to the bow curvature radius R by quadratic function approximation $R=D^2/8U$. For example, the central height U=20 μm for a wafer of a diameter D=127 mm corresponds to a curvature radius R=100 m of bow. The curvature of bow is $1/R=0.01$ m$^{-1}$.

"Crack" means occurrence of breaks or splits during chamfering. "Crack occurrence rate" is a ratio of the number of wafers which are broken or split while chamfered to the number of total wafers. Samples 1-11 are chamfered at the edges under a variety of conditions. Bow, crack occurrence rates, device yields are measured for the postchamfered samples 1-11.

The "device" line shows device production yields which are ratios of the number of good device chips to the number of the whole device chips obtained from one of the sample wafers. The device is a very large-sized light emitting diode (LED) of a 2 mm square (4 mm$^2$ area). Conventional LEDs on sale have a 300 μm square (0.09 mm$^2$ area) to a 500 μm square (0.25 mm$^2$ area). The LEDs of the present invention are fifteen-forty times as large as the conventional ones. A 127 mm diameter circular wafer has about a 12000 mm$^2$ area which is about 3000 times as wide as the 2 mm square chips. Thus about 3000 LEDs are obtained from a single 127 mm diameter wafer. A predetermined number of LEDs are chosen from a batch of LEDs produced on one GaN wafer as samples. Qualities of the LEDs are tested by injecting currents. Since the LEDs of the above samples have very wide areas (e.g., 2 mm square), the probability of occurrence of rejected devices would be assumed to become higher than conventional tiny devices (0.3 mm square to 0.5 mm square) from a statistical standpoint. This invention, however, turns out to be able to produce good large-sized LEDs with high yields.

FIG. 14 is a graph denoting a relation between measured edge process-induced degradation layer thicknesses d (μm) and wafer bow U (μm) of Samples 1 to 11. ○ denotes an allowed sample. x denotes a rejected sample. Numerals affixed are sample numbers. The present invention advocates a range denoted by an arrow between 0.5 μm and 10 μm as desirable edge process-induced degradation layer thicknesses. A more favorable range is d=1 μm-3 μm. FIG. 15 denotes a relation between measured edge process-induced degradation layer thicknesses d (μm) and crack occurrence rates C (%). FIG. 16 denotes a relation between measured edge process-induced degradation layer thicknesses d (μm) and device production yields Q (%).

[Sample 1 ($Fe_2O_3$; rubber whetstones; d=0.3 μm; Q=52%)]

5 inch (127 mm) diameter GaN circular wafers of a 850 μm thickness are planar-processed by bottom surface grinding (A) and bottom surface etching (B). The GaN wafers are chamfered by a rubber bonding whetstone (C) with chloroprene rubber (CR) as a bonding material. Since the bonding material is rubber, the whetstone should be called "rubber-bonding whetstone". But the whetstone is sometimes called a "rubber whetstone" in brief by omitting "bonding". Furthermore what grinds objects is not rubber but diamond granules. Rubber, a bonding material, cannot be bubbled. Thus porosity of the rubber whetstones is 0%. Resin, another bonding material, can be bubbled. Rubber has different degrees of hardness by varying components. This rubber of the whetstone has hardness 40.

Stationary whetgranules are a mixture of diamond granules and ferric oxide ($Fe_2O_3$) granules. The ratio of the oxide granules ($Fe_2O_3$) is 20 wt %. The rest of 80% is diamond granules. The mesh number of diamond granules is #6000. The mesh number denotes the average size of granules. A larger mesh number means a smaller diameter of granules.

6000 denotes fine diamond granules of an average diameter of 2.5 μm. The thickness d of the edge process-induced degradation layer originating from the chamfering is d=0.3 μm. Edge roughness of the postchamfered wafers is Ra0.03 μm. The postchamfered GaN wafers are further planar-processed by top surface grinding (D) and top surface polishing (E). The top surface becomes mirror flat. The top process-induced degradation layer caused by the processes (D) and (E) is eliminated by top surface etching (F). The bow height U is 20 μm. The crack occurrence rate C is 9%. Crack means occurrence of crack, split or break of a wafer while chamfering. Crack occurrence rate C (%) is a ratio obtained by dividing the number of the wafers cracking, splitting or breaking while chamfering by the total number of the wafers and multiplying with 100. The last line "device yield" Q is obtained by producing 2 mm square LED devices on the GaN wafer, dividing the wafer into LED chips, mounting LED chips on stems, wirebonding electrodes to leadpins, injecting a 4 A current to LEDs, examining the light output, counting the number of approved LEDs of over 2 W output and dividing the number of the approved LEDs by the total number of tested LEDs. The device production yield Q of Sample 1 is 52%. Poor production yield degrades Sample 1. Sample 1 should be rejected. In Figures Sample 1 is affixed with "x" which denotes rejected one. It is assumed that too small edge process-induced degradation layer thickness d=0.3 μm would reduce the production yield Q. Thicker edge process-induced degradation layers are desired. Use of grosser whetstones or application of heavier loads will increase the edge process-induced degradation layer thickness d.

[Sample 2 ($Fe_2O_3$; rubber whetstones; d=0.5 μm; Q-72%)]

After bottom grinding (A) and bottom etching (B), 5 inch (127 mm) diameter GaN circular wafers of a 850 μm thickness are chamfered by a rubber bonding whetstone (C) with chloroprene rubber (CR) as a bonding material. The porosity of the rubber-bonding whetstones is 0%. This rubber of the whetstone has hardness 40. Stationary whetgranules are a mixture of diamond granules and ferric oxide ($Fe_2O_3$) granules. The ratio of the oxide granules ($Fe_2O_3$) is 20 wt %. The rest of 80% is diamond granules. The mesh number of diamond granules is #3000 which is grosser than Sample 1. The average size of #3000 whetgranules is about 5 μm. The thickness d of the edge process-induced degradation layer originating from the chamfering is d=0.5 μm. Use of a grosser whetstone increases the edge process-induced degradation layer thickness d. Edge roughness of the postchamfered wafers is Ra0.07 μm. The grosser whetstone raises the edge roughness. The postchamfered GaN wafers are further planar-processed by top surface grinding (D) and top surface polishing (E). The top surface becomes mirror flat. The top process-induced degradation layer is eliminated by top surface etching (F). The bow height U, which is a height from a center to the periphery, is 10 μm. Sample 2 is superior to Sample 1 in bow height U. The bow curvature radius is R=200 m. The crack occurrence rate C is 4% which is less than half of Sample 1. The device production yield Q which is obtained by producing 2 mm square LED devices on the wafer, dividing the wafer into LED chips, mounting LED chips on stems, wirebonding electrodes to leadpins, injecting a 4 A current to LEDs, examining the light output, counting the number of approved LEDs of over 2 W output and dividing the number of the approved LEDs by the total number of tested LEDs, is 72%. High production yield approves Sample 2 useful. Sample 2 is allowable. In Figures Sample 2 is affixed with "○" which denotes an approved one. In the following figures, ○ is approved and x is rejected. Edge roughness of Sample 2 is Ra0.07 μm which is rougher than Sample 1. The edge process-induced degradation layer thickness d is 0.5 μm which is thicker than Sample 1. The high yield of Sample 2 results from a pertinent edge roughness and a suitable edge process-induced degradation layer thickness d.

[Sample 3 (No oxide granules; rubber whetstones; d=1 μm; Q=82%)]

After bottom grinding (A) and bottom etching (B), 5 inch (127 mm) diameter GaN circular wafers of a 850 μm thickness are chamfered by a rubber bonding whetstone (C) with chloroprene rubber (CR) as a bonding material. The porosity of the rubber-bonding whetstones is 0%. This rubber of the whetstone has hardness 40. Stationary whetgranules are all diamond granules. No oxide granules are used. The ratio of the oxide granules is 0 wt %. The whole is diamond granules. The mesh number of diamond granules is #3000 which is equal to Sample 2. The thickness d of the edge process-induced degradation layer originating from the chamfering is d=1 μm. Increase of the mechanical grinding function by 100% diamond granules increases the edge process-induced degradation layer thickness d. Edge roughness of the postchamfered wafers is Ra0.15 μm. The 100% diamond granule whetstone raises the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 7 μm, which is smaller than Samples 1 and 2. The bow curvature radius is R=286 m. 1 μm thickness of the edge process-induced degradation layer reduces the bow. The crack occurrence rate C is 2% which is less than Samples 1 and 2. The device production yield Q which is obtained by producing 2 mm square LED devices on the wafer, is 82%. Sample 2 is allowable. The 1 μm thickness of the edge process-induced degradation layer, which is bigger than Samples 1 and 2, improves all of the bow U, crack occurrence C, and device production yields Q in Sample 3.

[Sample 4 (No oxide granules; rubber whetstones; d=2 μm; Q=84%)]

After bottom grinding (A) and bottom etching (B), 5 inch (127 mm) diameter GaN circular wafers of a 850 μm thickness are chamfered by a rubber bonding whetstone (C) with chloroprene rubber (CR) as a bonding material. The porosity of the rubber-bonding whetstones is 0%. This rubber of the whetstone has hardness 45, which is a little harder than Samples 1, 2 and 3. Stationary whetgranules are all diamond granules. No oxide granules are used. The ratio of the oxide granules is 0 wt %. The whole is diamond granules. The mesh number of diamond granules is #2000 (average diameter 7-8 µm), which is grosser than Samples 1, 2 and 3. The thickness d of the edge process-induced degradation layer originating from the chamfering is d-2 µm. Increase of the mechanical grinding function by grosser diamond granules increases the edge process-induced degradation layer thickness d. Edge roughness of the postchamfered wafers is Ra0.5 µm. The grosser diamond granule whetstone raises the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 6 µm. The bow curvature radius is R=333 m, which is smaller than Samples 1, 2 and 3. 2 µm thickness of the edge process-induced degradation layer reduces the bow. The crack occurrence rate C is 0% which is less than Samples 1, 2 and 3. The edge process-induced degradation layer thickness d=4 µm gives the minimum crack occurrence rate C in all samples. The device production yield Q by producing 2 mm square LED devices on the wafer like the preceding samples, is 84%. Sample 4 is allowable. The d=2 µm thickness of the edge process-induced degradation layer, which is bigger than Samples 1, 2 and 3, improves all of the bow U, crack occurrence C, and device production yields Q in Sample 4. The d=2 µm of the edge process-induced degradation layer thickness gives the optimum performance of all characteristics.

[Sample 5 (No oxide granules; rubber whetstones; d=3 µm; Q=85%)]

After bottom grinding (A) and bottom etching (B), 5 inch (127 mm) diameter GaN circular wafers of a 850 µm thickness are chamfered by a rubber bonding whetstone (C) with chloroprene rubber (CR) as a bonding material. The porosity of the rubber-bonding whetstones is 0%. This rubber of the whetstone has hardness 50, which is a little harder than Samples 1-4. Stationary whetgranules are all diamond granules. No oxide granules are used. The mesh number of diamond granules is #1500 (average diameter 10 µm), which is grosser than Samples 1-4. The thickness d of the edge process-induced degradation layer originating from the chamfering is d=3 µm. Increase of the mechanical grinding function by grosser diamond granules increases the edge process-induced degradation layer thickness d. Edge roughness of the postchamfered wafers is Ra1 µm. The grosser diamond granule whetstone raises the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 5 µm, which is the smallest in Samples 1-5. The bow curvature radius is R=400 m. 3 µm thickness of the edge process-induced degradation layer reduces the bow. The crack occurrence rate C is 1%, which is less than Samples 1, 2 and 3. The d=3 µm of the edge process-induced degradation layer thickness gives a good result. The device production yield Q by producing 2 mm square LED devices on the wafer like the preceding samples, is Q=85%, which is the best in all Samples 1-11. Sample 5 is allowable. The d=3 µm thickness of the edge process-induced degradation layer is a favorable value for bow suppression, crack suppression and device yield.

[Sample 6 (No oxide granules; resin-bonding whetstones; d=6 µm; Q=80%)]

After bottom grinding (A) and bottom etching (B), 5 inch (127 mm) diameter GaN circular wafers of a 850 µm thickness are chamfered by a resin-bonding whetstone (C) with polyvinyl alcohol (PVA) as a bonding material. This is not a rubber-bonding whetstone but a resin-bonding whetstone, since the bonding material is a resin (PVA). Pure resins are useless due to hardness. The hardness of the resin bonding material is reduced by bubbling PVA resin. Bubbling lowers hardness of a resin. The porosity of the resin-bonding whetstones is 40%. High porosity gives the resin bonding material pertinent elasticity. The hardness of resin cannot be measured by the same method as rubber. Stationary whetgranules are all diamond granules. No oxide granules are used. The mesh number of diamond granules is #800 (average diameter 19 µm), which is grosser than Samples 1-5. The thickness d of the edge process-induced degradation layer originating from the chamfering is d=6 µm, which is twice larger than Sample 5. Increase of the mechanical function by grosser diamond granules increases the edge process-induced degradation layer thickness d. Edge roughness of the postchamfered wafers is Ra3 µm. The grosser diamond granule whetstone raises the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 5 µm (R=400 m), which is equal to Sample 5 and is the smallest in Samples 1-6. The minimum of bow U is given by d=4-5 µm. Since d of Sample 6 is thicker than Samples 1-4, bow is smaller than Samples 1-4. The crack occurrence rate C is 2%, which is smaller than Samples 1-2, larger than Samples 4-5 and equal to Sample 3. As well as rubber-whetstones, bubbled resin bonding whetstones which are endowed with elasticity by bubbling can suppress the occurrence of cracks. The device production yield Q by producing 2 mm square LED devices on the wafer like the preceding samples, is Q=80%. It is a high device yield. Sample 6 is allowable. The results of Samples 1-6 suggest that d=1 µm-3 µm gives an optimum condition for crack suppression, bow suppression and device yield enhancement. In particular, d=2 µm of the edge process-induced degradation layer thickness is the best value for giving strong crack suppression and maximum device yield.

[Sample 7 (No oxide granules; rubber whetstones; d=10 µm; Q=70%)]

After bottom grinding (A) and bottom etching (B), 5 inch (127 mm) diameter GaN circular wafers of a 850 µm thickness are chamfered by a rubber-bonding whetstone (C) with chloroprene rubber (CR) as a bonding material. The porosity of the rubber-bonding whetstone is 0%. The CR rubber has hardness 60, which is harder than Samples 1-5. Stationary whetgranules are all diamond granules. No oxide granules are used. The mesh number of diamond granules is #600 (average diameter 25 µm), which is grosser than Samples 1-6. The thickness d of the edge process-induced degradation layer originating from the chamfering is d=10 µm which is the thickest among Samples 1-7. The mechanical function by grosser diamond granules increases the edge process-induced degradation layer thickness d. Edge roughness of the postchamfered wafers is Ra5 µm. The grosser diamond granule whetstone raises the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 12 µm (R=170 m), which is larger than Samples 2-6.

Increment of the edge process-induced degradation layer thickness d raises the bow U from Sample 6. The crack occurrence rate C is 5%, which is smaller than Sample 1 but larger than Samples 2-6. In a range of d<2 µm, a decrease of d raises the crack occurrence rates C and an increase of d lowers C. The crack occurrence rate C takes the minimum at d=2 µm. In a range of d>2 µm, increment of d raises the crack occurrence rate C. The device production yield Q by producing 2 mm square LED devices on the wafer like the preceding samples, is Q=70%. The large d=10 µm lowers the device production yield Q in Sample 7. When 82% or more of the device production yield Q is required (Q≧82 µm), the edge process-induced degradation layer thickness d should be 1 µm≦d≦3 µm. When 70% or more of Q is required, an allowable range of d is expanded to 0.5 µm≦d≦10 µm. In this case of 0.5 µm≦d≦10 µm, Sample 1 is rejected (x) and Samples 2-7 are allowable (○). Samples 2-5, and 7 teach that hardness 40-60 is an optimum range of rubber hardness of the rubber whetstones.

[Sample 8 (No oxide granules; resin-bond whetstones; d=13 µm; Q=50%)]

After bottom grinding (A) and bottom etching (B), 5 inch (127 mm) diameter GaN circular wafers of a 850 µm thickness are chamfered by a resin-bonding whetstone (C) with phenol resin as a bonding material. This is not a rubber-bonding whetstone but a resin-bonding whetstone, because the bonding material is a resin (phenol). Unlike Sample 6, phenol resin is employed as a bonding material. Phenol resin is not bubbled. The porosity is 0%. The hardness cannot be measured by the method for rubber. Stationary whetgranules are all diamond granules. No oxide granules are used. The mesh number of diamond granules is #600 (average diameter 25 µm), which is grosser than Samples 1-6 and equal to Sample 7. The thickness d of the edge process-induced degradation layer originating from the chamfering is d=13 µm which is the thickest among Samples 1-8. Though the mesh number is common to Sample 7, non-bubbled phenol resin is harder than the CR rubber of Sample 7. The mechanical function by harder phenol resin increases the edge process-induced degradation layer thickness d over Sample 7. Edge roughness of the postchamfered wafers is Ra7 µm. The harder phenol resin and grosser diamond granules raise the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 25 µm (R=80 m). The crack occurrence rate C is 12%, which is larger than Samples 1-7. This fact means that no bubbled phenol resin brings about a higher crack occurrence rate due to its hardness. The device production yield Q by producing 2 mm square LED devices on the wafer like the preceding samples is Q-50%. When 70% or more of Q is required, Sample 8 is rejected.

Samples 1-8 teach that an allowable range of d is d=0.5 µm-10 µm from the standpoint of suppression of bow and crack and enhancement of device yield. A more favorable range is d=1-3 µm for the edge process-induced degradation layer thickness.

[Sample 9 (No oxide granules; metal-bond whetstones (Cu—Sn); d=18 µm; Q-20%)]

After bottom grinding (A) and bottom etching (B), 5 inch (127 mm) diameter GaN circular wafers of a 850 µm thickness are chamfered by a metal-bond whetstone (C) with a Cu—Sn (copper/tin) alloy as a bonding material. Since the bonding material is metal, this is a metal bonding whetstone. The porosity is 0%. The hardness is higher than the CR rubber. Stationary whetgranules are all diamond granules. No oxide granules are used. The mesh number of diamond granules is #600 (average diameter 25 µm), which is grosser than Samples 1-6 and equal to Samples 7-8. The thickness d of the edge process-induced degradation layer originating from the chamfering is d=18 µm which is the thickest among Samples 1-9. Though the diamond mesh number is common to Samples 7-8, the bonding material Cu—Sn alloy of Sample 9 is harder than the rubber or resin of Samples 7-8. The mechanical function of the bonding metal increases the edge process-induced degradation layer thickness d over Samples 7-8. Edge roughness of the postchamfered wafers is Ra8 µm. Grosser diamond granules and harder metal bonding raise the edge roughness. The postchamfered GaN wafers are further planar-processed by top surface grinding (D) and top surface polishing (E). The top surface becomes mirror flat. The top process-induced degradation layer is eliminated by top surface etching (F). The bow height U is 50 µm (R=40 m). The crack occurrence rate C is 26%, which is larger than Samples 1-8. The device production yield Q by producing 2 mm square LED devices on the wafer like the preceding samples is Q=20%, which is extremely low. Sample 9 is rejected.

Samples 1-9 teach that a range d=2 µm-6 µm gives minimum bow. Over d=6 µm, the bow U increases with d. The crack occurrence rate takes the minimum at d=2 µm. Over d=2 µm, the crack occurrence rate C rises as d increases. The device production yield Q is high within the range of d=1 µm-3 µm. Q is low over d=3 µm or under d=1 µm.

[Sample 10 ($Fe_2O_3$ granules; metal-bond whetstones (Cu—Sn); d=13 µm; Q=52%)]

After bottom grinding (A) and bottom etching (B), 5 inch (127 mm) diameter GaN circular wafers of a 850 µm thickness are chamfered by a metal-bonding whetstone (C) with a Cu—Sn (copper/tin) alloy as a bonding material. The porosity is 0%. The hardness of the Cu—Sn alloy is higher than the CR rubber. Stationary whetgranules are a mixture of diamond granules and $Fe_2O_3$ (ferric oxide) granules. The mixture consists of 80 wt % diamond granules and 20 wt % $Fe_2O_3$ granules. The mesh number of diamond granules is #3000 (average diameter 5 µm), which is equal to Sample 2. The mixture ratio is identical with Sample 2. What is different from Sample 2 is the bonding material. The bonding material of Sample 2 is CR (chloroprene rubber). The bonding material of Sample 10 is a Cu—Sn alloy. Samples 2 and 10 clarify the difference between rubber-bonding and metal-bonding whetstone chamfering. The thickness d of the edge process-induced degradation layer originating from the chamfering is d=13 µm. The thickness d=13 µm of Sample 10 is lower than Sample 9 (d=18 µm) chamfered by the same metal bonding whetstone. The decrease of d results from the use of finer diamond granules of Sample 10. The reason why d=13 µm of Sample 10 is larger than d=0.5 nm of Sample 2 derives from the difference between rubber bonding and metal bonding. Despite the same mesh number and same mixture ratio, Samples 2 and 10 have different thicknesses d=0.5 µm and d=13 µm. This result signifies that rubber bonding whetstones abundant in elasticity are supreme whetstones for chamfering. Edge roughness of the postchamfered wafers is Ra1 µm. Finer diamond granules and soft oxide granules lowers the edge roughness. Metal bonding raises the edge roughness over Sample 2. The postchamfered GaN wafers are further planar-processed by top surface grinding (D) and top surface polishing (E). The top surface becomes mirror flat. The top process-induced degradation layer is eliminated by top surface etching (F). The bow height U is 28 µm (R=80 m). The crack occurrence rate C is 14%, which is larger than Samples 1-8 but smaller than Sample 9. Sample 10 teaches us that metal bonding whetstones with hard bonding are unsuitable for chamfering, even if fine diamond granules are used. The device production yield Q by producing 2 mm square LED devices on the wafer like the preceding samples is Q=52%. This is a low yield. 82% or more of device yields Q require an optimum range of 1 μm≦d≦3 μm. 70% or more of Q require a favorable range of 0.5 μm≦d≦10 μm. Sample 10 is rejected in the over-70% case. 50% or more of Q allow another range of 0.3 μm≦d≦13 μm.

[Sample 11 (No oxide granules; electrodeposition whetstones (Ni); d=16 μm; Q=35%)]

After bottom grinding (A) and bottom etching (B), 5 inch (127 mm) diameter GaN circular wafers of a 850 μm thickness are chamfered by a diamond-electrodeposition whetstone (C) with nickel (Ni) as a bonding material. This is an electrodeposition whetstone. The porosity is 0%. The hardness of nickel (Ni) is higher than the CR rubber. Stationary whetgranules are 100% diamond granules. The whetstone includes no oxide granules. The mesh number of diamond granules is #3000 (average diameter 5 μm), which is the same as Sample 10. What differs from Sample 10 is that Sample 11 contains no oxide and a different bonding material. Diamond granules are electrodeposited on a base disc. The thickness d of the edge process-induced degradation layer originating from the chamfering is d=16 μm. The thickness d=16 μm of Sample 11 is larger than Sample 10 (d=13 μm). The increase of d results from an increment of rigidity by electrodeposition and the higher diamond granule ratio. Edge roughness of the postchamfered wafers is Ra2 μm. Finer diamond granules lowers the edge roughness. But electrodeposition raises edge roughness over Samples 3 and 10. The postchamfered GaN wafers are further planar-processed by top surface grinding (D) and top surface polishing (E). The top surface becomes mirror flat. The top process-induced degradation layer is eliminated by top surface etching (F). The bow height U is 43 μm (R=46 m). The crack occurrence rate C is 22%. Sample 11 reveals the second highest bow U and crack occurrence rate C next to Sample 9. This fact suggests a strong relation between d and U/C. Sample 11 teaches us the electrodeposition whetstones even furnished with fine diamond granules are unsuitable for chamfering due to high rigidity. The device production yield Q by producing 2 mm square LED devices on the wafer like the preceding samples is Q=35%. This is a very low yield. Sample 11 is rejected.

Samples 1-11 suggest that edge roughness has no direct relation to d but depends upon the size and rate of diamond granules. The edge roughness Ra increases with the diamond granule size (smaller mesh number #). Inclusion of oxide granules to whetstones gives edge roughness Ra lower than 100% diamond granule. Samples 2, 3, 10 and 11 suggest that rubber bonding gives the lowest edge roughness and metal-bonding or electrodeposition is indifferent to the edge roughness. There are not strong relations among the edge roughness Ra, bow U, crack occurrence rate C and device yield Q. What rules the bow, crack occurrence rate C and device yield Q is the edge process-induced degradation layer thickness d. The most significant parameter is d.

70% or more device yields Q require d 0.5 μm-10 μm of the edge process-induced degradation layer thickness (FIG. 16). 82% or more device yields Q require d=1 μm-3 μm of the edge process-induced degradation layer thickness. The range of d=3 μm-6 μm minimizes the bow U (FIG. 14). The value d=2 μm minimizes the crack occurrence rate C (FIG. 15). These values of d coincide with the range of d which gives a high device yield. A range d=0.5 μm-10 μm gives a high device yield Q, low crack occurrence rate C and small bow U. A further desirable range is d=1 μm-3 μm.

A rise of the ratio and the size of diamond granules increases the edge process-induced degradation layer thickness d. Larger thicknesses d of the edge process-induced degradation layers are induced by electrodeposition, metal-bonding, resin-bonding and rubber-bonding whetstones in order. Soft rubber bonding whetstones are pertinent to induce d=0.5 μm-10 μm of the edge process-induced degradation layer thicknesses. Soft bubbled resin bonding-whetstones are also available for making d=0.5 μm-10 μm (Sample 6). Favorable mesh numbers of diamond granules are #3000-#600. Decrement of diamond ratio and increment of oxide ratio are effective in further reducing d. Oxide granules produce soft layers on surfaces of nitride by chemical reaction. Oxide granules enables chamfering to alleviate a load and to suppress generation of process-induced degradation layers. An edge roughness range Ra0.07 μm-Ra5 μm corresponds to a thickness range d=0.5 μm-10 μm. A narrower edge roughness range Ra0.15 μm-Ra1 μm corresponds to another thickness range d=1 μm-3 μm.

In FIG. 14, 10 μm or more thicknesses d of edge process-induced degradation layers raise bow over 12 μm. 0.3 μm or less thicknesses d of edge process-induced degradation layers enhance bow over 20 μm. The fact means that the thicknesses d=0.5 μm-10 μm can suppress bow under 12 μm. The thicknesses d=1 μm-3 μm can suppress bow within 7 μm-5 μm.

As shown in FIG. 15, 10 μm or more thicknesses d of edge process-induced degradation layers raise crack occurrence rates over 5%. 0.3 μm or less thicknesses d of edge process-induced degradation layers push up crack occurrence rates over 9%. 5%-0% of crack occurrence rates require d=0.5 μm-10 μm. 2%-0% of crack occurrence rates are obtained by d=1 μm-3 μm.

In FIG. 16, 10 μm or more thicknesses d of edge process-induced degradation layers lower device production yields Q below 70%. 0.3 nm or less thicknesses d of edge process-induced degradation layers lower Q below 52%. A pertinent range d=0.5 μm-10 μm can realize 70% or more device production yields Q. A more favorable range d=1 μm-3 μm can raise device production yields Q over 82%.

Embodiment 3

Embodiment 3: Samples 12-18: Table 2: FIGS. 17, 18, 19, 20, 28, 29

Samples 12-18 fix diamond granule size to #1000 and rubber hardness to 50. Samples 12-18 examine edge oxygen concentrations, chipping and device production yields by chamfering wafers by varying oxides and oxide ratios. Preparation of wafers, order of processings and method of device production of Embodiment 3 are similar to Embodiment 2. Embodiment 3 examines how the edge oxygen concentration rules wafer production and device production. Table 2 shows the results of experiments. Edge oxygen concentration is represented by atomic percent (at %). Chipping means occurrence of a slit or break of edges during planar-processings (grinding and polishing). Device production yield Q is a ratio of the number of allowable devices to the number of the whole devices which are judged by producing 2 mm square LEDs on the wafer, packaging the LEDs, supplying the LEDs with 4 A current, measuring light power and examining the light power over or under 2 W.

TABLE 2

|  |  |  | Sample 12 | Sample 13 | Sample 14 | Sample 15 | Sample 16 | Sample 17 | Sample 18 |
|---|---|---|---|---|---|---|---|---|---|
| Edge Processing | Bonding | Kinds | Rubber | Rubber | Rubber | Rubber | Rubber | Rubber | Rubber |
|  |  | Materials | CR | CR | CR | CR | CR | CR | CR |
|  |  | Rubber Hardness | 50 | 50 | 50 | 50 | 50 | 50 | 50 |
|  |  | Porosity (vol %) | 0% | 0% | 0% | 0% | 0% | 0% | 0% |
|  | Whetgranule | Diamond (Mesh No.) | 1000 | 1000 | 1000 | 1000 | 1000 | 1000 | 1000 |
|  |  | Oxide | — | $Fe_2O_3$ | $Cr_2O_3$ | $Fe_2O_3$ | $Cr_2O_3$ | $MnO_2$ | $Fe_2O_3$ |
|  |  | Oxide Amount (wt %) | — | 20 | 20 | 30 | 30 | 40 | 60 |
| Wafer Properties |  | Edge process-induced degradation layer thickness d (μm) | 5 | 2.5 | 2 | 2 | 1.5 | 1.5 | 1 |
|  |  | Edge roughness Ra (μm) | 1.5 | 0.5 | 0.5 | 0.5 | 0.5 | 0.5 | 0.5 |
|  |  | Oxygen concentration O (at %) | 1 | 3 | 5 | 10 | 15 | 20 | 25 |
|  |  | Chipping occurrence rate p (%) | 25 | 5 | 3 | 2 | 3 | 5 | 15 |
| Device |  | Device production yield Q (%) | 73 | 78 | 85 | 84 | 85 | 80 | 61 |

In chamfering, thicknesses d=0.5 μm-10 μm of edge process-induced degradation layers are effective in suppressing crack occurrence rates C and enhancing device production yields Q. Thicknesses d=1 μm-3 μm of edge process-induced degradation layers are more favorable. Samples 1-11 teach us that elastic rubbers are optimum bonding materials and soft bubbled resins are available. Samples 1-11 teach us suitable bonding materials. The problem of what are the appropriate stationary granules is not fully clarified. A whetstone of 100% diamond granules is possible (Samples 3-7). Another whetstone of a mixture of diamond and oxide granules is allowable (Sample 2). A middle mesh number between Samples 5 and 6 is #1000. Embodiment 3 chamfers wafers by whetstones having a mixture of #1000 diamond granules and oxide granules. Chamfering is followed by planar-processings, i.e., top-grinding, top-polishing and top-etching. Embodiment 3 examines chipping occurrence rates and final device yields. "Crack" means an edge split or break occurring during chamfer. "Chipping" means an edge split or break occurring in the following planar-processings. Oxide granules can alleviate a load acting on edge in chamfering by forming soft layers on surfaces of nitride with chemical reactions. In addition to the advantage, the edge oxidized layers have a function of suppressing chipping in the planar-processings. Chamfering by a whetstone with oxide granules gives oxides to edges of wafers. Existence of oxides gifts wafers with toughness. The oxide-endowed toughness decreases chipping occurrence rates in the planar-processings.

Figure 17:
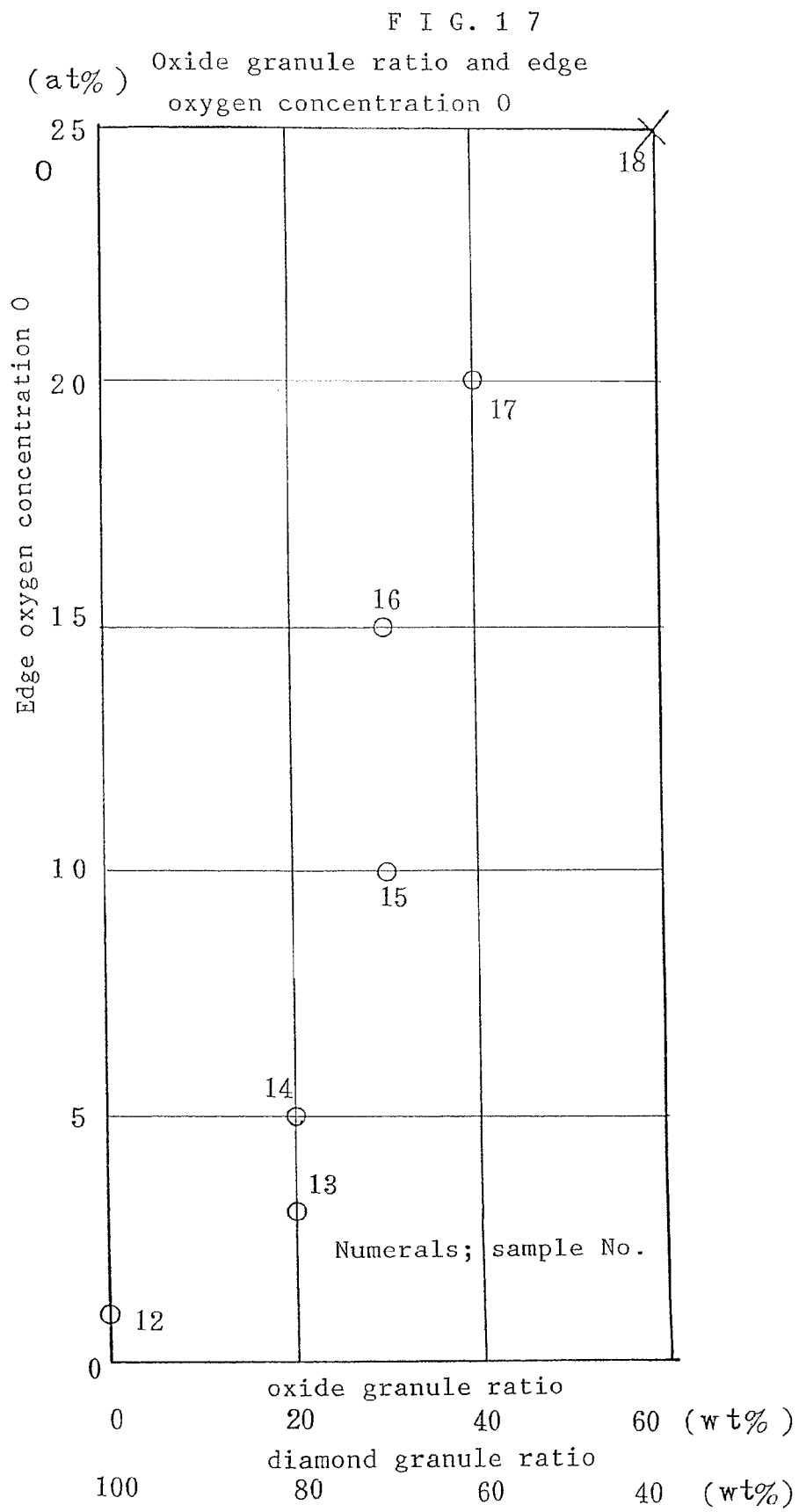
FIG. 17 is a graph showing a relation between the oxide whetgranule ratio (wt %) and the wafer edge oxygen concentration (at %) of Samples 12 to 18. The oxide whetgranule ratio+diamond whetgranule ratio=100%.
Figure 18:
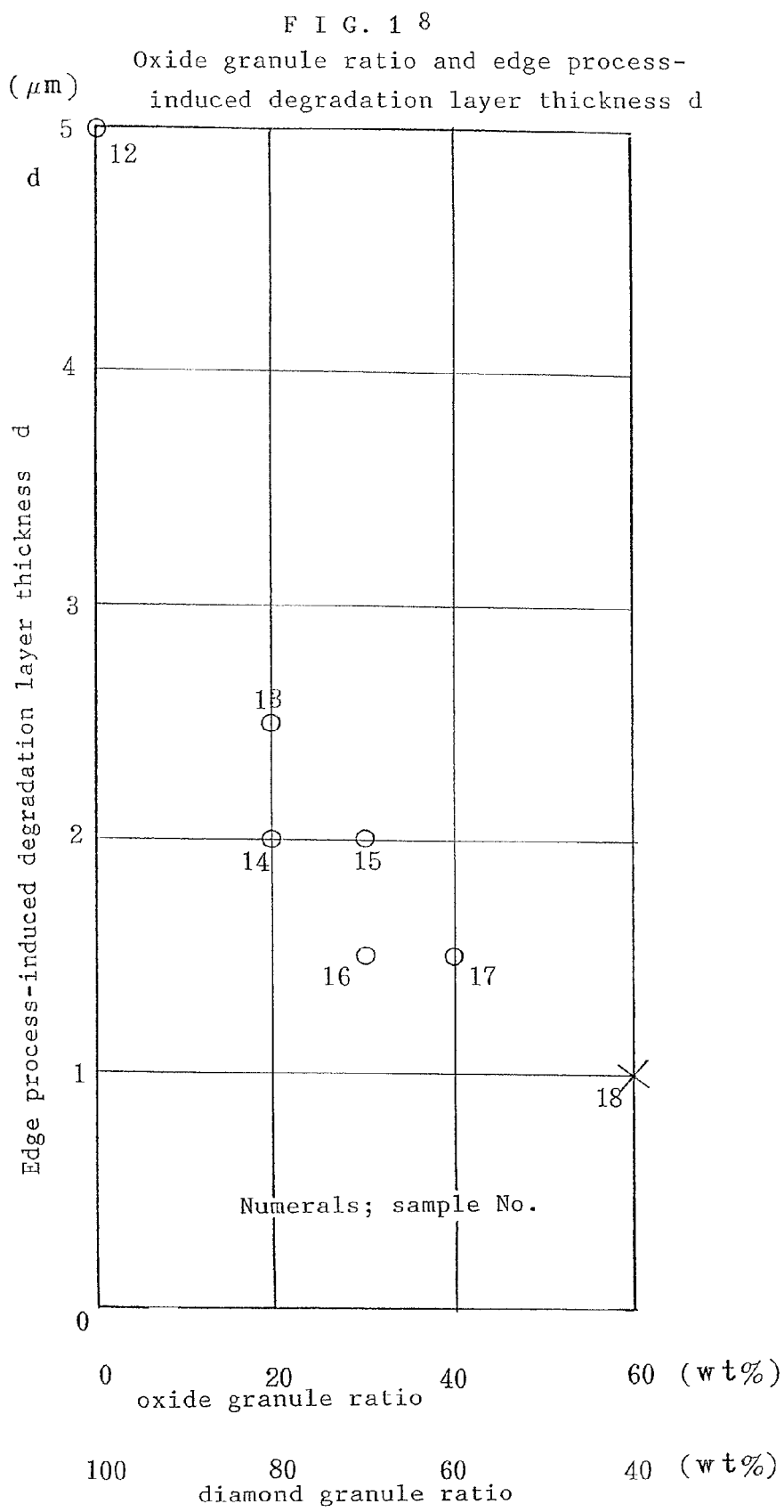
FIG. 18 is a graph showing a relation between the oxide whetgranule ratio (wt %) and the edge process-induced degradation layer thickness d (μm) of Samples 12 to 18.
Figure 19:
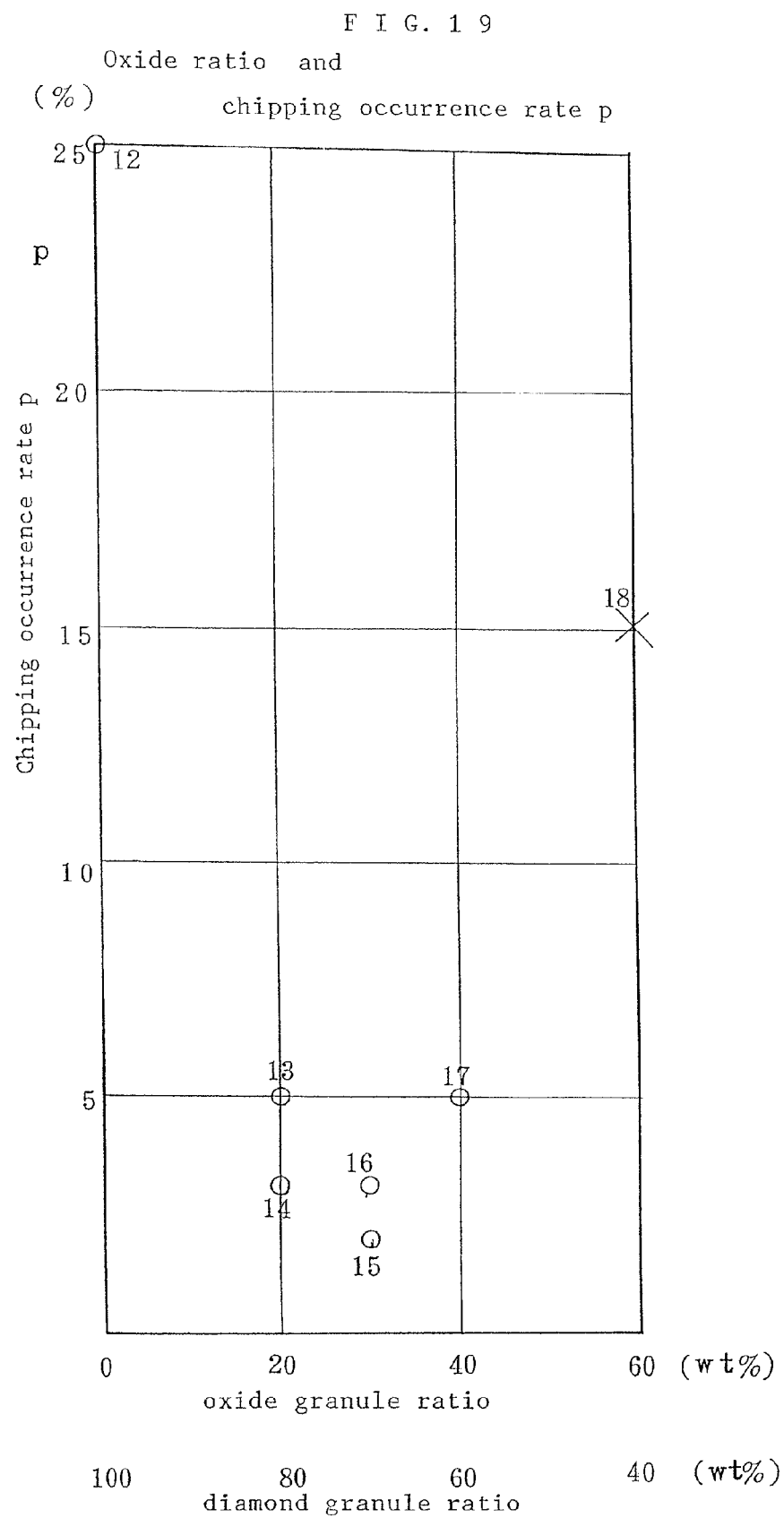
FIG. 19 is a graph showing a relation between the oxide whetgranule ratio (wt %) and the chipping occurrence ratio p (%) of Samples 12 to 18.
Figure 20:
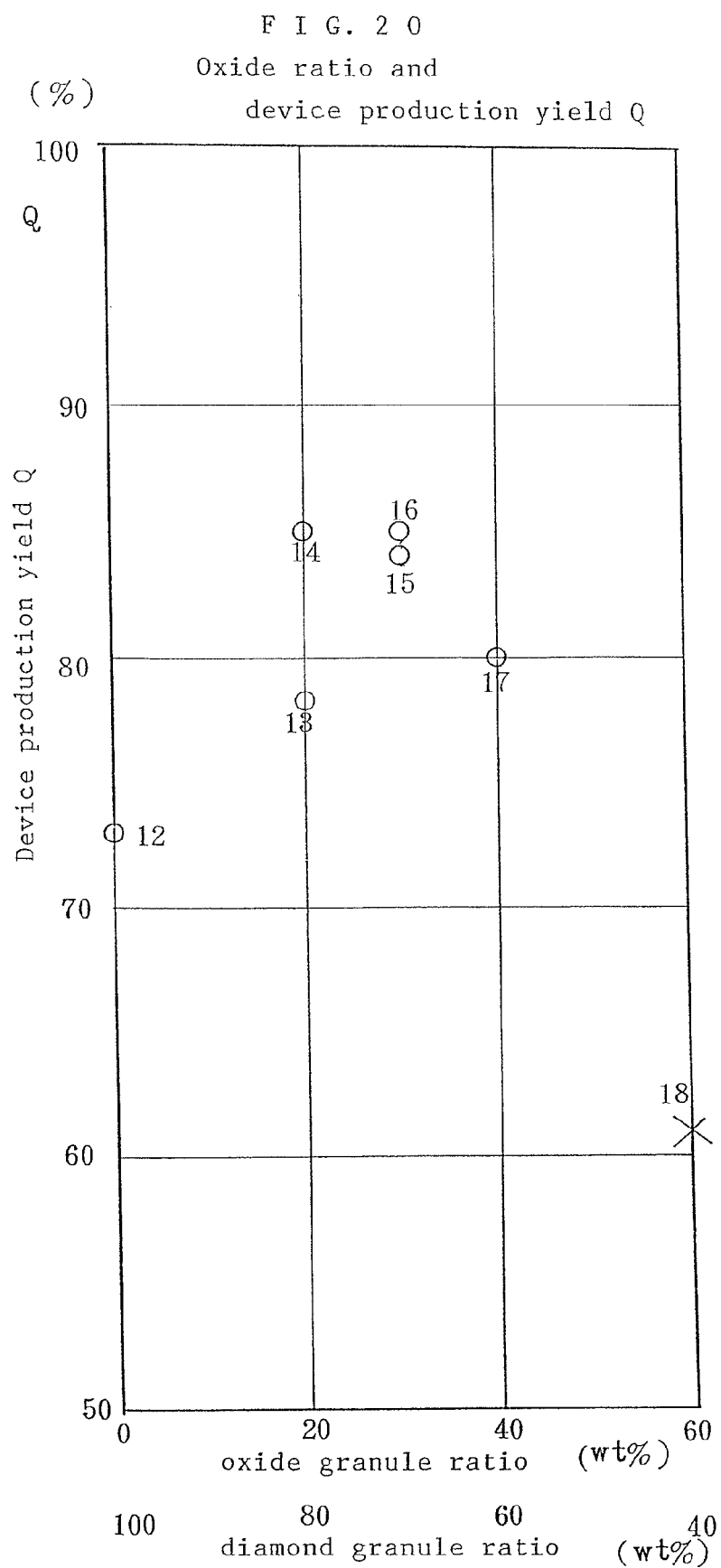
FIG. 20 is a graph showing a relation between the oxide whetgranule ratio (wt %) and the device production yield Q (%) of Samples 12 to 18.

To confirm the function of oxides, Embodiment 3 chamfers wafers by whetstones having a variety of kinds and amounts of oxide granules. For separating the effect of oxides, the bonding material is fixed to chloroprene rubber (CR). The hardness is fixed to 50. The size of diamond granules is fixed to #1000. Variables are kinds and amounts of oxides. FIG. 17 shows a relation between the ratio of diamond granules (100 wt %-40 wt %) and oxide granules (0 wt %-60 wt %) and the postchamfer edge oxygen concentration in Samples 12-18. FIG. 18 denotes a relation between the ratio of diamond granules (100 wt %-40 wt %) and oxide granules (0 wt %-60 wt %) and the thickness d (μm) of the postchamfer edge process-induced degradation layers in Samples 12-18. FIG. 19 shows a graph denoting a relation between the ratio of diamond granules (100 wt %-40 wt %) and oxide granules (0 wt %-60 wt %) and the chipping occurrence rate p (%) in postchamfered planar-processings in Samples 12-18. FIG. 20 is a graph showing a relation between the ratio of diamond (100 wt %-40 wt %) and oxide (0 wt %-60 wt %) granules and the device production yield Q (%) in Samples 12-18. FIG. 28 is a graph showing a relation between the edge oxygen concentration (at %) and the chipping occurrence rate p (%) in postchamfered planar-processings in Samples 12-18. FIG. 29 is a graph showing a relation between the edge oxygen concentration (at %) and the device production yield Q (%).

[Sample 12 (No oxide granules; rubber whetstones; d=5 μm; p=25%; Q=73%)]

After bottom grinding (A) and bottom etching (B), 5 inch (127 mm) diameter GaN circular wafers of a 850 μm thickness are chamfered by a chloroprene rubber (CR) bonding whetstone (C). The porosity is 0%. Rubber hardness is 50. Stationary whetgranules are 100% diamond granules of #1000 (average diameter 15 μm). The whetstone includes no oxide granules. The thickness d of the edge process-induced degradation layer originating from the chamfering is d=5 μm. Edge roughness of the postchamfered wafers is Ra1.5 μm. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=1 at %. The edge oxygen does not derive from whetstone granules but originates from oxidization in etching, planar-processings, washing or natural oxidization in the atmosphere. The chipping occurrence rate is p=25%. 25% of the wafers are out of use. The device production yield Q by producing 2 mm square LED devices on the wafer like the preceding samples is Q=73%. This is a high yield. Sample 12 is allowable. However such a high chipping rate of p=25% is not desirable. Contrivance is required for lowering the chipping rate.

[Sample 13 (20 wt % $Fe_2O_3$ granules; rubber whetstones; d=2.5 μm; p=5%; Q=78%)]

After bottom grinding (A) and bottom etching (B), 5 inch (127 mm) diameter GaN circular wafers of a 850 μm thickness are chamfered (C) by a rubber whetstone bonded with 80 wt % diamond granules of #1000 (average diameter 15 μm) and 20 wt % $Fe_2O_3$ granules by chloroprene rubber (CR). The porosity is 0%. Rubber hardness is 50. The thickness d of the edge process-induced degradation layer originating from the chamfering is d=2.5 μm. Edge roughness of the postchamfered wafers is Ra0.5 μm. The thickness d is reduced to half of Sample 12. Decrement of diamond granules alleviates the mechanical function of grinding, which results in reducing d. The edge roughness is smaller than Sample 12. Oxide granules with a chemical function smooth the edge. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=3 at %, which is three times as much as Sample 12 (O=1 at %). The excess edge oxygen derives from the oxide whetstone granules. The chipping occurrence rate is p=5%. The chipping occurrence rate is reduced to one fifth of Sample 12 (p=25%). Existence of oxides at the edge lessens the chipping occurrence rate p. The chemical function of oxide granules decreases inner damage during chamfering and suppresses wafers from chipping. Other samples with remaining oxygen at edges have similar advantages of reducing inner stress and prohibiting wafers from chipping. The device production yield Q by producing 2 mm square LED devices on the wafer like the preceding samples is Q=78%. This is a high yield. Sample 13 with a low chipping occurrence rate and a high device yield is approved.

[Sample 14 (20 wt % $Cr_2O_3$ granules; rubber whetstones; d=2 µm; p=3%; Q=85%)]

After bottom grinding (A) and bottom etching (B), 5 inch (127 mm) diameter GaN circular wafers of a 850 µm thickness are chamfered (C) by a rubber whetstone bonded with 80 wt % diamond granules of #1000 (average diameter 15 µm) and 20 wt % $Cr_2O_3$ granules by chloroprene rubber (CR). The porosity is 0%. Rubber hardness is 50. What is different from Sample 13 is the use of stationary granules of $Cr_2O_3$ instead of $Fe_2O_3$. The thickness d of the edge process-induced degradation layer originating from the chamfering is d=2 µm. Edge roughness of the postchamfered wafers is Ra0.5 µm. The thickness d and edge roughness Ra are reduced in comparison with Sample 12. Decrement of diamond granules alleviates the mechanical function of grinding, which results in reducing d and Ra. Oxide granules with a chemical function smooth the edge. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=5 at %, which is five times as much as Sample 12 and 1.7 times as much as Sample 13. Since chamfering uses oxide granule whetstones, the edge oxygen concentration is high. The excess edge oxygen derives from the oxide whetstone granules. Comparison of Samples 14 and 13 teaches us that $Cr_2O_3$ has an oxidization effect stronger than $Fe_2O_3$. The chipping occurrence rate is p=3%. The chipping occurrence rate is reduced to one eighth of Sample 12 (p=25%). Existence of oxides at the edge lessens the chipping occurrence rate p. Low chipping rates are an advantage of the use of oxide granules. A high edge oxygen concentration more than Sample 13 lowers the chipping occurrence rate of Sample 14. The device production yield Q by producing 2 mm square LED devices on the wafer like the preceding samples is Q=85%. This is a very high yield. Sample 14 endowed with a low chipping occurrence rate and a high device yield is most promising.

[Sample 15 (30 wt % $Fe_2O_3$ granules; rubber whetstones; d=2 µm; p=2%; Q=84%)]

After bottom grinding (A) and bottom etching (B), 5 inch (127 mm) diameter GaN circular wafers of a 850 µm thickness are chamfered (C) by a rubber whetstone bonded with 70 wt % diamond granules of #1000 (average diameter 15 µm) and 30 wt % $Fe_2O_3$ granules by chloroprene rubber (CR). The porosity is 0%. Rubber hardness is 50. The thickness d of the edge process-induced degradation layer originating from the chamfering is d=2 µm. Edge roughness of the postchamfered wafers is Ra0.5 µm. The thickness d (2 µm) and edge roughness Ra (0.5 nm) are similar to Sample 14. Sample 15 uses $Fe_2O_3$ granules like Sample 13. The oxide ($Fe_2O_3$) ratio of Sample 15 is 30% which is larger than Sample 13 by 10%. A smaller ratio of diamond granules of Sample 15 weakens the mechanical function, decreases the thickness d and lowers the edge roughness Ra. Oxide granules with a chemical function smooth the edge. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=10 at %. Sample 15 has an edge oxygen concentration higher than Sample 13 which makes use of $Fe_2O_3$. This is because Sample 15's whetstone has a $Fe_2O_3$ ratio higher than Sample 13. The chipping occurrence rate is p=2%. The chipping occurrence rate is one twelfth of Sample 12 which dispenses with oxide granules. The chipping occurrence rate p of Sample 15 is lower than Samples 13 and 14 which make use of oxide granules. The lowest chipping occurrence rate of Sample 15 derives from the high edge oxygen concentration. Samples 12-15 are evidences that what prevents wafers from chipping is oxides included in edge of wafers. Suppression of chipping is an advantage of making use of oxide granules in whetstones. The device production yield Q by producing 2 mm square LED devices on the wafer like the preceding samples is Q=84%. This is a very high yield. Sample 15 endowed with a low chipping occurrence rate and a high device yield is most desirable.

[Sample 16 (30 wt % $Cr_2O_3$ granules; rubber whetstones; d=1.5 µm; p=3%; Q=85%)]

After bottom grinding (A) and bottom etching (B), 5 inch (127 mm) diameter GaN circular wafers of a 850 µm thickness are chamfered (C) by a rubber whetstone bonded with 70 wt % diamond granules of #1000 (average diameter 15 µm) and 30 wt % $Cr_2O_3$ granules by chloroprene rubber (CR). The porosity is 0%. Rubber hardness is 50. The thickness d of the edge process-induced degradation layer originating from the chamfering is d=1.5 µm. Edge roughness of the postchamfered wafers is Ra0.5 µm. Sample 16 uses $Cr_2O_3$ granules like Sample 14. The oxide ($Cr_2O_3$) ratio of Sample 16 is 30% which is larger than Sample 14 by 10%. A smaller ratio of diamond granules of Sample 16 weakens the mechanical function, decreases the thickness d and lowers the edge roughness Ra. Sample 16 shows a low edge roughness similar to Samples 14 and 15. The edge roughness depends upon the diamond/oxide ratio but is irrelevant to the kind of oxides. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=15 at %. Sample 16 (with 30% $Cr_2O_3$) has an edge oxygen concentration higher than Sample 15 (with 30% $Fe_2O_3$). This suggests that $Cr_2O_3$ has oxidization effect stronger than $Fe_2O_3$. The chipping occurrence rate is p=3%. The device production yield Q by producing 2 mm square LED devices on the wafer like the preceding samples is Q=85%. This is a very high yield. Samples 14 and 16 have the same chipping occurrence rate p and device yield Q, although the $Cr_2O_3$ ratios of 20 wt % and 30 wt % are different. This fact means that an optimum range of $Cr_2O_3$ rates is 20 wt % to 30 wt %.

[Sample 17 (40 wt % $MnO_2$ granules; rubber whetstones; d=1.5 µm; p=5%; Q=80%)]

After bottom grinding (A) and bottom etching (B), 5 inch (127 mm) diameter GaN circular wafers of a 850 µm thickness are chamfered (C) by a rubber whetstone bonded with 60 wt % diamond granules of #1000 (average diameter 15 µm) and 40 wt % $MnO_2$ granules by chloroprene rubber (CR). The porosity is 0%. Rubber hardness is 50. The thickness d of the edge process-induced degradation layer originating from the chamfering is d=1.5 µm. Edge roughness of the postchamfered wafers is Ra0.5 µm. Sample 17 uses $MnO_2$ (manganese dioxide) granules unlike Samples 13-16. The diamond ratio is smaller than Sample 12. The smaller diamond ratio of Sample 17 weakens the mechanical function, decreases the thickness d and lowers the edge roughness Ra. Sample 17 shows a low edge roughness (Ra0.5 µm) similar to Samples 13-16. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=20 at %. Sample 17 which uses a whetstone provided with a 40% high ratio of $MnO_2$ has a high edge oxygen concentration. The chipping occurrence rate is p=5%. The device production yield Q by producing 2 mm square LED devices on the wafer like the preceding samples is Q=80%. This is a high yield. Samples 17 is allowable, since the chipping occurrence rate is low and the device yield is high. Samples 12-17 teach us that $MnO_2$ granules are also useful to the whetstone for chamfering.

[Sample 18 (60 wt % $Fe_2O_3$ granules; rubber whetstones; d=1 µm; p=15%; Q=61%)]

After bottom grinding (A) and bottom etching (B), 5 inch (127 mm) diameter GaN circular wafers of a 850 µm thickness are chamfered (C) by a rubber whetstone bonded with 40 wt % diamond granules of #1000 (average diameter 14 µm) and 60 wt % $Fe_2O_3$ granules by chloroprene rubber (CR). The porosity is 0%. Rubber hardness is 50. The thickness d of the edge process-induced degradation layer originating from the chamfering is d=1 µm. Edge roughness of the postchamfered wafers is Ra0.5 µm. Sample 17 uses $Fe_2O_3$ granules like Samples 13 and 15. In Sample 18, the oxide ratio is larger and the diamond ratio is smaller than Samples 13 and 15. The smaller diamond ratio of Sample 18 weakens the mechanical function and decreases the thickness d. The postchamfered GaN wafers are further planar-processed by top surface grinding (D) and top surface polishing (E). The top surface becomes mirror flat. The top process-induced degradation layer is eliminated by top surface etching (F). Edge oxygen concentration is O=25 at %. Sample 18 has a higher oxygen concentration than Samples 13 and 15. This is because the $Fe_2O_3$ ratio is higher. The chipping occurrence rate is p=15%. The device production yield Q by producing 2 mm square LED devices on the wafer like the preceding samples is Q=61%. This is not a high yield. Samples 18 is rejected due to the high chipping occurrence rate (p=15%) and low device yield (61%). Samples 12-18 teach us that 5% or less chipping occurrence rates (p≦5%) and 70% or more device yields (Q≧70%) require 3 at %-20 at % edge oxygen concentrations (3 at %≦O≦20 at %). 5% or less chipping rates (p≦55%) and 80% or more device yields (Q≧80%) require 5 at %-20 at % edge oxygen concentrations (O=5 at %-20 at %). Relations between the resultant edge oxygen concentration and the oxide granule rate vary according to the kinds of oxides. 20 wt %-40 wt % of oxide granules is effective in suppressing wafers from chipping.

FIG. 17 indicates that the more the rate of oxide granules bonded on the whetstones rises, the higher the edge oxygen concentration increases. Comparison between Samples 13 and 14 and comparison between Samples 15 and 16 teach us that $Cr_2O_3$ granules give wafer edges more residual oxygen than $Fe_2O_3$ even if $Cr_2O_3$ and $Fe_2O_3$ ratios are equal. Chromium oxide is more reactive than ferric oxide. Chromium oxide is harder than iron oxide. Chromium oxide has stronger influence on chamfering than ferric oxide.

FIG. 18 shows that the smaller the oxide ratio decreases (the larger the diamond rate rises), the thicker the edge process-induced degradation layer grows. When the diamond ratio is large, a strong mechanical function of diamond increases the edge process-induced degradation layer thickness d from FIG. 18. It turns out that oxides alleviate the diamond mechanical action.

FIG. 19 indicates that 20 wt %-40 wt % oxide rates can suppress chipping occurrence rates to 5% or less. 100% diamond granules (Sample 12) induce high rates of chipping. FIG. 28 teaches us that 3 at %-20 at % edge oxygen concentrations can suppress chipping occurrence rates below 5%. Sample 12, which chamfers wafers with 100% diamond whetstones and leaves oxygen at edges at a low rate below 1 at %, is suffering from high frequency of chipping.

FIG. 20 shows that 20 wt %-40 wt % oxide rates can sustain device production yields above 78%. FIG. 29 teaches us that 3 at %-20 at % edge oxygen concentrations can raise device production yields up to 78% or more.

Embodiment 4

Embodiment 4: Samples 19-26; Table 3; FIGS. 21, 22, 23, 30, 31

Embodiments 1-3 clarify that GaN wafer chamfering requires d=0.5 µm-10 µm, in particular, d=1 µm-3 µm thicknesses of edge process-induced degradation layers for the sake of suppressing cracks and raising device yields, and rubber bonding whetstones are favorable. 3 at %-20 at % edge oxygen concentrations advantageously lower chipping frequencies and enhance device production yields. Mixing of oxide granules into whetstone stationary granules is effective in lifting edge oxygen concentrations.

TABLE 3

| | | | Sample 19 | Sample 20 | Sample 21 | Sample 22 | Sample 23 | Sample 24 | Sample 25 | Sample 26 |
| --- | --- | --- | --- | --- | --- | --- | --- | --- | --- | --- |
| Edge Processing | Bonding | Kinds | Rubber | Rubber | Rubber | Rubber | Rubber | Rubber | Metal | Electro-Deposition |
| | | Material | CR | CR | CR | CR | CR | CR | Fe | Ni |
| | | Rubber Hardness | 55 | 55 | 55 | 55 | 55 | 55 | — | — |
| | | Porosity (vol %) | 0% | 0% | 0% | 0% | 0% | 0% | 0% | 0% |
| | Whetgranule | Diamond (Mesh No.) | 600 | 600 | 600 | 600 | 600 | 600 | 1500 | 1500 |
| | | Oxide | — | $Fe_2O_3$ | $Cr_2O_3$ | ZnO | CuO | CuO | — | — |
| | | Oxide Amount (wt %) | — | 20 | 20 | 20 | 20 | 50 | — | — |
| Wafer Properties | | Edge process-induced degradation layer thickness d (µm) | 9 | 7 | 7 | 7 | 7 | 5 | 12 | 14 |
| | | Edge roughness Ra(µm) | 4 | 2 | 2 | 2 | 2 | 2 | 4 | 4 |
| | | Metal concentration m (at %) | 0 | 0.1 | 0.2 | 3 | 5 | 8 | 10 | 12 |
| | | Chipping occurrence rate p (%) | 22 | 8 | 4 | 7 | 15 | 15 | 25 | 30 |
| Device | | Device production yield Q (%) | 90 | 92 | 90 | 88 | 85 | 65 | 35 | 22 |

Samples 19-26 investigate how much resultant metal impurities can remain at wafer edges by chamfering wafers with whetstones having a variety of ratios and kinds of oxide granules. In Table 3, metal amount (at %) means the metal concentration at edges after chamfering sample wafers.

Figure 21:
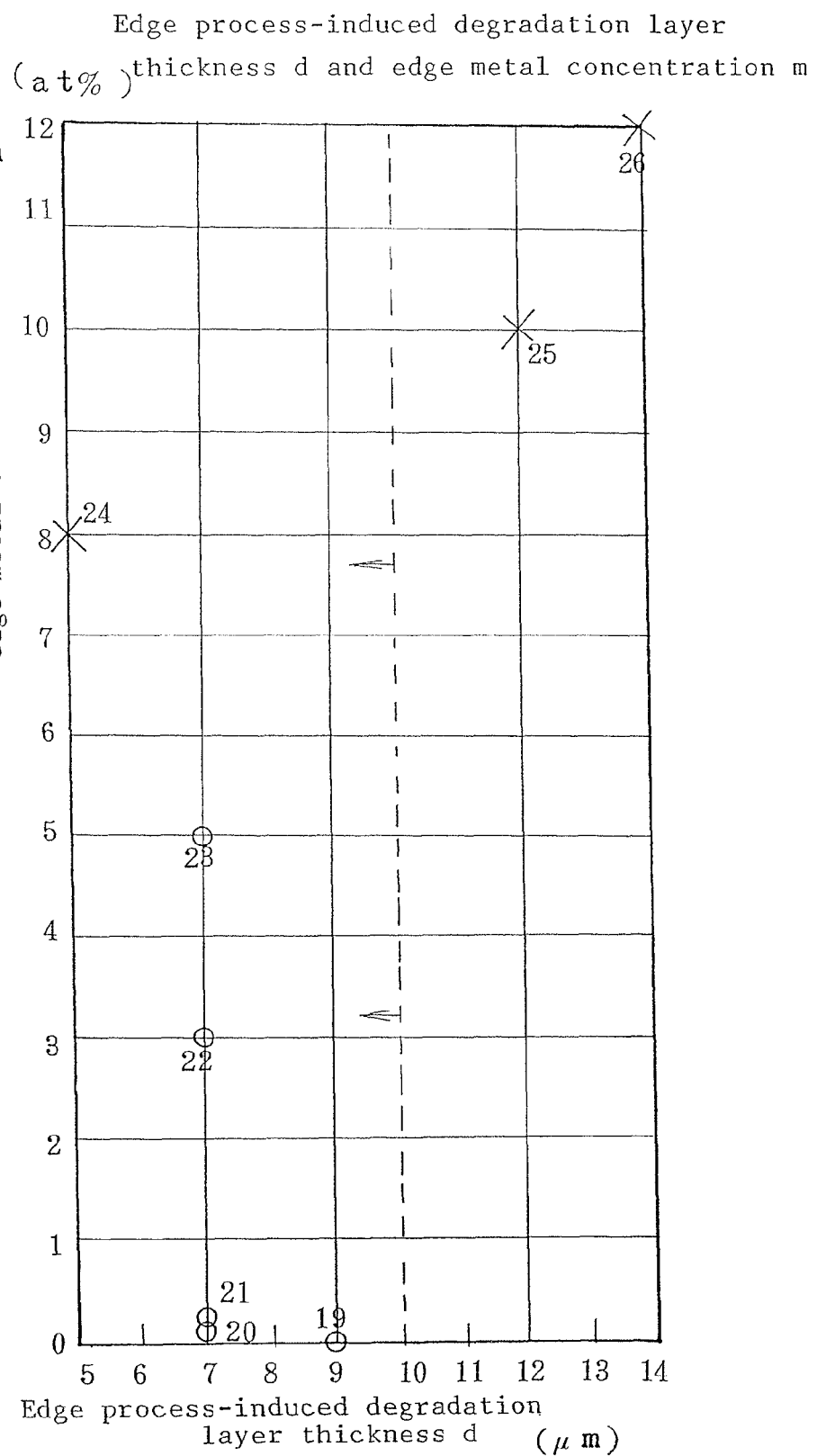
FIG. 21 is a graph showing a relation between the edge process-induced degradation layer thickness d (μm) and the edge metal concentration m (at %) of Samples 19 to 26.

FIG. 21 shows a relation between edge process-induced degradation layer thicknesses d (μm) and edge metal concentrations (at %) in Samples 19-26. A vertical dotted line d=10 μm shows an upper critical thickness of the present invention.

Figure 22:
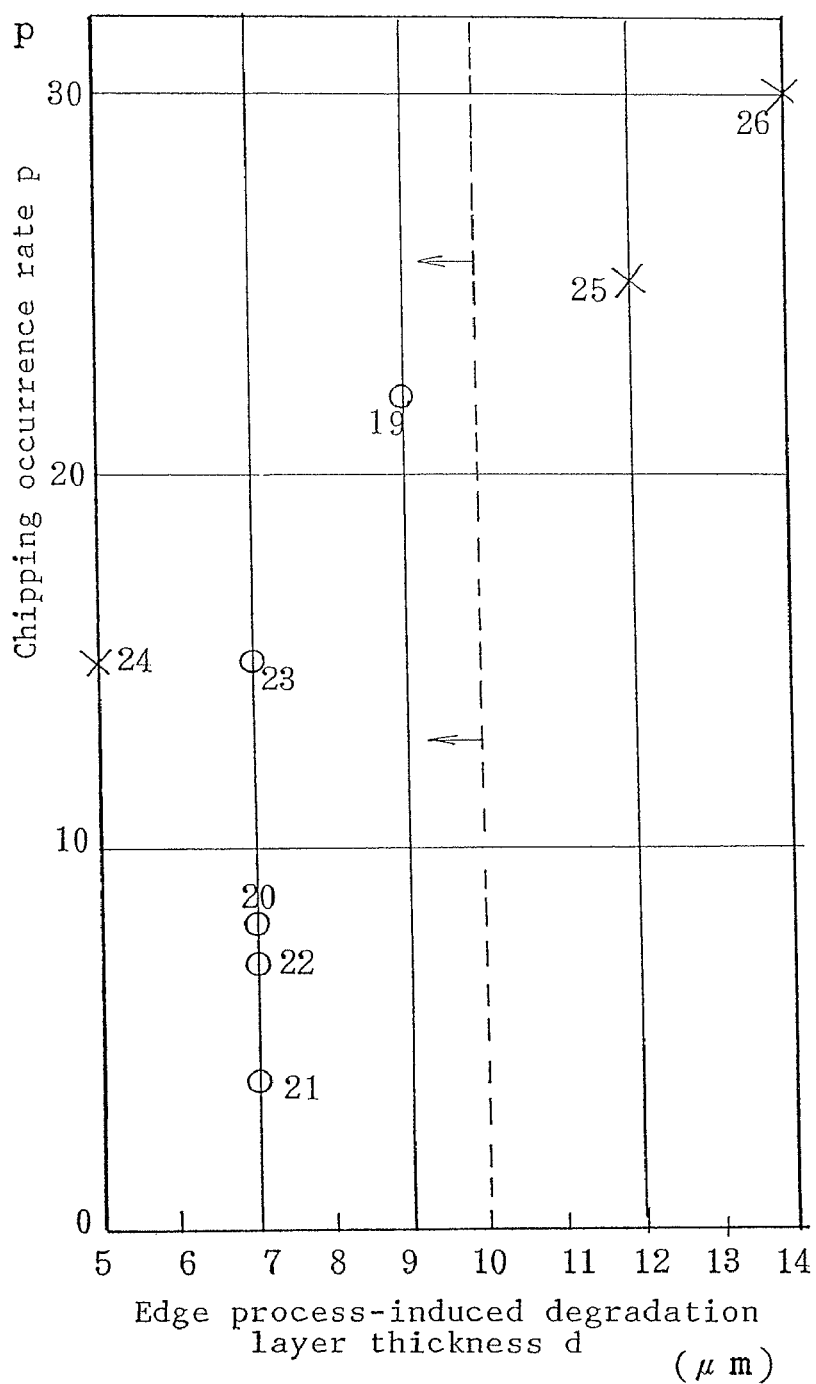
FIG. 22 is a graph showing a relation between the edge process-induced degradation layer thickness d (μm) and the chipping occurrence rate p (%) of Samples 19 to 26.

FIG. 22 shows a relation between process-induced degradation layer thicknesses d (vim) and chipping occurrence rates p (%) in Samples 19-26. A vertical dotted line d=10 μm shows an upper critical thickness of the present invention.

Figure 23:
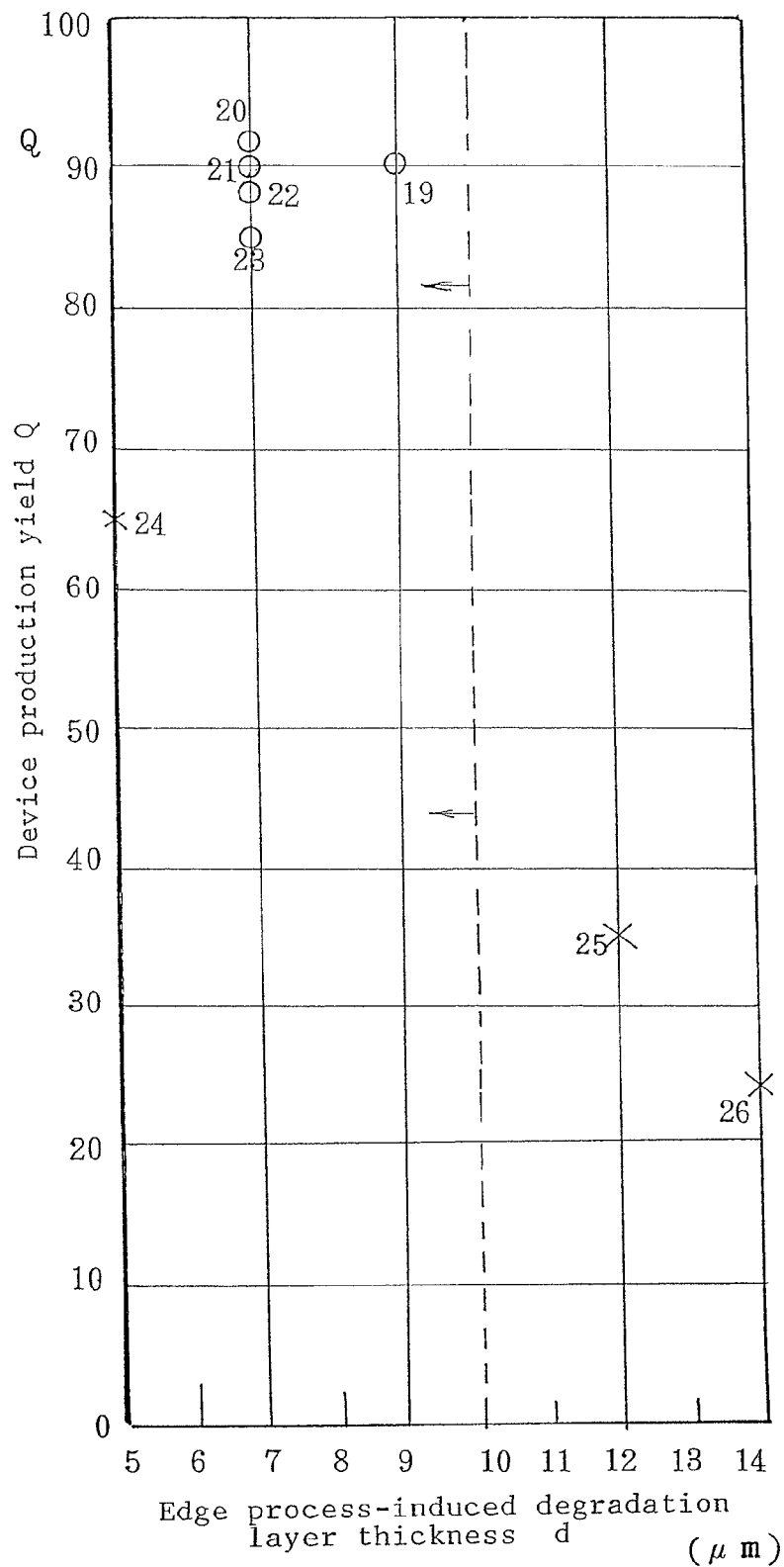
FIG. 23 is a graph showing a relation between the edge process-induced degradation layer thickness d (μm) and the device production yield Q (%) of Samples 19 to 26.

FIG. 23 shows a relation between process-induced degradation layer thicknesses d (vim) and device production yields Q (%) in Samples 19-26. A vertical dotted line d=10 μm shows an upper critical thickness of the present invention. FIG. 30 shows a relation between edge metal concentrations m (at %) and chipping occurrence rates p (%) in Samples 19-26. FIG. 31 shows a relation between edge metal concentrations m (at %) and device production yields Q (%) in Samples 19-26.

[Sample 19 (No oxide; m=at0%; d=9 μm; p=22%; Q=90%)]

After bottom grinding (A) and bottom etching (B), 5 inch (127 mm) diameter GaN circular wafers of a 850 μm thickness are chamfered (C) by a rubber whetstone bonded with 100 wt % diamond granules of #600 (average diameter 25 μm) by chloroprene rubber (CR). The porosity is 0%. Rubber hardness is 55. The thickness d of the edge process-induced degradation layer originating from the chamfering is d=9 μm. Edge roughness of the postchamfered wafers is Ra4 μm. The postchamfered GaN wafers are further planar-processed by top surface grinding (D) and top surface polishing (E). The top surface becomes mirror flat. The top process-induced degradation layer is eliminated by top surface etching (F). Edge metal concentration is m=0 at %. Sample 19 uses whetstones without metal oxide. Metal impurities do not invade edges of Sample 19. The chipping occurrence rate is p=22%. 22% wafers are wasted. The device production yield Q by producing 2 mm square LED devices on the wafer like the preceding samples is Q=90%. This is a high yield. Despite the high yield, Samples 19 is rejected due to the high chipping occurrence rate (p=22%) in the preceding planar-processings. The large diamond granules enhance mechanical shocks to wafers and cause inner damage in wafers.

[Sample 20 (20 wt % $Fe_2O_3$; m=0.1 at %; d=7 μm; Q=92%)]

After bottom grinding (A) and bottom etching (B), 5 inch (127 mm) diameter GaN circular wafers of a 850 μm thickness are chamfered (C) by a rubber whetstone bonded with 20 wt % $Fe_2O_3$ granules and 80 wt % diamond granules of #600 (average diameter 25 μm) by chloroprene rubber (CR). The porosity is 0%. Rubber hardness is 55. The thickness d of the edge process-induced degradation layer originating from the chamfering is d=7 μm. Edge roughness of the postchamfered wafers is Ra2 μm. The postchamfered GaN wafers are further planar-processed by top surface grinding (D) and top surface polishing (E). The top surface becomes mirror flat. The top process-induced degradation layer is eliminated by top surface etching (F). Edge metal concentration is m=0.1 at %. Metal impurities invade edges from oxide granules of Sample 20. The chipping occurrence rate is p=8%. 8% is an allowable value for p. The device production yield Q by producing 2 mm square LED devices on the wafer like the preceding samples is Q=92%. Sample 20 is allowable due to the low chipping occurrence rate p and the high device yields Q. Since Sample 20 uses ferric oxide granules, iron atoms remain at 0.1 at % at edges. Metal atoms and oxygen atoms lower d and p. Metal atoms and oxygen atoms reinforce GaN crystal structures. While chamfering, metal and oxygen alleviate inner shocks and inner damage.

[Sample 21 (20 wt % $Cr_2O_3$; m=0.2 at %; d=7 μm; p=4%; Q=90%)]

After bottom grinding (A) and bottom etching (B), 5 inch (127 mm) diameter GaN circular wafers of a 850 μm thickness are chamfered (C) by a rubber whetstone bonded with 20 wt % $Cr_2O_3$ granules and 80 wt % diamond granules of #600 (average diameter 25 μm) by chloroprene rubber (CR). The porosity is 0%. Rubber hardness is 55. The thickness d of the edge process-induced degradation layer originating from the chamfering is d=7 μm. Edge roughness of the postchamfered wafers is Ra2 μm. The postchamfered GaN wafers are further planar-processed by top surface grinding (D) and top surface polishing (E). The top surface becomes mirror flat. The top process-induced degradation layer is eliminated by top surface etching (F). Edge metal concentration is m=0.2 at %. The chipping occurrence rate is p=4%. 4% is an allowable value for p. The device production yield Q by producing 2 mm square LED devices on the wafer like the preceding samples is Q=90%. Sample 21 is allowable due to the low chipping occurrence rate p and the high device yields Q. Since Sample 21 uses chromic oxide granules, chromium (Cr) atoms remain at 0.2 at % at edges. Metal atoms and oxygen atoms lower d and p. Metal atoms and oxygen atoms reinforce GaN crystal structures. While chamfering, metal and oxygen alleviate inner shocks and inner damage.

[Sample 22 (20 wt % ZnO; m=3 at %; d=7 μm; p=7%; Q=88%)]

After bottom grinding (A) and bottom etching (B), 5 inch (127 mm) diameter GaN circular wafers of a 850 μm thickness are chamfered (C) by a rubber whetstone bonded with 20 wt % ZnO granules and 80 wt % diamond granules of #600 (average diameter 25 μm) by chloroprene rubber (CR). The porosity is 0%. Rubber hardness is 55. The thickness d of the edge process-induced degradation layer originating from the chamfering is d=7 μm. Edge roughness of the postchamfered wafers is Ra2 μm. The postchamfered GaN wafers are further planar-processed by top surface grinding (D) and top surface polishing (E). The top surface becomes mirror flat. The top process-induced degradation layer is eliminated by top surface etching (F). Edge metal concentration is m=3 at %. The chipping occurrence rate is p=7%. 7% is an allowable value for p. The device production yield Q by producing 2 mm square LED devices on the wafer like the preceding samples is Q=88%. Sample 22 is allowable due to the low chipping occurrence rate p and the high device yield Q. Since Sample 22 uses zinc oxide granules, zinc (Zn) atoms remain at 3 at % at edges. Metal atoms and oxygen atoms lower d and p. Metal atoms and oxygen atoms reinforce GaN crystal structures. While chamfering, metal and oxygen alleviate inner shocks and inner damage.

[Sample 23 (20 wt % CuO; m=5 at %; d=7 μm; p=15%; Q=85%)]

After bottom grinding (A) and bottom etching (B), 5 inch (127 mm) diameter GaN circular wafers of a 850 μm thickness are chamfered (C) by a rubber whetstone bonded with 20 wt % CuO granules and 80 wt % diamond granules of #600 (average diameter 25 μm) by chloroprene rubber (CR). The porosity is 0%. Rubber hardness is 55. The thickness d of the edge process-induced degradation layer originating from the chamfering is d=7 μm. Edge roughness of the postchamfered wafers is Ra2 μm. The postchamfered GaN wafers are further planar-processed by top surface grinding (D) and top surface polishing (E). The top surface becomes mirror flat. The top process-induced degradation layer is eliminated by top surface etching (F). Edge metal concentration is m=7 at %. The chipping occurrence rate is p=15%. The device production yield Q by producing 2 mm square LED devices on the wafer like the preceding samples is Q=85%. Although p=15% is not a low chipping rate, Sample 22 is allowable due to the high device yield Q. Since Sample 23 uses copper oxide granules, copper (Cu) atoms remain at 5 at % at edges. Metal atoms and oxygen atoms lower d and p. Metal atoms and oxygen atoms reinforce GaN crystal structures. While chamfering, metal and oxygen alleviate inner shocks and inner damage. Samples 20-23 have common 20 wt % oxide rates. Amounts of residual metals at edges are different. Edge resultant metals are ranked in order of amounts, i.e., Cu (5 at %), Zn (3 at %), Cr (0.2 at %) and Fe(0.1 at %). Edge concentrations of residual metals depend upon chemical reactivity, granule hardness, and washing removability of oxide granules.

[Sample 24 (50 wt % CuO; m=8 at %; d=5 μm; p=15%; Q=65%)]

After bottom grinding (A) and bottom etching (B), 5 inch (127 mm) diameter GaN circular wafers of a 850 μm thickness are chamfered (C) by a rubber whetstone bonded with 50 wt % CuO granules and 50 wt % diamond granules of #600 (average diameter 25 μm) by chloroprene rubber (CR). The porosity is 0%. Rubber hardness is 55. The thickness d of the edge process-induced degradation layer originating from the chamfering is d=5 μm. Edge roughness of the postchamfered wafers is Ra2 μm. The postchamfered GaN wafers are further planar-processed by top surface grinding (D) and top surface polishing (E). The top surface becomes mirror flat. The top process-induced degradation layer is eliminated by top surface etching (F). Edge metal concentration is m=8 at %. The chipping occurrence rate is p=15%. The device production yield Q by producing 2 mm square LED devices on the wafer like the preceding samples is Q=65%. Since the chipping rate p is high and the device yield Q is low, Sample 23 is rejected. Since Sample 24 uses whetstones of 50 wt % CuO granules, large impurity atoms lower the device yield Q. An m=0.2 at % edge metal concentration minimizes the chipping occurrence rates p (Sample 21). An m=0.1 at % edge metal concentration maximizes the device production yield Q (Sample 20). Resultant metals are useful. But too large metal remains are not desirable. m=0.1 at %-5 at % is a preferable range of edge metal concentrations. More favorable range is m=0.1 at %-3 at %.

Samples 19-23 declare that oxide including whetstone chamfering can suppress chipping occurrence rates p lower than pure diamond whetstone chamfering.

Metal impurities residing at edges prevent wafers from chipping in Samples 20-23. Device production yields Q are irrelevant to the edge metal remains in Samples 19-23.

Sample 19, which uses 100% diamond granule whetstones, has d=9 μm. Samples 20-23, which commonly use 80 wt % diamond granule whetstones, have d=7 μm. The edge process-induced degradation layer thickness d is determined by the diamond granule rate in whetstones in view of Samples 19-24.

[Sample 25 (No oxide; metal bond (Fe); m=10 at %; d=12 μm; p=25%; Q=35%)]

After bottom grinding (A) and bottom etching (B), 5 inch (127 mm) diameter GaN circular wafers of a 850 μm thickness are chamfered (C) by a metal bonding whetstone bonded with 100 wt % diamond granules of #1500 (average diameter 8 μm) by iron (Fe). The thickness d of the edge process-induced degradation layer originating from the chamfering is d=12 μm. Edge roughness of the postchamfered wafers is Ra4 μm. What increases the thickness d and edge roughness Ra is the high rate of diamond and the bonding metal. The postchamfered GaN wafers are further planar-processed by top surface grinding (D) and top surface polishing (E). The top surface becomes mirror flat. The top process-induced degradation layer is eliminated by top surface etching (F). Edge metal concentration is m=10 at %. Sample 25 uses whetstones without metal oxide. But the bonding material is iron (Fe). Iron atoms invade edges. 10 at % iron (Fe) atoms remain at edges. The chipping occurrence rate is p=25%. The device production yield Q by producing 2 mm square LED devices on the wafer like the preceding samples is Q=35%. Sample 25 is rejected due to the high chipping occurrence rate p and low device yield Q. The high chipping occurrence rate and low device yield originate from the excess thick process-induced degradation layers and excess high metal concentration (10 at %). The reason is that Sample 25 uses metal-bonded whetstones. Sample 25 suggests incompetency of metal-bonded whetstones.

[Sample 26 (No oxide; electrodeposition (Ni); m=12 at %; d=14 μm; p=30%; Q=22%)]

After bottom grinding (A) and bottom etching (B), 5 inch (127 mm) diameter GaN circular wafers of a 850 μm thickness are chamfered (C) by an electrodeposition whetstone electrodeposited by nickel (Ni) with 100 wt % diamond granules of #1500 (average diameter 8 μm). The thickness d of the edge process-induced degradation layer originating from the chamfering is d=14 μm. Edge roughness of the postchamfered wafers is Ra4 μm. What raises the thickness d and edge roughness Ra is the high rate of diamond and the rigid nickel electrodeposition. The postchamfered GaN wafers are further planar-processed by top surface grinding (D) and top surface polishing (E). The top surface becomes mirror flat. The top process-induced degradation layer is eliminated by top surface etching (F). Edge metal concentration is m=12 at %. Sample 26 uses whetstones without metal oxide. But diamond granules are electrodeposited by nickel. A part of nickel is ground away. Nickel atoms invade edges of wafers. 12 at % nickel (Ni) atoms remain at edges. The chipping occurrence rate is p=30%. The device production yield Q by producing 2 mm square LED devices on the wafer like the preceding samples is Q=22%. Sample 26 is rejected due to the high chipping occurrence rate p and low device yield Q. The high chipping occurrence rate and low device yield result from the excess thick process-induced degradation layers (d=14 μm) and excess high metal concentration (12 at %). The reason is that Sample 26 uses electrodeposition whetstones. Sample 26 suggests incompetency of electrodeposition whetstones.

Samples 19-26 declare that 15% or less chipping occurrence rates p and 80% or more device yields Q require 10 μm or less thick edge process-induced degradation layers and 0.1 at %-5 at % edge metal concentrations m. A narrower range of m=0.1 at %-3 at % enables wafers to obtain 8% or less chipping occurrence rates p and 88% or more device yields Q.

Figure 24:
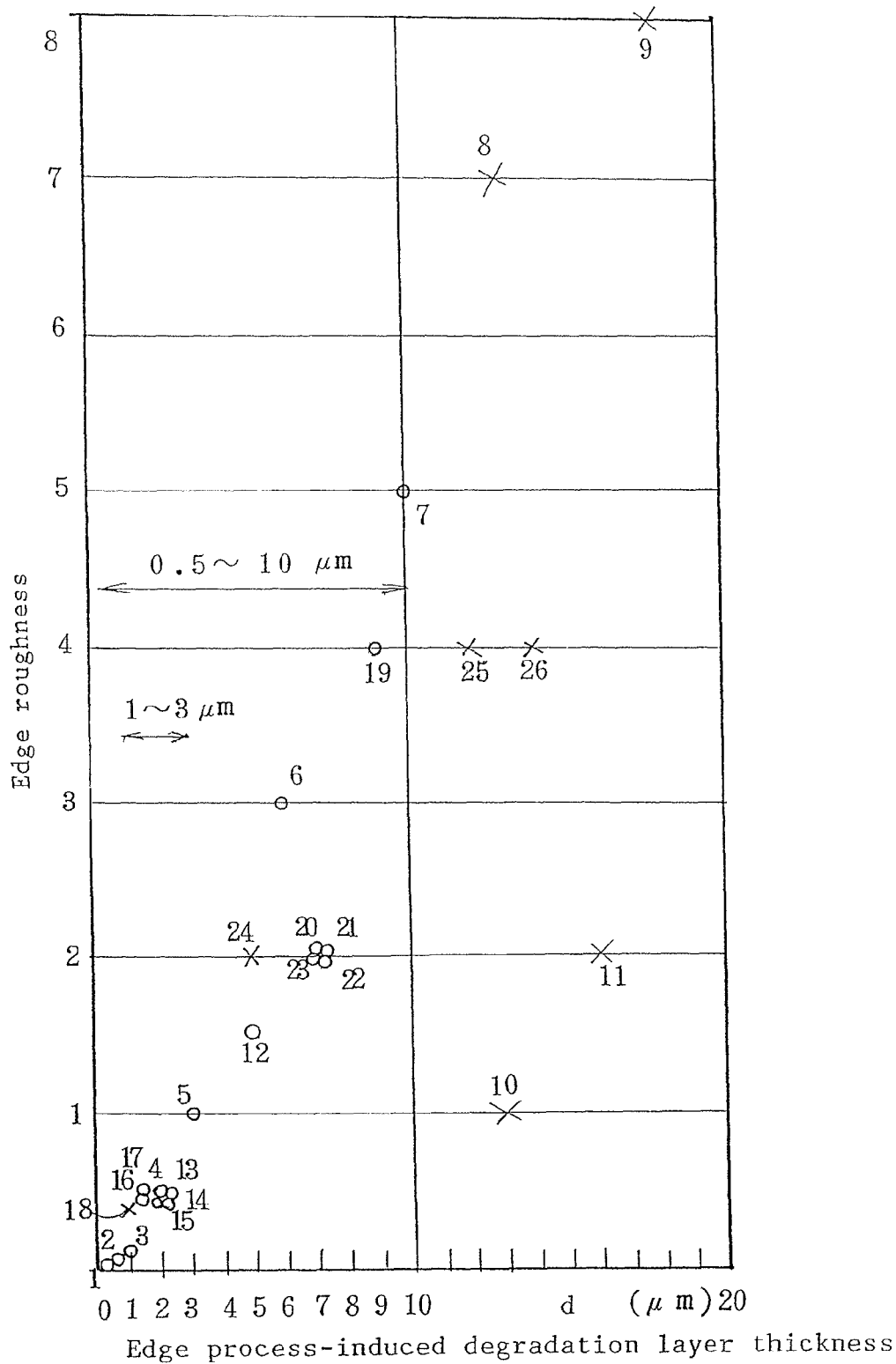
FIG. 24 is a graph showing a relation between the edge process-induced degradation layer thickness d (μm) and edge roughness Ra (μm) of Samples 1 to 26.

FIG. 24 shows a relation between edge process-induced degradation layer thicknesses d (μm) and edge roughnesses Ra (μm) for all Samples 1-26.

Increment of edge process-induced degradation layer thicknesses d increases edge roughness. Gross diamond granules and low oxide rates reinforce mechanical action and enlarge edge process-induced degradation layer thicknesses d and edge roughnesses Ra. Thus d and Ra rise or set in rough proportion in a main series.

However, there is another series of samples—Samples 10 and 11—, which deviate from the main series in which d is in proportion to Ra. Metal-bonding or metal-electrodeposition whetstones have highly rigid bonding materials. High rigidity of metals raises edge process-induced degradation layer thicknesses d, maintaining small edge roughnesses.

Metal-bonded whetstones and electrodeposition whetstones are incompetent to chamfering GaN wafers. Rubber-bonded or bubbled resin-bonded whetstones are competent. Edge process-induced degradation layer thicknesses d are more suitable than edge roughnesses Ra for estimating the performance of GaN wafer chamfering. FIG. 30 indicates a relation between edge metal concentrations m (at %) and chipping occurrence rates p (%) in Samples 19-26. 0.1 at %-5 at % edge metal concentrations enable GaN wafers to lower chipping occurrence rates to 15% or less. FIG. 31 exhibits a relation between edge metal concentrations m (at %) and device production yields Q (%) in Samples 19-26. 0 at %-5 at % edge metal concentrations can maintain 85% or more device yields Q.

What we claim is:

1. A method of producing nitride semiconductor devices comprising the steps of:
   preparing a nitride semiconductor wafer which has a chamfered edge, a 0.5 μm-10 μm thick edge process-induced degradation layer with a deformed lattice structure remaining on the chamfered edge and a mirror-flat top surface;
   growing epitaxially nitride films on the nitride semiconductor wafer;
   forming electrodes; and
   dividing the wafer into device chips.

2. The method as claimed in claim 1, wherein edge roughness of the substrate of the nitride semiconductor wafer is Ra0.07 μm to Ra3 μm.

3. The method as claimed in claim 1, wherein edge oxygen concentration of the substrate of the nitride semiconductor wafer is 3 at % to 20 at %.

4. The method as claimed in claim 1, wherein edge metal concentration of the substrate of the nitride semiconductor wafer is 0.1 at % to 5 at %.

5. A method of producing nitride semiconductor devices comprising the steps of:
   preparing a nitride semiconductor wafer having a chamfered edge formed by a rubber-bonding whetstone, a 1 μm-3 μm thick edge process-induced degradation layer with a deformed lattice structure remaining on the chamfered edge and a mirror-flat top surface;
   growing epitaxially nitride films on the nitride semiconductor wafer;
   forming electrodes; and
   dividing the wafer into device chips.

* * * * *